(12) United States Patent
Maekawa et al.

(10) Patent No.: US 7,615,488 B2
(45) Date of Patent: Nov. 10, 2009

(54) METHOD FOR FORMING PATTERN, THIN FILM TRANSISTOR, DISPLAY DEVICE AND METHOD FOR MANUFACTURING THE SAME, AND TELEVISION DEVICE

(75) Inventors: Shinji Maekawa, Shizuoka (JP); Gen Fujii, Kanagawa (JP); Hiroko Yamamoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 342 days.

(21) Appl. No.: 10/574,616

(22) PCT Filed: Mar. 16, 2005

(86) PCT No.: PCT/JP2005/005298

§ 371 (c)(1),
(2), (4) Date: Apr. 5, 2006

(87) PCT Pub. No.: WO2005/091375

PCT Pub. Date: Sep. 29, 2005

(65) Prior Publication Data

US 2008/0105875 A1    May 8, 2008

(30) Foreign Application Priority Data

Mar. 19, 2004   (JP) .............................. 2004-081493

(51) Int. Cl.
*H01L 21/44* (2006.01)

(52) U.S. Cl. .................. 438/674; 438/149; 438/669; 438/677; 257/E21.575

(58) Field of Classification Search ................ 438/677, 438/149, 151, 154–155, 669–670, 674; 257/E21.575
See application file for complete search history.

(56) References Cited

U.S. PATENT DOCUMENTS

| | | | |
|---|---|---|---|
| 5,696,011 A | 12/1997 | Yamazaki et al. |
| 5,852,488 A | 12/1998 | Takemura |
| 6,132,800 A | 10/2000 | Shimada et al. |

(Continued)

FOREIGN PATENT DOCUMENTS

CN    1426606 A    6/2003

(Continued)

OTHER PUBLICATIONS

Written Opinion of the International Searching Authority for PCT/JP2005/005298 dated Jun. 28, 2005.

(Continued)

*Primary Examiner*—Thanhha Pham
(74) *Attorney, Agent, or Firm*—Nixon Peabody LLP; Jeffrey L. Costellia

(57) ABSTRACT

A method for forming a pattern according to the invention comprises the steps of: forming a mask over a substrate having light-transmitting properties; forming a first region having a substance including a light-absorbing material over the substrate and the mask; forming a second region by irradiating the substance with light having a wavelength which is absorbable by the light-absorbing material through the substrate to modify a part of the substance surface; and forming a pattern by discharging a compound including a pattern forming material to the second region.

10 Claims, 30 Drawing Sheets

U.S. PATENT DOCUMENTS

| | | |
|---|---|---|
| 6,294,313 B1 | 9/2001 | Kobayashi et al. |
| 6,337,731 B1 | 1/2002 | Takemura |
| 6,399,257 B1 | 6/2002 | Shirota et al. |
| 7,176,069 B2 | 2/2007 | Yamazaki et al. |
| 7,208,401 B2 | 4/2007 | Nelson et al. |
| 7,273,773 B2 | 9/2007 | Yamazaki et al. |
| 7,365,805 B2 | 4/2008 | Maekawa et al. |
| 2001/0035926 A1 | 11/2001 | Yamaguchi et al. |
| 2002/0079832 A1 | 6/2002 | Van Tongeren et al. |
| 2002/0109456 A1 | 8/2002 | Morii et al. |
| 2003/0059686 A1 | 3/2003 | Kobayashi et al. |
| 2004/0131979 A1 | 7/2004 | Li et al. |
| 2005/0009327 A1 | 1/2005 | Yoshida et al. |
| 2005/0196710 A1 | 9/2005 | Shiroguchi |
| 2005/0196711 A1 | 9/2005 | Shiroguchi et al. |
| 2005/0202681 A1 | 9/2005 | Nelson et al. |
| 2005/0221203 A1 | 10/2005 | Fujii |
| 2005/0287721 A1 | 12/2005 | Yamamoto et al. |
| 2006/0121745 A1 | 6/2006 | Fujii |
| 2006/0134918 A1 | 6/2006 | Fujii et al. |
| 2006/0158482 A1 | 7/2006 | Nakamura et al. |
| 2007/0093002 A1 | 4/2007 | Maekawa et al. |
| 2007/0196962 A1 | 8/2007 | Morisue et al. |
| 2007/0207274 A1 | 9/2007 | Fujii |
| 2008/0012076 A1 | 1/2008 | Yamazaki et al. |
| 2008/0199992 A1 | 8/2008 | Maekawa et al. |

FOREIGN PATENT DOCUMENTS

| | | |
|---|---|---|
| JP | 11-207959 A | 8/1999 |
| JP | 11-251259 | 9/1999 |
| JP | 2001-272526 A | 10/2001 |
| JP | 2003-059940 A | 2/2003 |
| JP | 2005-311325 A | 11/2005 |
| WO | WO-02/052660 A1 | 7/2002 |
| WO | WO-2005/077549 A1 | 8/2005 |

OTHER PUBLICATIONS

International Search Report for PCT/JP2005/005298 dated Jun. 28, 2005.

FIG. 1A
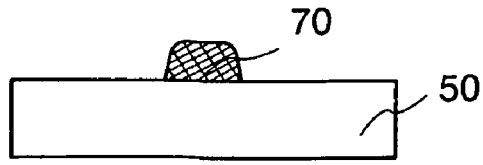
FIG. 1B     FIG. 1D
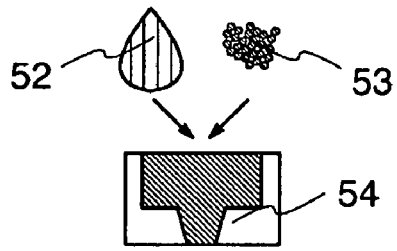   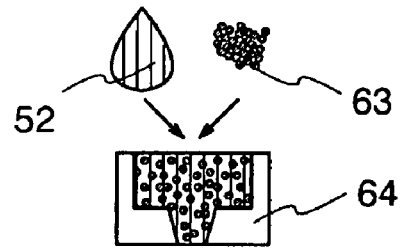
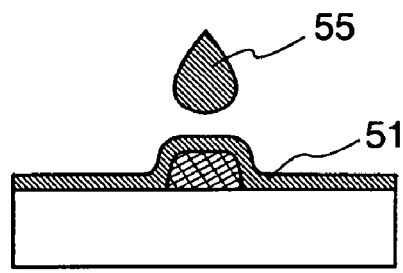   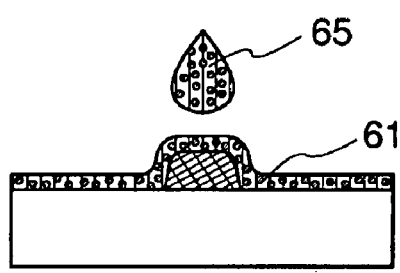
FIG. 1C     FIG. 1E
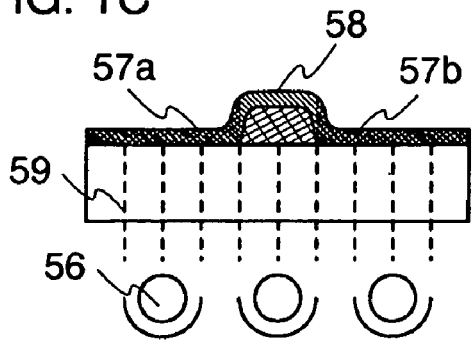   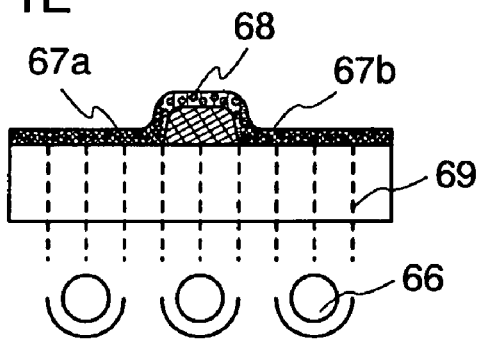
FIG. 1F
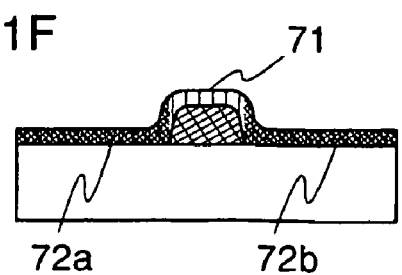

US 7,615,488 B2

METHOD FOR FORMING PATTERN, THIN FILM TRANSISTOR, DISPLAY DEVICE AND METHOD FOR MANUFACTURING THE SAME, AND TELEVISION DEVICE

TECHNICAL FIELD

The present invention relates to a method for forming a pattern, a thin film transistor and a manufacturing method thereof, a display device and a manufacturing method thereof, and a television apparatus using thereof.

BACKGROUND ART

A thin film transistor (hereinafter, referred to as a "TFT") and an electronic circuit using the thin film transistor are manufactured by laminating various types of thin films of a semiconductor, an insulating material, a conductive material, and the like over a substrate and then, appropriately forming a predetermined pattern with a photolithography technique. The photolithography technique means a technique of transferring a pattern of a circuit or the like formed over a surface of a transparent flat plane, referred to as a photomask, by using a material which does not transmit light, onto a targeted substrate by utilizing light, and the technique has been widely used in the manufacturing process of a semiconductor integrated circuit or the like.

In the manufacturing process employing a conventional photolithography technique, it is necessary to perform a multi-stage process including light exposure, development, baking, peeling, and the like only for treating a mask pattern which is formed by using a photosensitive organic resin material referred to as a photoresist. Therefore, as the number of the photolithography step is increased more, the manufacturing cost is inevitably increased more. In order to improve such problems as described above, it has been tried to manufacture a TFT by reducing the number of the photolithography step (for example, Reference 1: Japanese Patent Laid-Open No. H11-251259).

However, in the technique disclosed in Reference 1, only a part of the photolithography step which is carried out plural times in a TFT manufacturing process is replaced by a printing method and no contribution is made to a drastic reduction in the number of steps. Further, a light exposing apparatus to be used for transferring the mask pattern in the photolithography technique transfers a pattern of from several micrometers to 1 micrometer or less by equivalent projection light exposure or reduction projection light exposure. It is theoretically difficult for the light exposing apparatus to expose a large area substrate having a side of more than 1 meter to light all at once from a technical standpoint.

It is an object of the present invention to reduce the number of the photolithography step in the manufacturing process of a display device formed by a TFT, an electronic circuit using the TFT, and a display device formed by using the TFT, and to further simplify the manufacturing process. It is also an object of the invention to provide a technique in which a large area substrate having a side of more than 1 meter can be manufactured with a higher yield at lower cost.

It is also an object of the invention to provide a technique in which a pattern of a wiring or the like constituting these display devices can be formed to have a desired shape with preferable controllability.

DISCLOSURE OF INVENTION

The present invention relates to modifying a surface of a subject by adding (mixing) a light-absorbing material which absorbs a wavelength of light to be irradiated to the subject to be irradiated with the light. The subject is formed over a substance having light-transmitting properties, and the subject is irradiated with light from the substance side having light-transmitting properties through the substance having light-transmitting properties. At this time, a region to be modified can be precisely controlled by forming a mask between the light-transmitting substance and the subject to form a non-irradiation region. Then, a pattern is formed by attaching a pattern forming material on the modified surface by discharging (including applying or the like) the pattern forming material. Treatment efficiency with the use of light can be enhanced by light absorption of the included light-absorbing material and an energy emission function.

A display device according to the invention includes a light emitting display device including a TFT connected to a light emitting element in which a medium including an organic matter or a mixture of an organic matter and an inorganic matter producing luminescence referred to as electroluminescence (hereinafter also referred to as "EL") is sandwiched between electrodes; a liquid crystal display device in which a liquid crystal element having a liquid crystal material is used as a display element.

A method for forming a pattern according to the invention comprises the steps of: forming a mask over a substrate having light-transmitting properties; forming a first region having a substance including a light-absorbing material over the substrate and the mask; forming a second region by irradiating the substance with light having a wavelength which is absorbable by the light-absorbing material through the substrate to modify a part of the substance surface; and forming a pattern by discharging a compound including a pattern forming material to the second region.

A method for forming a pattern according to the invention comprises the steps of: forming a mask over a substrate having light-transmitting properties; forming a first region having a substance including a light-absorbing material over the substrate and the mask; forming a second region by irradiating the substance with light having a wavelength which is absorbable by the light-absorbing material through the substrate to modify a part of the substance surface; removing the light-absorbing material; and forming a pattern by discharging a compound including a pattern forming material to the second region.

A method for manufacturing a thin film transistor according to the invention comprises the steps of: forming a first conductive layer over a substrate having light-transmitting properties; forming an insulating layer over the substrate and the first conductive layer; forming a first region having a substance including a light-absorbing material over the insulating layer; forming a second region by irradiating the substance with light having a wavelength which is absorbable by the light-absorbing material through the substrate to modify a part of the substance surface; and forming a second electrode layer by discharging a compound including a conductive material to the second region.

A method for manufacturing a thin film transistor according to the invention comprises the steps of: forming a first conductive layer over a substrate having light-transmitting properties; forming an insulating layer over the substrate and the first conductive layer; forming a first region having a substance including a light-absorbing material over the insulating layer; forming a second region by irradiating the substance with light having a wavelength which is absorbable by the light-absorbing material through the substrate to modify a part of the substance surface; removing the light-absorbing material; and forming a second electrode layer by discharging a compound including a conductive material to the second region.

According to the above structure, a display device can be manufactured by forming the first conductive layer as a gate electrode layer, and the second conductive layer as a source electrode layer and a drain electrode layer. Further, a surface of the substance can be modified so that the second region has higher wettability than the first region with respect to the compound.

A thin film transistor according to the invention comprises: a first conductive layer provided over a substrate having light-transmitting properties; an insulating layer over the substrate and the first conductive layer; a substance including a light-absorbing material over the insulating layer; a second conductive layer selectively over the substance; and a semiconductor layer over the substance and the second conductive layer.

A thin film transistor according to the invention comprises: a first conductive layer provided over a substrate having light-transmitting properties; an insulating layer over the substrate and the first conductive layer; a substance including a light-absorbing material and a fluorocarbon chain over the insulating layer, a first region and a second region over the substance surface; and a second conductive layer over the second region, wherein the first region contains more fluorocarbon chains than the second region.

A display device according to the invention comprises: a gate electrode layer provided over a substrate having light-transmitting properties; an insulating layer over the substrate and the gate electrode layer; a substance including a light-absorbing material over the insulating layer; a source electrode layer and a drain electrode layer selectively over the substance; and a semiconductor layer over the substance, a source electrode layer and the drain electrode layer.

A display device according to the invention comprises: a gate electrode layer provided over a substrate having light-transmitting properties; an insulating layer over the substrate and the gate electrode layer; a substance including a light-absorbing material and a fluorocarbon chain over the insulating layer; a first region and a second region over the substance surface; and a source electrode layer and a drain electrode layer over the second region, wherein the first region contains more fluorocarbon chains than the second region.

A television device according to the invention has a display screen including a display device which comprises: a gate electrode layer provided over a substrate having light-transmitting properties; an insulating layer over the substrate and the gate electrode layer; a substance including a light-absorbing material over the insulating layer; a source electrode layer and a drain electrode layer selectively over the substance; and a semiconductor layer over the source electrode layer and the drain electrode layer.

A television device according to the invention comprises: a gate electrode layer provided over a substrate having light-transmitting properties; an insulating layer over the substrate and the gate electrode layer; a substance including a light-absorbing material and a fluorocarbon chain over the insulating layer; a first region and a second region over the substance surface; and a display screen including a display device having a source electrode layer and a drain electrode layer over the second region, wherein the first region contains more fluorocarbon chains than the second region.

The above-mentioned structure may be either a state in which the substance including a light-absorbing material is a liquid state and the light-absorbing material is mixed in the substance including the light-absorbing material with being dissolved, or a state in which the substance including a light-absorbing material is a liquid state and the light-absorbing material is dispersed in the substance including the light-absorbing material. A pigment or a photocatalyst substance can be used as the light-absorbing material, and the substance including the light-absorbing material may be formed so that a fluorocarbon chain which is a substance having fluorine is included.

According to the invention, a desired pattern can be formed with preferable controllability, and the loss of a material and the cost can be reduced. Hence, a high-performance and highly reliable display device can be manufactured with a preferable yield.

BRIEF DESCRIPTION OF DRAWINGS

FIGS. 1A to 1F are views describing a certain aspect of the present invention;

BEST MODE FOR CARRYING OUT THE INVENTION

Figure 2A:
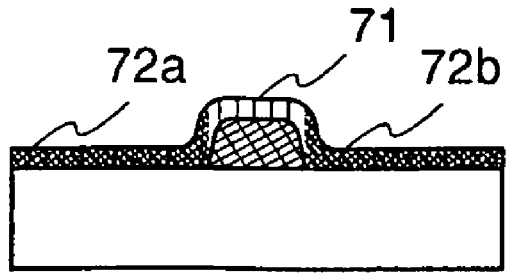
FIGS. 2A to 2C are views describing a certain aspect of the invention.

Embodiment Mode of the present invention will be described below in detail with reference to the accompanying drawings. However, the invention is not limited to the following description and it is easily understood that various changes and modifications will be apparent to those skilled in the art, unless such changes and modifications depart from content and the scope of the invention. Therefore, the invention is not interpreted with limiting to the description in embodiment mode shown hereinafter. Note that, in the structure of the invention described hereinafter, the same reference numerals denote the same parts or parts having the same function in different drawings and the explanation will not be repeated.

Embodiment Mode 1

An embodiment mode according to the present invention is described with reference to FIGS. 1A to 1F. Two examples are shown in FIGS. 1A to 1F. One of them is an example which reaches FIG. 1F through FIGS. 1A, 1B, and 1C, and the other is an example which reaches FIG. 1F through FIGS. 1A, 1D, and 1E.

One feature of the invention is that at least one or more of patterns required to manufacture a display panel, such as a wiring layer, a conductive layer for forming an electrode, or a mask layer for forming a predetermined pattern is/are formed by a method capable of selectively forming a pattern to manufacture a display device. A droplet discharge (apply) method (also referred to as an ink-jet method, depending on its mode) in which a conductive layer, an insulating layer, or the like is formed and a predetermined pattern can be formed by selectively discharging (applying) a droplet of a compound mixed for a particular purpose is employed as the method capable of selectively forming a pattern. In addition, a method capable of transferring or drawing a pattern, for example, various printing methods (a method for forming a pattern, such as screen (mimeograph) printing, offset (lithography) printing, relief printing or gravure (copperplate printing) or the like can also be employed.

In this embodiment mode, a method for forming a pattern by discharging (applying) a compound including a fluid pattern forming material as a droplet is used. A pattern is formed by discharging a droplet formed of a compound including a pattern forming material to a pattern formation region, and by performing baking, drying, and the like to fix. According to the invention, pretreatment is performed on a pattern formation region.

Figure 28:
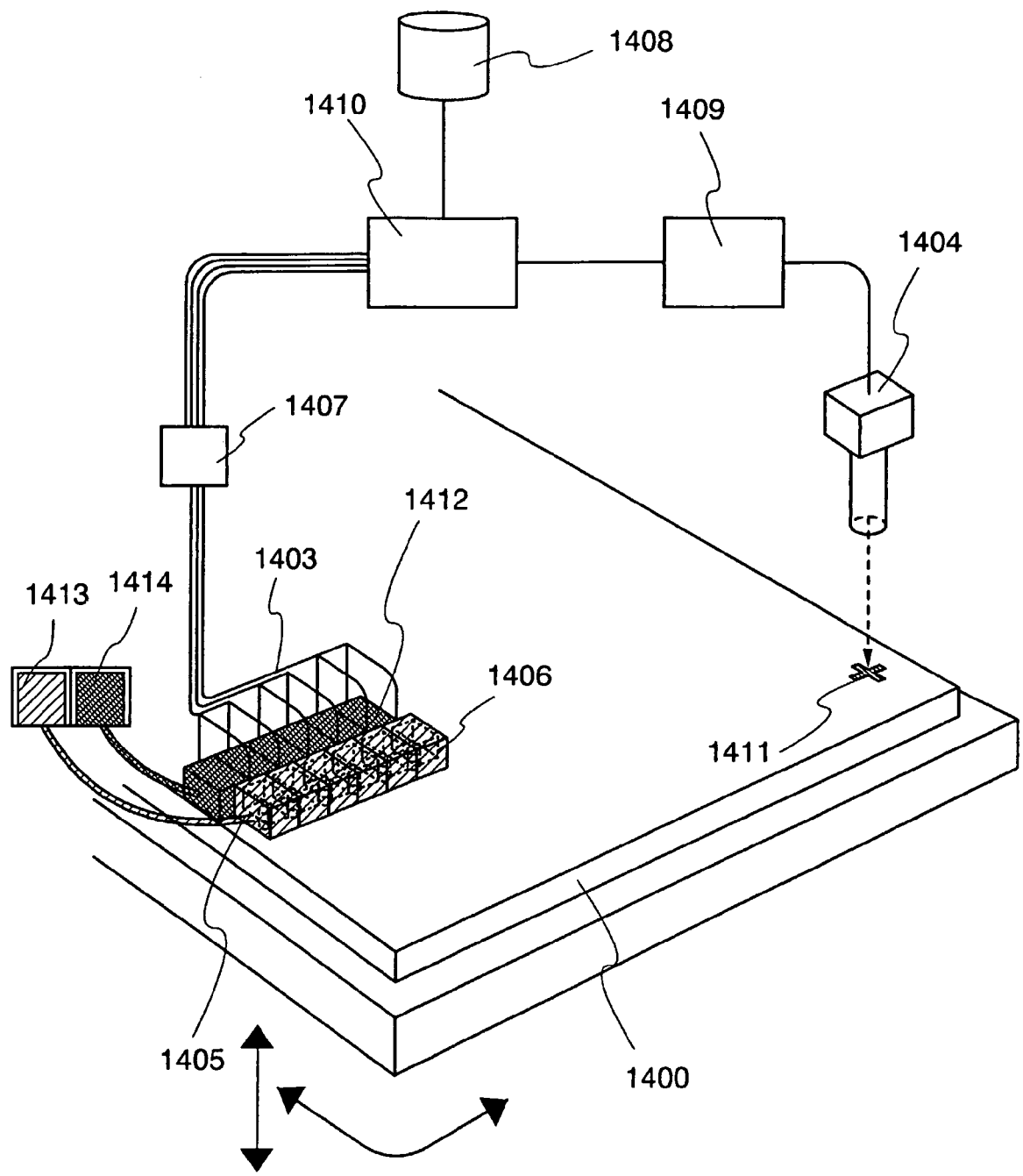
FIG. 28 is a figure describing a structure of a droplet discharge device which is applicable to a certain aspect of the invention.

One mode of a droplet discharge device used for forming a pattern is shown in FIG. 28. Each of head 1405 and 1412 of a droplet discharge means 1403 is connected to a control means 1407, and is controlled by a computer 1410, so that a preprogrammed pattern can be drawn. The position of drawing may be determined based on a marker 1411 that is formed over a substrate 1400, for example. Alternatively, a reference point can be fixed based on an edge of the substrate 1400. The reference point is detected by an imaging means 1404, and changed into a digital signal at an image processing means 1409. Then, the digital signal is recognized by a computer 1410, and a control signal is generated and is transmitted to a control means 1407. As the imaging means 1404, an imaging sensor which utilizes a charge-coupled device (CCD) or a complementary metal oxide transistor (CMOS), or the like can be used. Naturally, information on a pattern to be formed over the substrate 1400 is stored in a storage medium 1408, and a control signal is transmitted to the control means 1407 based on the information, so that each head 1405 and 1412 of the droplet discharge means 1403 can be individually controlled. Each head 1405 and 1412 is supplied with a material to be discharged from material supply sources 1413 and 1414 through a pipe.

The head 1405 has an inside structure which has a space filled with a liquid 3 material and a nozzle which is a discharge opening as shown by a dotted line 1406. Although it is not shown, the head 1412 has a similar inside structure to the head 1405. The sizes of the heads 1405 and 1412 are different each other, and different materials can be simultaneously drawn to have different widths. A conductive material, an organic material, an inorganic material, and the like can be discharged from one head and drawn. When a droplet is drawn over a wide area such as an interlayer insulating film, one material is simultaneously discharged from a plurality of nozzles to improve a throughput, and thus, drawing can be performed. When a large-sized substrate is used, the heads 1405 and 1412 can freely scan over the substrate in a direction indicated by an arrow, and a region to be drawn can be freely set. Thus, a plurality of the same patterns can be drawn over one substrate.

In a pattern forming method of a conductive layer or the like with the use of a droplet discharge method, a pattern is formed as follows. A pattern forming material which is processed in a particulate shape is discharged, and welded or joined by welding by performing baking to cure the pattern forming material. Accordingly, although a pattern which is formed by a sputtering method or the like often shows a columnar structure, the pattern often shows a polycrystalline state having a lot of grain boundaries.

According to the invention, as shown in FIGS. 1A to 1F, irradiation treatment with the use of light is performed on a pattern formation region and a region adjacent thereto as pretreatment to perform treatment for selectively modifying the surface. A compound including a pattern forming material is then attached to the modified surface to form a pattern.

Light used for the modification treatment includes, but not limited to, infrared light, visible light, or ultraviolet light or a combination thereof. For example, light emitted from an ultraviolet lamp, a black light lamp, a halogen lamp, a metal halide lamp, a xenon arc lamp, a carbon arc lamp, a high pressure sodium lamp, or a high pressure mercury lamp may be used. The lamp light source may be activated for a required time, or may be activated more than once.

Additionally, laser light may be used, and as a laser oscillator, a laser oscillator which can oscillate ultraviolet light, visible light, or infrared light can be used. As the laser oscillator, an excimer laser oscillator of KrF, ArF, XeCl, Xe, or the like; a gas laser oscillator of He, He—Cd, Ar, He—Ne, HF, or the like; a solid laser oscillator using a crystal such as YAG, $GdVO_4$, $YVO_4$, YLF, or $YAlO_3$ doped with Cr, Nd, Er, Ho, Ce, Co, Ti or Tm; or a semiconductor laser oscillator of GaN, GaAs, GaAlAs, InGaAsP, or the like can be used. As the solid laser oscillator, it is preferable to apply from the first higher harmonics to the third higher harmonics of the fundamental wave. An optical system including a shutter, a reflector such as a mirror, or a half mirror, and a cylindrical lens or a convex lens may be used for controlling the shape of or the course of the laser light emitted from a laser oscillator.

The substrate may be moved for selective light irradiation, or light may be moved in x-y direction for irradiation. In this case, a polygon mirror or a galvano mirror is preferably used in the optical system.

In this embodiment mode, irradiation region is irradiated with light to modify and change the wettability of the region. Thus, a pattern formation region and a region adjacent thereto which have different wettability with respect to a pattern forming material are formed. The wettability of the regions with respect to the pattern forming material may have relative difference as the difference between the wettability of the pattern formation region and the region adjacent thereto where a pattern is not formed (non-pattern formation region). The regions having different wettability have different contact angles of the compound including a pattern forming material. A region having a larger contact angle with respect to the compound including the pattern forming material is a region having lower wettability (hereinafter, also referred to as a "low-wettability region"), and a region having a smaller contact angle with respect to the compound including the pattern forming material is a region having high wettability (hereinafter, also referred to as a "high-wettability region"). This is because when a contact angle is larger, a liquid compound having fluidity does not spread and is repelled by the surface of the region; therefore, the surface is not wetted; and when an contact angle is small, a compound having fluidity spreads over the surface, and the surface is wetted. Accordingly, the region having different wettability have different surface energy. The surface of the low wettability region has low surface energy, and the surface of the high wettability region has high surface energy. In the invention, the difference in contact angles between the regions having different wettability is 30° or more, preferably, 40° or more.

In this embodiment mode, irradiation treatment with the use of light is performed to form regions having different wettability. A substance is formed over a pattern formation region and a region adjacent thereto, and treatment for selectively enhancing wettability and treatment for selectively decreasing wettability are performed with the use of the light. In this embodiment mode, a substance having low wettability is formed over the pattern formation region and the region adjacent thereto, and light capable of decomposing the substance having low wettability is radiated to decompose and remove the substance having low wettability in a treatment region. Thus, wettability of the treatment region is enhanced, and a high-wettability region is formed. Consequently, the concentration of the low-wettability substance contained in the high-wettability region (for example, the concentration, the number or the amount of the fluorocarbon chain which has an effect of reducing wettability) becomes lower than that in the low-wettability region. A substance having low wettability may be a substance including a material having an effect of reducing wettability. The material which reduces wettability is decomposed and destroyed by light irradiation treatment to neutralize the effect of reducing wettability.

According to the invention, a subject is irradiated with light through a substance (substrate) provided with the subject to precisely form the regions having different wettability with preferable controllability by exposing the backside to light. In this embodiment mode, a mask is formed in advance over a substrate having light-transmitting properties, and a substance having low wettability is formed thereover. The material which reduces wettability in the substance having low wettability of the area other than the mask region is decomposed by being irradiated with light from the side of the substrate having light-transmitting properties. The substance having low wettability which is formed over the mask is not irradiated with light; thus, the regions having different wettability are formed with preferable controllability. The light is required to have a wavelength absorbed by the substance having low wettability. However, light with a wavelength of 200 nm or less which has large energy, such as ultraviolet light, is required depending on the substance; therefore, the range of choice is narrowed. Further, in the case of the wavelength absorbed by the substrate having light-transmitting properties, the light is absorbed in the substrate having light-transmitting properties, and the subject is not irradiated with light; accordingly, the surface can not be modified. Additionally, it is also required to perform irradiation plural times to perform sufficient treatment; therefore, the cost or time necessary for an apparatus or process is increased, so that the production efficiency is reduced.

Accordingly, in the invention, a light-absorbing material having an absorption region in a wavelength region of light is mixed to a subject in order to improve the treatment efficiency of light irradiation. The light-absorbing material having an absorption region in a wavelength region of the light absorbs radiated light and emits (radiates) energy of heat or the like to the surrounding area. The emitted energy reacts with a peripheral substance. As a result, the substance property is changed and modified. According to the invention, the range of choice for light is widened since a light-absorbing material may be selected in accordance with a wavelength of light. Hence, a wavelength having a region which is not absorbed by a substance for forming the subject can be selected, and light irradiation for performing surface irradiation treatment with preferable controllability can be performed. In addition, treatment can be sufficiently performed even when light has lower energy itself since irradiation efficiency of the light can also be enhanced. Hence, an apparatus or process is simplified and the cost or time is reduced, which leads to enhancing productivity.

In this embodiment mode, an example of forming a wiring pattern with preferable controllability will be shown. First, a mask 70 is formed over a substrate 50 having light-transmitting properties (FIG. 1A). Since the mask 70 is made to serve as a mask for blocking light, a material which hardly transmit light is required to be used. In this embodiment mode, an insulating material is used for the mask 70, and a conductive material is used for a pattern 75a and a pattern 75b which are formed over the mask 70. In this case, the mask 70 serves as an insulator which electrically insulates the wirings including the pattern 75a and the pattern 75b. In the case of using a conductive material for the mask 70, the pattern 75a, and the pattern 75b, if an insulating layer is formed between the mask 70, and the pattern 75a and the pattern 75b, and the insulating layer is pretreated according to the invention, the wiring may be formed to have a lamination structure.

In this embodiment mode, a light-absorbing material 53 or a light-absorbing material 63 is added to a substance 52 having low wettability. A mixture of the substance having low wettability and the light-absorbing material is mixed into a solvent or the like to be in liquid since the mixture is formed by being selectively discharged with a droplet discharge method. However, the forming method is not limited to this embodiment mode since a substance may be attached to a formation region and a region adjacent thereto. For example, the mixture can be formed by a sol-gel method such as a dip coating method, a spin coating method, or an ion plating method, an ion beam method, a CVD method, a sputtering method, an RF magnetron sputtering method, a plasma thermal spraying method, or a plasma spraying method. When forming by an application method such as a dip coating method or a spin coating method, and when a solvent should be removed, baking or drying may be performed. When a method of forming a pattern directly over a formation region and a region adjacent thereto such as a droplet discharge method is used, the cost can be curtailed since material usability is enhanced.

When a substance which is soluble in the substance 52 having low wettability such as a dye is used as the light-absorbing material, the light-absorbing material added in the substance 52 having low wettability is dissolved in the substance 52 having low wettability to become a liquid compound having low wettability, and is discharged over the substrate 50 as a droplet 55 from a discharge device 54 to form a compound 51 having low wettability as shown in FIG. 1B.

The compound 51 having low wettability is irradiated with light 59 from a light source 56 through the substrate 50 (see FIG. 1C). The light-absorbing material included in the compound 51 having low wettability has an absorption region in the wavelength of the light. Accordingly, the light-absorbing material absorbs the irradiated light and radiates energy such as heat. The compound having low wettability is decomposed and destroyed by the radiant energy to enhance wettability in a treatment region. The surface of the compound having low wettability over the mask 70 is not processed since the formation region of the mask 70 is blocked by the mask 70. Hence, high-wettability regions 57a and 57b which are regions having high wettability are formed, and a formation region and a region adjacent thereto have different wettability. Accordingly, a region without treatment has comparatively low wettability to be a low-wettability region 58.

After forming the regions having different wettability, the light-absorbing material included in the compound having low wettability may be washed and removed with the use of alcohol or water. In this case, only the light-absorbing material is removed. Therefore, a solvent having a high selective ratio should be used so as not to dissolve the substance 52 having low wettability. In this embodiment mode, washing is performed with a solvent which dissolves the light-absorbing material 53 for removing the light-absorbing material 53 to form a low-wettability regions 71, high-wettability regions 72a and 72b (see FIG. 1F).

FIG. 1B shows the case where the light-absorbing material is soluble in the substance 52 having low wettability, and the case where the light-absorbing material is insoluble such as a colorant is shown in FIGS. 1D and 1E. The light-absorbing material 63 is included in the substance 52 having low wettability as particle since the light-absorbing material 63 is insoluble in the substance 52 having low wettability. A compound in which the light-absorbing material is included with being dispersed as particles is discharged from a discharging device 64 over the substrate 50 as a droplet 65 to form a compound 61 having low wettability. In this case, particles smaller than a treatment region should be used. This is because the minimum value of the treatment region is determined by the size of the particles since energy emitted from the particles affects a peripheral substance.

Light 69 is radiated from a light source 66 through the substrate 50 to form a low-wettability region 68, and high-wettability regions 67a and 67b (see FIG. 1E). Likewise, the light-absorbing material 63 is washed with a solvent which dissolves the light-absorbing material 63 for removing the light-absorbing material 63 to form the low-wettability region 71, and the high-wettability regions 72a and 72b (see FIG. 1F).

Figure 2B:
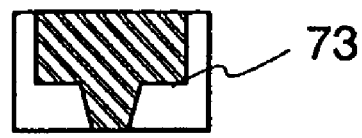
Figure 2B:
Figure 2B:
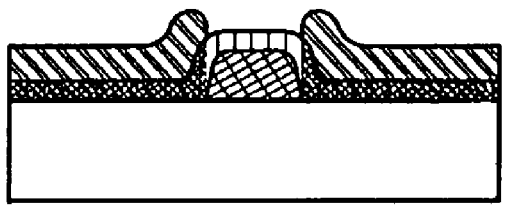
Figure 2C:
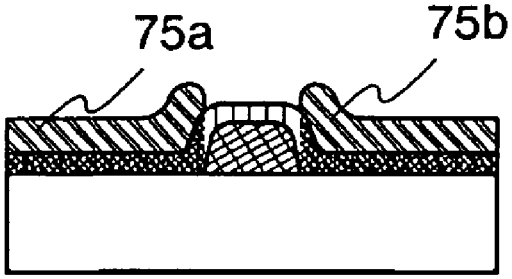

Afterwards, a droplet 74 including the pattern forming material is discharged from a nozzle of a droplet discharge device 73 to the high-wettability regions 72a and 72b which are formation regions. The discharged droplet 74 is formed in the high-wettability regions 72a and 72b without adhering to the low-wettability region 71 (see FIG. 2B). Even when the pattern forming material can not be discharged precisely depending on the size of the discharge opening of the nozzle from which the droplet is discharged or the scanning ability of the discharge opening, the droplet is attached only to the formation region to form the desired patterns 75a and 75b by performing treatment for enhancing wettability on the formation region (see FIG. 2C). This is because the formation region and the region adjacent thereto have different wettability; therefore, the droplet is repelled in the low-wettability region to remain in the formation region having higher wettability. In other words, a droplet is repelled by the low-wettability region; therefore, the boundary between the high-wettability region and the low-wettability region functions as a partition wall (a bank). Accordingly, even the compound including the pattern forming material having fluidity can remain in the high-wettability region; thus, the pattern can be formed to have a desired shape.

According to the invention, when a minute pattern of, for example, an electrode layer, or the like is formed, a droplet does not spread over a formation region even when a discharge opening of the droplet is somewhat large, therefore, a conductive layer can be formed only in the formation region, and defects such as a short-circuit caused by the formation in an area other than the formation region can be prevented. Additionally, film thickness of the wiring can be controlled. As in this embodiment mode, when the surface of the substance is reformed by light irradiation from the side of a substrate, a large area can be treated in addition to forming a pattern with preferable controllability; thus, production efficiency is improved. By combining a droplet discharge method, the material loss can be avoided compared with entire surface application formation by a spin coating method or the like; therefore, the cost can be reduced. According to the invention, a pattern can be formed with preferable controllability even in the case where a wiring or the like is provided integrally and intricately due to miniaturization and thinner film formation.

In this embodiment mode, a compound having low wettability is formed as pretreatment. The film could be extremely thin depending on the formation condition, so that the substance may not have film form.

Treatment for enhancing wettability is carried out to make the strength of holding a droplet discharged over a region (also referred to as "adhesiveness" or "fixing strength") stronger than that of the periphery thereof, which is equivalent to enhancing the adhesion with the droplet by reforming the region. Only a surface which is in contact with and holds a droplet may have the wettability, and the whole film does not necessarily have the similar properties.

The substance which changes wettability formed as pretreatment after forming the pattern may be left, or an unnecessary portion may be removed after forming the pattern. The pattern may be used as a mask, and ashing using oxygen or the like, etching, or the like may be used for the removal.

As an example of the compound of the solution for forming the low-wettability region, a silane coupling agent expressed in the chemical formula of Rn—Si—X(4-n) (n=1, 2, 3) is used. Here, R denotes a substance which contains a comparatively inactive group such as an alkyl group. Further, X includes a hydrolysable group such as halogen, a methoxy group, an ethoxy group, an acetoxy group, which can be bonded by the condensation with a hydroxyl group or absorptive water on a substance surface.

By using fluorine-based silane coupling agent (fluoroalkylsilane (hereinafter referred to as FAS)) having a fluoroalkyl group for R as a representative example of the silane coupling agent, the wettability can be lowered. R of FAS has a structure which is expressed in $(CF_3)(CF_2)_x(CH_2)_y$ (x: an integer from 0 to 10, y: an integer from 0 to 4). In the case where a plurality of R or X are bonded to Si, R or X may all be the same or different. Fluoroalkylsilane such as heptadecafluorotetrahydrodecyltriethoxysilane, heptadecafluorotetrahydrodecyltrichlorosilane, tridecafluorotetrahydrooctyltrichlorosilane, trifluoropropyltrimethoxysilane can be given as FAS.

As the substance having low wettability, a substance which does not have a fluorocarbon chain for R of the silane coupling agent and has an alkyl group can be used. For example, octadecyltrimethoxysilane or the like can be used as organic silane.

As the solvent of a solution for forming the low-wettability region, a hydrocarbon-based solvent such as n-pentane, n-hexane, n-heptane, n-octane, n-decane, dicyclopentane, benzene, toluene, xylene, durene, indene; tetrahydronaphthalene, decahydronaphthalene, squalene; tetrahydrofuran; dioxane; ethanol, dimethyl sulfoxide; or the like can be used.

As an example of the compound of the solution forming the low-wettability region, a substance having a fluorocarbon chain (a fluorine resin) can be used. As the fluorine resin, polytetrafluoroethylene (PTFE; a polytetrafluoroethylene resin), perfluoroalkoxyalkane (PFA; a tetrafluoroethylene perfluoroalkylvinylether copolymer resin), perfluoroethylene propylene copolymer (PFEP; a tetrafluoroethylene hexafluoropropylene copolymer resin), ethylene-tetrafluoroethylene copolymer (ETFE; a tetrafluoroethylene-ethylene copolymer resin), polyvinylidene fluoride (PVDF; a polyvinylidene fluoride resin), polychlorotrifluoroethylene (PCTFE; a polytrifluorochloroethylene resin), ethylene-chlorotrifluoroethylene copolymer (ECTFE; a polytrifluorochloroethylene-ethylene copolymer resin), polytetrafluoroethylene-perfluorodioxol copolymer (TFE/PDD), polyvinylfluoride (PVF; a vinyl fluoride resin), or the like can be used.

In addition, an organic material which does not form a low-wettability region (in other words, forms a high-wettability region) may be used to form a low wettability region by performing treatment with the use of $CF_4$ plasma or the like later. For example, a material in which a soluble resin such as polyvinyl alcohol (PVA) is mixed into a solvent such as $H_2O$ can be used. In addition, PVA may be mixed with another soluble resin may be also used. An organic group in which a skeleton is configured by the bond of an organic material (an organic resin material) (polyimide, acrylic), silicon (Si) and oxygen (O), and which includes at least hydrogen (such as an alkyl group or aromatic hydrocarbon) as a substituent is used. Alternatively, a fluoro group may be used as the substituent. Further alternatively, an organic group containing at least hydrogen and a fluoro group may be used as the substituent. Even when a material having a low-wettability surface is used, wettability can be further reduced by performing plasma treatment or the like.

A base film may be formed to improve adhesiveness of the pattern and the formation region. For example, when a conductive material containing silver is applied to a substrate as the mask 70 to form a silver wiring, a titanium oxide film may be formed over the substrate as a conductive film to improve adhesiveness. The titanium oxide film has preferable adhesiveness with the conductive material containing silver to be formed or the like, thereby enhancing reliability.

As the light-absorbing material, an organic material, an inorganic material, a substance including an inorganic material and an organic material, or the like can be used, and a light-absorbing material having an absorbing region in a wavelength of light to be used may be selected. It may be a conductive material such as metal or an insulating material such as an organic resin. As an inorganic material, iron, gold, copper, silicon or germanium, as an organic material, plastic such as polyimide or acrylic, a pigment, or the like can be used. For example, as a pigment corresponding to light having the wavelength of 532 nm, rhodamine B, eosine Y, methyl orange, rose bengal, or the like, and as a pigment corresponding to light having the wavelength ranging from 300 nm to 400 nm, coumarins (coumarin 6H, coumarin 30, coumarin 102, coumarin 152, coumarin 153, coumarin 545T, or the like), Bis-MSB (abbreviation for 1,4-bis(o-methylstyryl)benzene) can be used, respectively. As a pigment, carbon black, a black resin of a colorant, or the like can also be used. As another pigment, rhodamine 6G; dicyano methylene pyran derivatives (DCM) or the like can be used.

As the light-absorbing material, a substance having a photocatalytic function (hereinafter, referred to as a photocatalytic substance) can be used. A photocatalytic substance has photocatalytic activity; therefore, the photocatalytic substance is activated by being irradiated and the substance surface can be modified by energy thereof.

Titanium oxide (TiOX), strontium titanate ($SrTiO_3$), cadmium selenide (CdSe), potassium tantalate ($KTaO_3$), cadmium sulfide (CdS), zirconia ($ZrO_2$), niobium oxide ($Nb_2O_5$), zinc oxide (ZnO), iron oxide ($Fe_2O_3$), tungsten oxide ($WO_3$) are desirable for the photocatalytic substance. The photocatalytic substance may be irradiated with light in the ultraviolet light domain (having the wavelength of 400 nm or less, preferably, 380 nm or less) to generate photocatalytic activity.

According to the invention, a desired pattern can be formed with preferable controllability, and the loss of a material and the cost can be reduced. Hence, a high-performance and highly reliable light-emitting display device can be manufactured with a preferable yield.

Embodiment Mode 2

Embodiment mode according to the present invention is described with reference to FIGS. 3A to 3C, FIGS. 4A to 4C, FIGS. 5A to 5C, FIGS. 6A to 6C, FIGS. 7A to 7C, FIGS. 8A to 8C, FIGS. 9A and 9B, FIGS. 14A to 14C, and FIGS. 15A and 15B. In more detail, a method for manufacturing a display device having a channel etch type thin film transistor to which the invention is applied is described. FIG. A in FIGS. 3 to 8 show top views of display device pixel portions, FIG. B in FIGS. 3 to 8 show cross-sectional views taken along the lines of A-C in FIG. A in FIGS. 3 to 8, and FIG. C in FIGS. 3 to 8 show cross-sectional views taken along the lines of B-D in FIG. A in FIGS. 3 to 8.

Figure 14A:
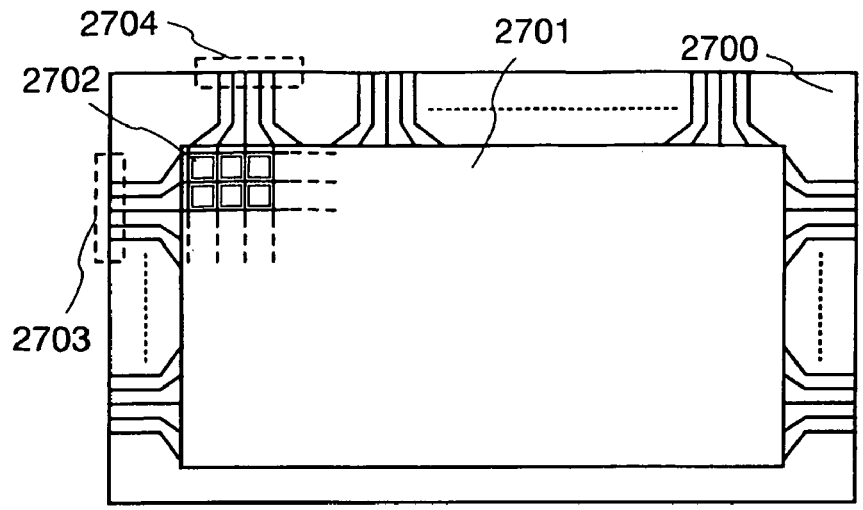
FIGS. 14A to 14C are top views of a display device according to a certain aspect of the invention.

FIG. 14A is a top view showing a structure of a display panel according to the invention. A pixel portion 2701 in which pixels 2702 are arranged in a matrix, a scanning line input terminal 2703, and a signal line input terminal 2704 are formed over a substrate 2700 having an insulating surface. The number of the pixels may be determined in accordance with various standards. The number of pixels of XGA may be 1024×768×3 (RGB), that of UXGA may be 1600×1200×3 (RGB), and that of a full-spec high vision may be 1920× 1080×3 (RGB).

The pixels 2702 are arranged in a matrix by intersecting a scanning line extended from the scanning line input terminal 2703 with a signal line extended from the signal line input terminal 2704. Each of the pixels 2702 is provided with a switching element and a pixel electrode connected thereto. A typical example of the switching element is a TFT. The gate electrode of the TFT is connected to a scanning line, and the source or drain thereof is connected to a signal line, which enables each pixel to be controlled independently by a signal input from outside.

The TFT includes a semiconductor layer, a gate insulating layer, and a gate electrode layer as its main components. A wiring layer connected to a source-drain region formed in the semiconductor layer is also included in the TFT. A top gate type in which a semiconductor layer, a gate insulating layer, and a gate electrode layer are arranged from the substrate side, a bottom gate type in which a gate electrode layer, a gate insulating layer, and a semiconductor layer are arranged from the substrate side, and the like are known as a typical structure of a TFT. However, any one of the structures may be employed in the invention.

An amorphous semiconductor (hereinafter also refereed to as a "AS") manufactured by a vapor phase growth method or a sputtering method using a semiconductor material gas typified by silane or germane; a polycrystalline semiconductor that is formed by crystallizing the amorphous semiconductor by utilizing light energy or thermal energy; a semi-amorphous (also referred to as microcrystallite or microcrystal) semiconductor (hereinafter also referred to as a "SAS"); or the like can be used as a material for forming the semiconductor layer.

The SAS means a semiconductor having an intermediate structure between an amorphous structure and a crystalline structure (including a single crystal and a polycrystal) and having a third state which is stable in terms of free energy, and includes a crystalline region having short-range order and lattice distortion. A crystalline region ranging from 0.5 nm to 20 nm can be observed in at least a part of a region in the film. When silicon is contained as the main component, a Raman spectrum is shifted to a lower frequency side than 520 cm$^{-1}$. A diffraction speak of (111) or (220) to be caused by a crystal lattice of silicon is observed in X-ray diffraction. Hydrogen or halogen of at least 1 atomic % or more is contained to terminate a dangling bond. The SAS is formed by performing glow discharge decomposition (plasma CVD) on a silicide gas. $SiH_4$ is given as a typical silicide gas. In addition, $Si_2H_6$, $SiH_2Cl_2$, $SiHCl_3$, $SiCl_4$, $SiF_4$, or the like can also be used as the silicide gas. Further, $F_2$ or $GeF_4$ may be mixed. This silicide gas may be diluted with $H_2$ or $H_2$ and one or more rare gas elements of He, Ar, Kr, and Ne. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature is preferably 300° C. or less, and the film can also be formed at temperatures ranging from 100° C. to 200° C. It is desirable that an atmospheric constituent impurity such as oxygen, nitrogen, or carbon is $1×10^{20}$ atoms/cm$^{-3}$ or less as an impurity element uptaken in the film at the time of forming the film; specifically, an oxygen concentration is $5×10^{19}$ atoms/cm$^{-3}$ or less, preferably $1×10^{19}$ atoms/cm$^{-3}$ or less. A preferable SAS can be obtained by further promoting lattice distortion by adding a rare gas element such as helium, argon, krypton or neon to enhance stability. Additionally, a SAS layer including a hydrogen-based gas may be laminated over a SAS layer including a fluorine-based gas as the semiconductor layer.

Figure 15A:
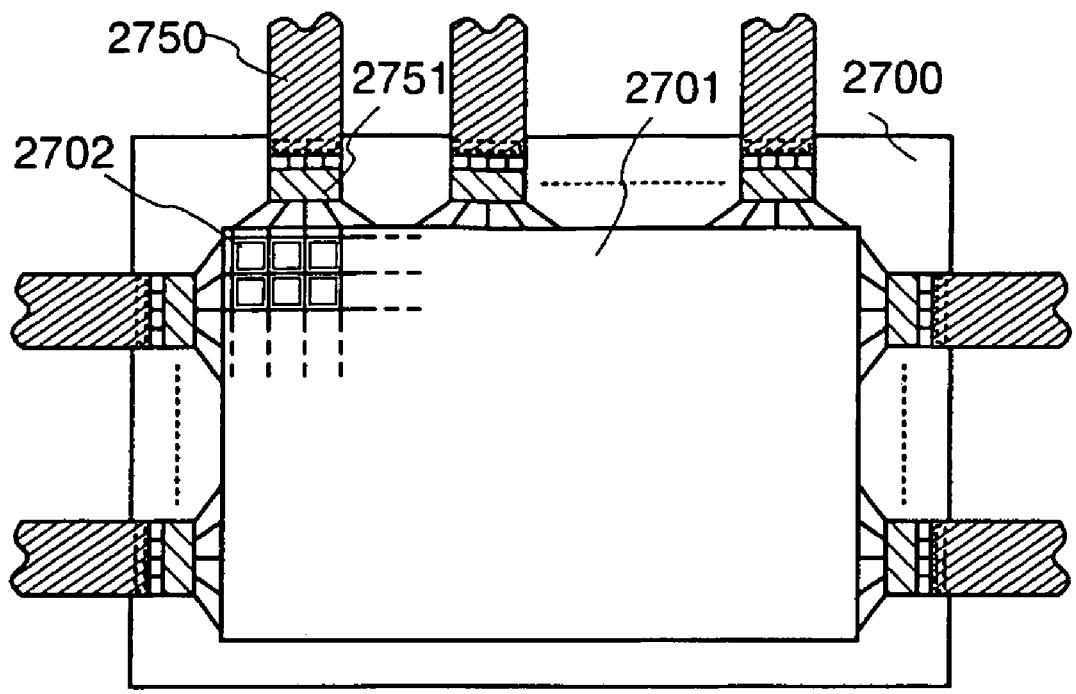
FIGS. 15A and 15B are top views of a display device according to a certain aspect of the invention.
Figure 15B:
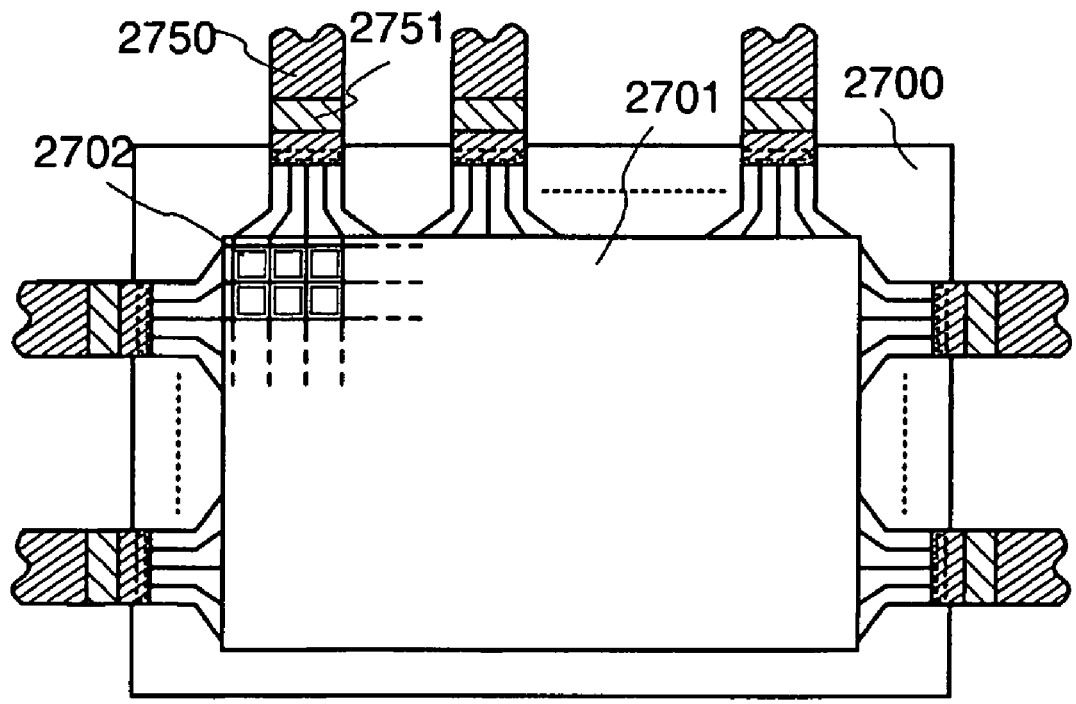

FIG. 14A shows a structure of a display panel that controls a signal to be input to a scanning line and a signal line by an external driver circuit. Furthermore, a driver IC 2751 may be mounted on a substrate 2700 by COG (Chip on Glass) method as shown in FIG. 15A. As another embodiment mode, a TAB (Tape Automated Bonding) method as shown in FIG. 15B may be also used. The driver IC may include a single crystal semiconductor substrate or be a circuit formed with a TFT over a glass substrate. In FIGS. 15A and 15B, driver ICs 2751 are connected to FPCs (Flexible Printed Circuit) 2750.

Figure 14B:
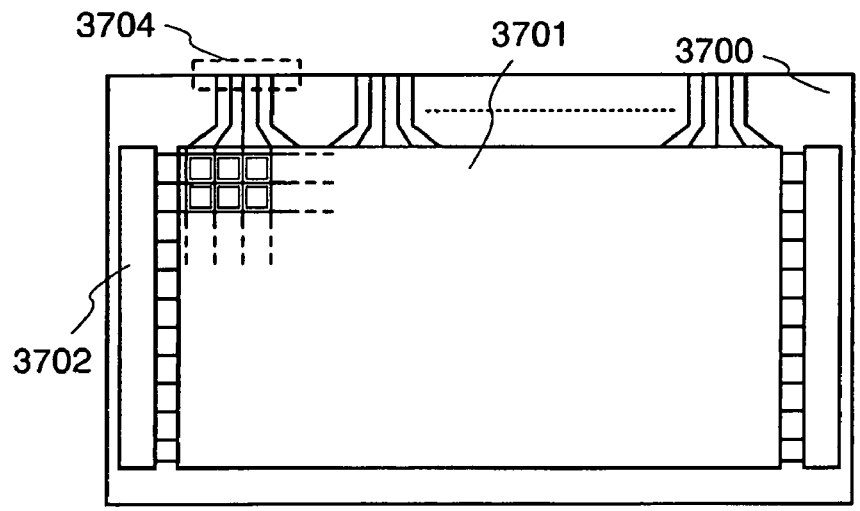

When a TFT provided in a pixel is formed of a SAS, a scanning line driver circuit 3702 may be integrally formed over a substrate 3700 as shown in FIG. 14B. In FIG. 14B, a pixel portion 3701 is controlled by an external driver circuit which is connected to a signal line input terminal 3704 in the same manner as in FIG. 14A. When a TFT provided in a pixel is formed of a polycrystalline (microcrystallite) semiconductor, a single crystal semiconductor or the like having high mobility, a pixel portion 4701, a scanning line driver circuit 4702 and a signal line driver circuit 4704 can be integrally formed over a substrate 4700 in FIG. 14C.

A glass substrate formed of barium borosilicate glass, alumino borosilicate glass, or the like; a quartz substrate; a silicon substrate; a metal substrate; a stainless-steel substrate; or a plastic substrate which can withstand the process temperature of the manufacturing process is used for a substrate 100 having light-transmitting properties. The surface of the substrate 100 having light-transmitting properties may be polished by CMP or the like to be planarized. In addition, an insulating layer may be formed over the substrate 100 having light-transmitting properties. The insulating layer is formed of a single layer or a laminated layer by a known method such as a CVD method, a plasma CVD method, a sputtering method, or a spin coating method using an oxide material or a nitride material including silicon. The insulating layer is not necessarily formed; however, it has an effect of blocking contaminants from the substrate 100 having light-transmitting properties. In the invention, in modifying the substance surface including a light-absorbing material, light is radiated from the side of the substrate 100 having light transmitting-properties over which the substance including a light-absorbing material is formed through the substrate 100. Accordingly, the substrate 100 having light-transmitting properties is required to be a substance which transmits enough light to modify the substance surface including a light-absorbing material.

A gate electrode layer 103 and a gate electrode layer 104 are formed over the substrate 100 having light-transmitting properties. The gate electrode layer 103 and the gate electrode layer 104 can be formed by a CVD method, a sputtering method, a droplet discharge method, or the like. The gate electrode layer 103 and the gate electrode layer 104 may be formed with an element selected from Ta, W, Ti, Mo, Al, and Cu, an alloy material or a compound material mainly containing the element. Alternatively, a semiconductor film typified by a polycrystalline silicon film doped with an impurity element such as phosphorus, or an AgPdCu alloy may be used. Either single layer structure or laminated structure may be used. For example, a two-layer structure of a tungsten nitride (TiN) film and a molybdenum (Mo) film, or a three-layer structure in which a 50 nm thick tungsten film, a 500 nm thick alloy film of aluminum and silicon (Al—Si), and a 30 nm titanium nitride film are laminated in order. Further, in the case of the three-layer structure, tungsten nitride may be used instead of the tungsten of the first conductive film, an alloy film of aluminum and titanium (Al—Ti) may be used instead of the alloy film of silicon and aluminum (Al—Si) of the second conductive film, and a titanium film may be used instead of the titanium nitride film of the third conductive film.

In the case where the gate electrode layer 103 and the gate electrode layer 104 are required to be patterned to a shape, patterning may be carried out by dry etching or wet etching after forming a mask. The electrode layers can be etched to have a desired tapered shape by appropriately controlling the etching condition (the amount of electric power applied to a coiled electrode, the amount of electric power applied to an electrode of a substrate side, the temperature of the electrode of the substrate side, or the like) with an ICP (Inductively Coupled Plasma) etching method. Note that a chlorine-based gas typified $Cl_2$, $BCl_3$, $SiCl_4$, and $CCl_4$; a fluorine-based gas typified by $CF_4$, $SF_6$, and $NF_3$; or $O_2$ can be appropriately used for the etching gas.

The mask for patterning can be formed by selectively discharging the composition. The patterning steps can be simplified by thus forming a mask selectively. A resin material such as an epoxy resin, an acrylic resin, a phenol resin, a novolac resin, a melamine resin, or an urethane resin is used for the mask. In addition, the mask may be formed by a droplet discharge method using an organic material such as benzocyclobutene, parylene, flare, or light-transmitting polyimide; a compound material made by the polymerization of such as a siloxane-based polymer; a composition material containing a water-soluble homopolymer and a water-soluble copolymer; or the like. Alternatively, a commercially available resist material containing a photosensitizer may be used. For example, a typical positive type resist such as a novolac resin and a naphthoquinone diazide compound that is a photosensitizer, or a negative type resist such as a base resin and diphenylsilanediol and an acid generator may be used. In using any material, the surface tension and the viscosity are appropriately controlled by adjusting the concentration of a solvent or adding a surfactant or the like.

In this embodiment mode, the gate electrode layer 103 and the gate electrode layer 104 are formed by a droplet discharge means. The droplet discharge means is a general term for one having a means of discharging a droplet such as a nozzle having a discharge opening of a compound or a head equipped with one or plural nozzles. The diameter of the nozzle included in the droplet discharge means is set in the range of from 0.02 μm to 100 μm (preferably, 30 μm or less), and the amount of the compound to be discharged from the nozzle is set in the range of from 0.001 pl to 100 pl (preferably, 0.1 pl to 40 pl, more preferably, 10 pl or less). The amount of the composition to be discharged increases in proportion to the size of the diameter of the nozzle. Further, it is preferable that the distance between a subject to be processed and the discharge opening of the nozzle is as short as possible in order to drop the droplet on a desired position. Favorably, the distance is set approximately in about the range from 0.1 mm to 3 mm (more preferably, 1 mm or less).

As for the compound to be discharged from the discharge opening, a conductive material dissolved or dispersed in a solvent is used. The conductive material is fine particles or dispersed nanoparticles of metal such as Ag, Au, Cu, Ni, Pt, Pd, Ir, Rh, W, or Al, sulfide of metal such as Cd or Zn, oxide of Fe, Ti, Si, Ge, Zr, Ba, or the like, or silver halide. The conductive material may be indium tin oxide (ITO), ITSO formed of indium tin oxide and silicon oxide, organic indium, organotin, zinc oxide, titanium nitride, or the like, which is used as a transparent conductive film. Particles of one element or a plurality of elements can be used as the conductive material. However, as for compounds to be discharged from the discharge opening, it is preferable to use any one of the materials of gold, silver, and copper, which is dissolved or dispersed in a solvent, taking a specific resistance value into consideration. It is more preferable to use silver or copper having a low resistance value. When silver or copper is used, a barrier film may be additionally provided as a countermeasure against impurities. A silicon nitride film or nickel boron (NiB) can be used for the barrier film.

In addition, a particle in which a conductive material is coated with another conductive material to form a plurality of layers may be used. For example, a three-layer structure particle in which copper is coated with nickel boron (NiB), which is further coated with silver may be used. As for the solvent, esters such as butyl acetate and ethyl acetate; alcohols such as isopropyl alcohol and ethyl alcohol; organic solvents such as methyl ethyl, ketone and acetone; or the like may be used. The viscosity of the compound is preferably 20 mPa·s or less. This prevents the compound from drying, or the composition is smoothly discharged from the discharge opening. The surface tension of the compound is preferably 40 mN/m or less. However, the viscosity of the compound and the like may be appropriately controlled in accordance with a solvent to be used and use application. For example, the viscosity of a compound in which ITO, organic indium, or organotin is dissolved or dispersed in the solvent may be set from 5 mPa·s to 20 mPa·s, the viscosity of a compound in which silver is dissolved or dispersed in the solvent may be set from 5 mPa·s to 20 mPa·s, and the viscosity of a composition in which gold is dissolved or dispersed in a solvent may be set from 5 mPa·s to 20 mPa·s.

The conductive layer may be formed by laminating a plurality of conductive materials. In addition, the conductive layer may be formed by a droplet discharge, method using silver as a conductive material; thereafter, it may be plated with copper or the like. Plating may be performed by electroplating or a chemical (electroless) plating method. Plating may be performed by soaking a substrate surface into a container filled with a solution having a plating material. A solution having a plating material may be applied so that the solution flows over the substrate surface with the substrate placed obliquely (or vertically). When the plating is performed by applying a solution with the substrate placed vertically, there is an advantage of miniaturizing a process apparatus.

The diameter of a particle of the conductive material is preferably as small as possible for the purpose of preventing clogged nozzles and manufacturing a high-definition pattern, although it depends on the diameter of each nozzle, a desired shape of a pattern, or the like. Preferably, the diameter of the particle of the conductive material is 0.1 μm or less. The compound is formed by a known method such as an electrolyzing method, an atomizing method, a wet reducing method, or the like, and the particle size thereof is typically ranging from 0.01 μm to 10 μm. However, when a gas evaporation method is employed, a nanomolecule protected with a dispersant is minute, about 7 nm. When each surface of particles is covered with a coating, the nanoparticles do not cohere in the solvent and are uniformly dispersed in the solvent at a room temperature, and show a property similar to that of liquid. Accordingly, it is preferable to use a coating.

In the invention, it is necessary that the compound has fluidity even when it falls to the subject to be processed since it is processed to have a desired pattern shape by utilizing the difference in wettability with respect to the fluid compound between a pattern formation region and a region adjacent thereto. However, a process of discharging a compound may be performed under low pressure if fluidity thereof is not omitted. In addition, when the process is performed under low pressure, an oxide film or the like is not formed over the surface of the conductive material; therefore, it is preferable. After discharging the compound, either or both steps of drying and baking is/are performed. Each step of drying and baking is a step of heat treatment. For example, drying is performed for three minutes at 100° C. and baking is performed for from 15 minutes to 30 minutes at temperatures ranging from 200° C. to 350° C., each of which has a different purpose, temperature, and period. The steps of drying and baking are performed at normal pressure or under low pressure by laser light irradiation, rapid thermal annealing, a heating furnace, or the like. Note that the timing of the heat treatment is not particularly limited. The substrate may be heated to favorably perform the steps of drying and baking. The temperature of the substrate at the time depends on a material of the substrate or the like, but it is typically from 100° C. to 800° C. (preferably, from 200° C. to 350° C.). According to the steps, nanoparticles are made in contact with one another and fusion and welding are accelerated by hardening and shrinking a peripheral resin as well as evaporating the solvent in the compound or chemically removing the dispersant.

A continuous wave or pulsed wave gas laser or solid laser may be used for laser light irradiation. An excimer laser, a YAG laser, and the like can be given as the former gas laser, and a laser using a crystal of YAG or YVO$_4$ GdVO$_4$, or the like which is doped with Cr, Nd, or the like can be given as the latter solid laser. Note that it is preferable to use a continuous wave laser in relation to the absorptance of laser-light. Moreover, a so-called hybrid laser irradiation method which combines a pulsed wave and a continuous wave may be used. However, it is preferable that the heat treatment by laser light irradiation is instantaneously performed within several microseconds to several tens of seconds so that the substrate 100 is not damaged, depending on heat resistance of the substrate 100. Rapid thermal annealing (RTA) is carried out by raising the temperature rapidly and heating for several microseconds to several minutes using an infrared lamp or a halogen lamp emitting light of from ultraviolet to infrared in an inert gas atmosphere. Since the treatment is performed instantaneously, only a thin film on a top surface can be substantially heated and a lower layer film is not affected. In other words, even a substrate having low heat resistance such as a plastic substrate is not affected.

After forming the gate electrode layers 103 and 104 by discharging a compound by a droplet discharge method, the surface thereof may be planarized by pressing it with pressure to enhance its planarity. As a pressing method, depressions and projections may be smoothed by making a roller-shaped object scan on the surface, or the surface may be vertically pressed with a flat plate-shaped object. A heat step may be performed at the time of pressing. Alternatively, depressions and projections on the surface may be removed with an air knife by softening or melting the surface with a solvent or the like. A CMP method may be also used for polishing the surface. This step may be applied for planarizing a surface when depressions and projections are generated by a droplet discharge method.

Figure 3A:
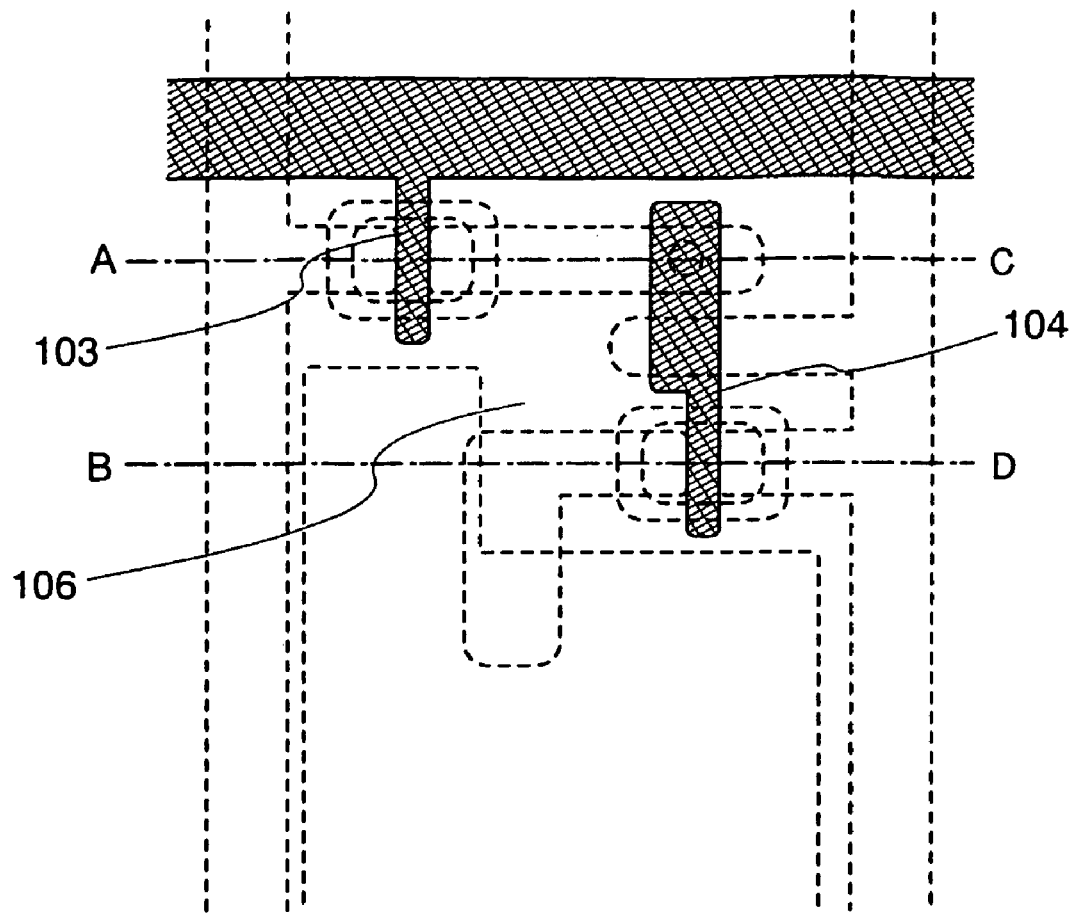
FIGS. 3A to 3C are views describing a method for manufacturing a display device according to a certain aspect of the invention.
Figure 3B:
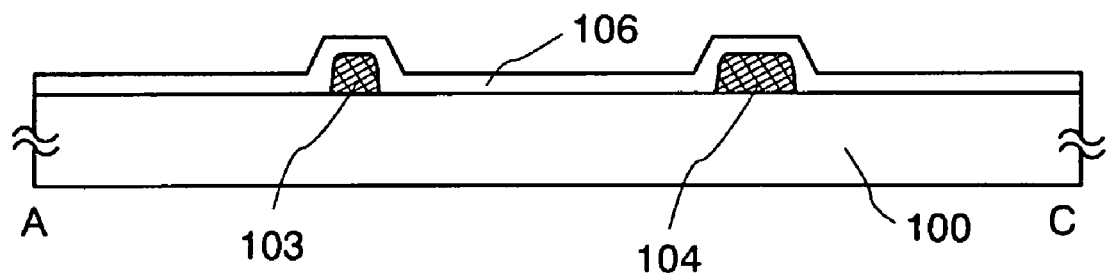
Figure 3C:
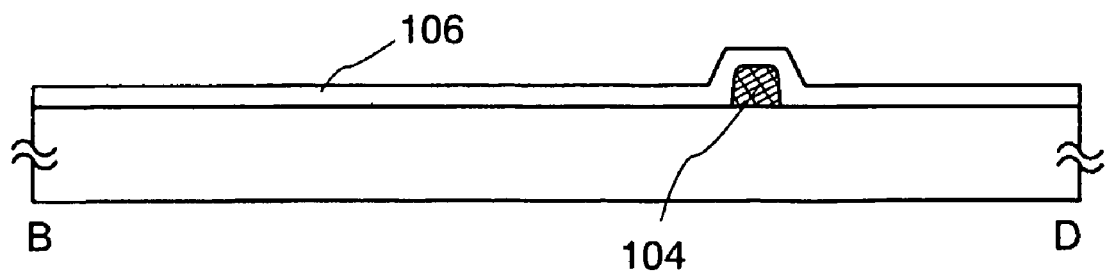
Figure 4A:
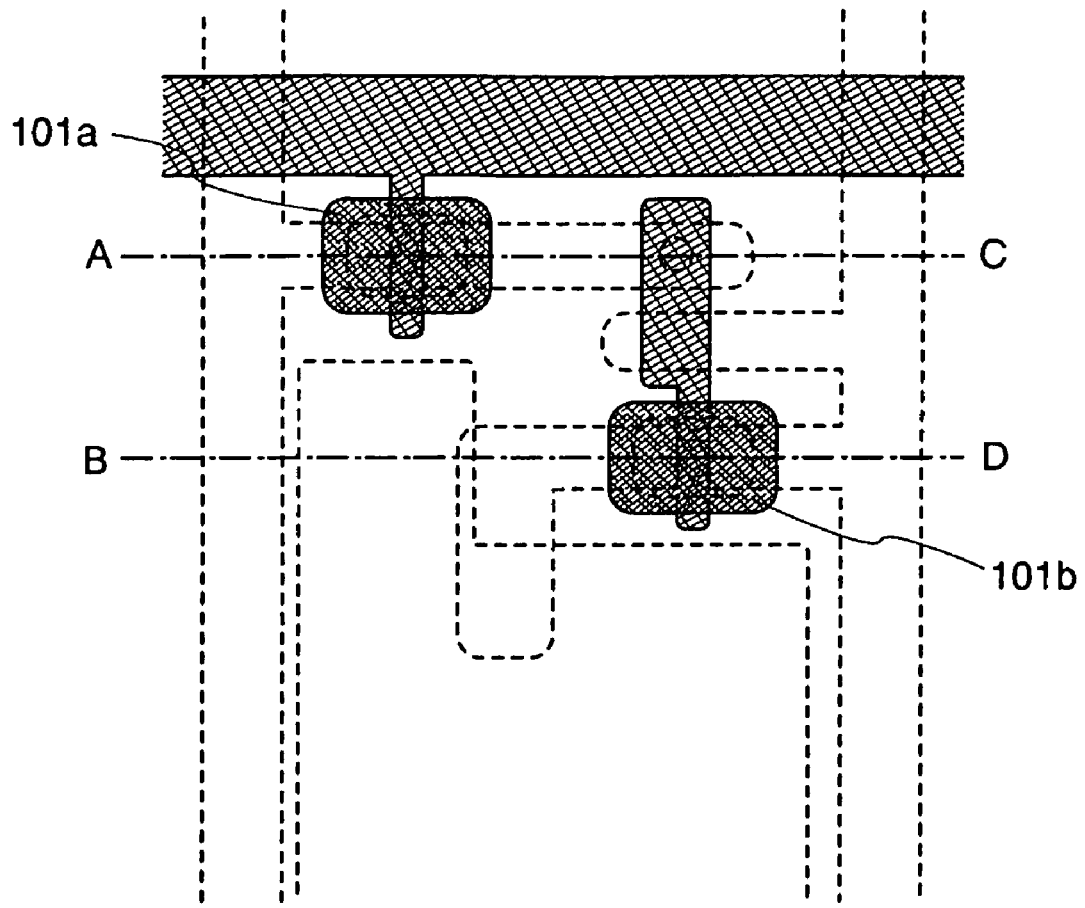
FIGS. 4A to 4C are views describing a method for manufacturing a display device according to a certain aspect of the invention.
Figure 4B:
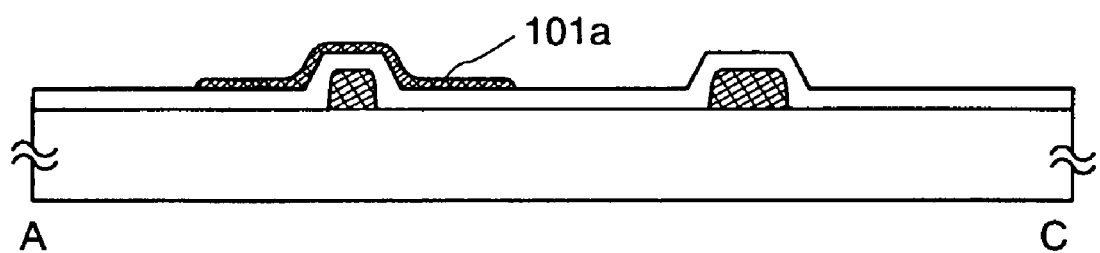
Figure 4C:
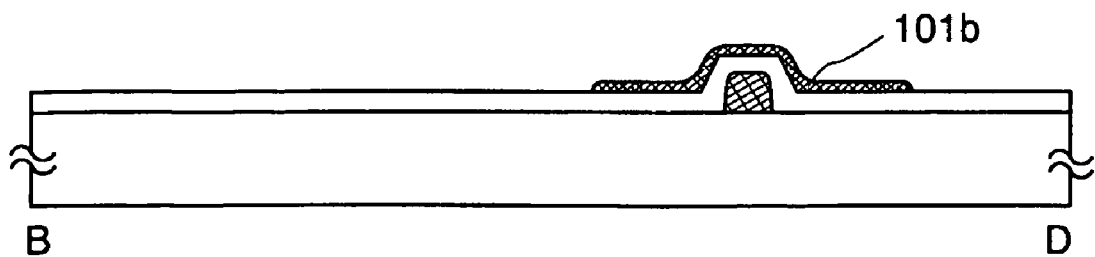
Figure 5A:
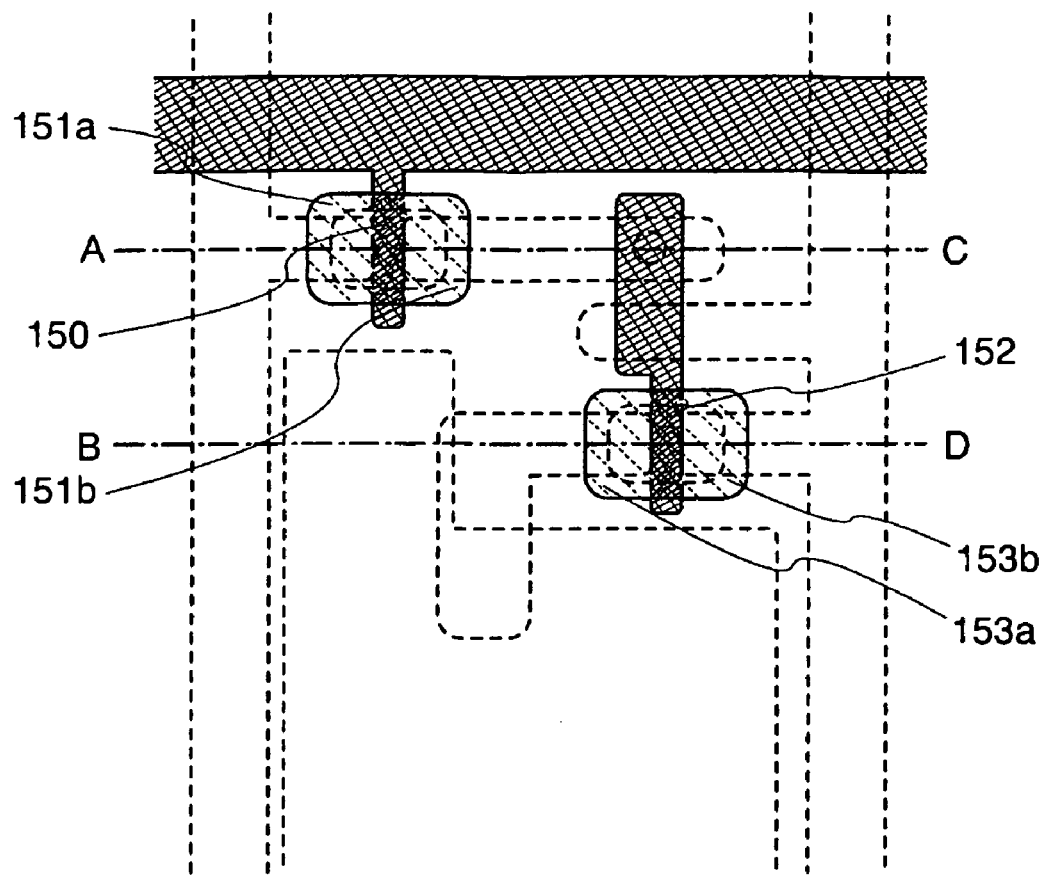
FIGS. 5A to 5C are views describing a method for manufacturing a display device according to a certain aspect of the invention.
Figure 5B:
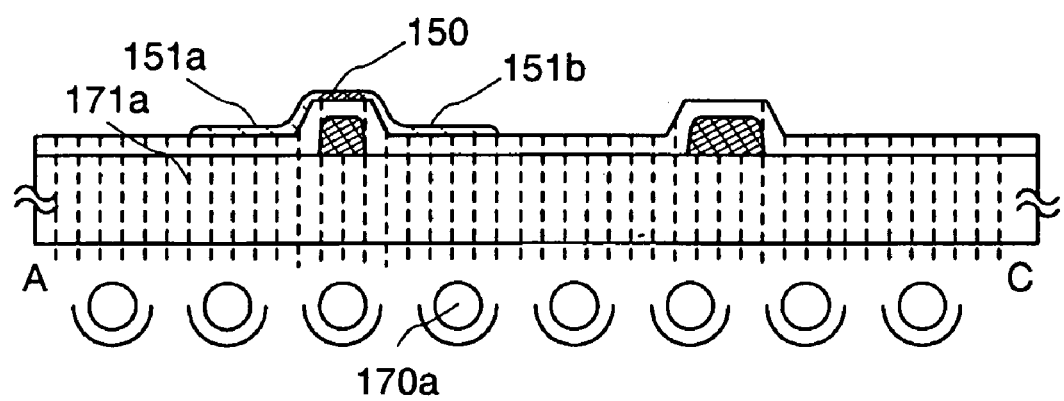
Figure 5C:
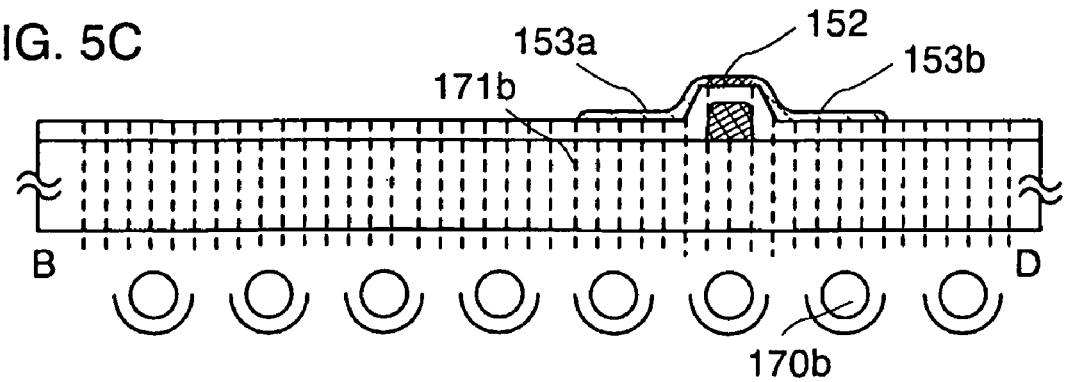

Subsequently, a gate insulating layer 106 is formed over the gate electrode layers 103 and 104 (see FIGS. 3A to 3C). The gate insulating layer 106 needs to have light-transmitting properties so that light is transmitted when the substance surface including a light-absorbing material formed over the gate insulating layer 106 is modified. The gate insulating layer 106 may be formed of a known material such as an oxide or nitride material of silicon, and may be a laminated layer or a single layer. In this embodiment mode, a laminated layer of three layers of a silicon nitride film, a silicon oxide film, and a silicon nitride film is used. Alternatively, a single layer of them or of a silicon oxynitride film, or a laminated layer of two layers may be used. A silicon nitride film having minute film quality may be preferably used. In the case of using silver, copper, or the like for the conductive layer formed by a droplet discharge method, and then, forming a silicon nitride film or a NiB film thereover as a barrier film, the silicon nitride film or the NiB film is effective in preventing an impurity from diffusing and in planarizing the surface. Note that a rare gas element such as argon is preferably included in a reactive gas and is preferably mixed into the insulating film to be formed in order to form a minute insulating film with few gate leak current at a low film-formation temperature.

As pretreatment for forming the source/drain electrode layer, a pattern formation region is modified to have different wettability with respect to a region adjacent thereto. In this embodiment mode, a substance having low wettability is formed, and the wettability is selectively changed by irradiation treatment using light to form a high-wettability region and a low-wettability region. The difference in wettability can be confirmed by contact angles and it is preferably 40° C. or more. In the invention, a light-absorbing material having an absorption region in a wavelength of light to be irradiated is added (mixed) in a subject to improve irradiation treatment efficiency of light.

In this embodiment mode, a pigment is used as a light-absorbing material. Compounds 101a and 101b having low wettability which are formed of a substance having low wettability and a pigment are formed over the substrate 100 (see FIGS. 4A to 4C).

As an example of the compound of the solution for forming the low-wettability region, a silane coupling agent expressed in a chemical formula of $R_n$—Si—$X_{(4-n)}$ (n=1, 2, 3) is used. Here, R denotes a substance which contains a comparatively inactive group such as an alkyl group. Further, X includes a hydrolysable group such as halogen, a methoxy group, an ethoxy group, or an acetoxy group, which can be bonded by the condensation with a hydroxyl group or absorbed water on a substance surface.

By using fluorine-based silane coupling agent (fluoroalkyl silane (hereinafter referred to as FAS)) having a fluoroalkyl group for R as a representative example of the silane coupling agent, the wettability can be lowered. R of FAS has a structure which expressed in $(CF_3)(CF_2)_x(CH_2)_y$ (x: an integer from 0 to 10, y: an integer from 0 to 4). In the case where a plurality of R or X are bonded to Si, R or X may all be the same or different. Fluoroalkylsilane such as heptadecafluorotetrahydrodecyltriethoxysilane, heptadecafluorotetrahydrodecyltrichlorosilane, tridecafluorotetrahydrooctyltrichlorosilane, trifluoropropyltrimethoxysilane can be used as FAS.

As the solvent of a solution for forming the low-wettability region, a solvent which forms a low-wettability region such as a hydrocarbon-based solvent, tetrahydrofuran, or the like, namely, n-pentane, n-hexane, n-heptane, n-octane, n-decane, dicyclopentane, benzene, toluene, xylene, durene, indene, tetrahydronaphthalene, decahydronaphthalene, squalene, or the like is used.

As an example of the compound of the solvent for forming the low-wettability region, a material having a fluorocarbon chain (a fluorine resin) can be used. As the fluorine resin, polytetrafluoroethylene (PTFE; a polytetrafluoroethylene resin), perfluoroalkoxyalkane (PFA; a tetrafluoroethylene perfluoroalkylvinylether copolymer resin), perfluoroethylene propylene copolymer (PFEP; a tetrafluoroethylene hexafluoropropylene copolymer resin), ethylene-tetrafluoroethylene copolymer (ETFE; a tetrafluoroethylene-ethylene copolymer resin), polyvinylidene fluoride (PVDF; a polyvinylidene fluoride resin), polychlorotrifluoroethylene (PCTFE; a polytrifluorochloroethylene resin), ethylene-chlorotrifluoroethylene copolymer (ECTFE; a polytrifluorochloroethylene-ethylene copolymer resin), polytetrafluoroethylene-perfluorodioxol copolymer (TFE/PDD), polyvinylfluoride (PVF; a vinyl fluoride resin), or the like can be used.

In addition, an organic material which does not form a low-wettability region (in other words, which forms a high-wettability region) may be used to form a low-wettability region by performing treatment with the use of $CF_4$ plasma or the like later. For example, a material in which a soluble resin such as polyvinyl alcohol (PVA) is mixed into a solvent of such as $H_2O$ can be used. In addition, PVA may be mixed with another soluble resin may be used. An organic group in which a skeleton is configured by the bond of an organic material (an organic resin material) (polyimide, acrylic), silicon (Si) and oxygen (O), and which includes at least hydrogen (such as an alkyl group or aromatic hydrocarbon) as a substituent is used. Alternatively, a fluoro group may be used as the substituent. Further alternatively, an organic group containing at least hydrogen and a fluoro group may be used as the substituent. Even when a material having a low-wettability surface is used, wettability can be further reduced by performing plasma treatment or the like.

In this embodiment mode, FAS is used as a substance having low-wettability, and coumarin 545T which is a pigment is used as a light-absorbing material. The substance is wettable with respect to the compound including a conductive material which later constitutes a source/drain electrode layer. FAS used in this embodiment mode is decomposed with light having a wavelength of 200 nm or less; however, a glass substrate absorbs and does not transmit light with a wavelength of 300 nm or less. Therefore, FAS can not be irradiated with light if a glass substrate is used as the substrate. Accordingly, in this embodiment mode, FAS is mixed (dissolved) with coumarin 545T which has an absorption wavelength region in the vicinity of 300 nm to 400 nm as the light-absorbing material, and a metal halide lamp which is an ultraviolet lamp which emits light with a wavelength of 200 nm to 450 nm is used as a light source. The light-absorbing material can be appropriately selected depending on the wavelength of the light to be used. In this embodiment mode, a substance having low-wettability is selectively formed by a droplet discharge method in the pattern formation region and the region adjacent thereto, however, the substance having low-wettability may be applied to a wide area (to the entire surface, for example) by a spin coating method or the like, and patterning may be carried out thereafter. When a droplet discharge method is used as in this embodiment mode, the waste of material can be reduced, and the usage efficiency of the material is improved.

Subsequently, the light-absorbing material and the compounds 101a and 101b having low wettability including a substance having low wettability are irradiated with light 171a and 171b which is emitted from light sources 170a and 170b from the side of the substrate 100 having light-transmitting properties through the substrate 100. The substance having low wettability in the irradiation region is decomposed by the light 171a and 171b and wettability is enhanced. A light-absorbing material is included in the compounds having low-wettability which is a subject. The light-absorbing material absorbs light and emits energy thereof to enhance irradiation treatment efficiency of light. The surface of the compound having low wettability in the region overlapping with the gate electrode layers 103 and 104 is not modified since the gate electrode layers 103 and 104 function as a mask. High wettability regions 151a and 151b having comparatively high wettability and a low wettability region 150 having comparatively low wettability are formed over the surface of the compound 101a having low wettability by irradiation treatment using the light 171a (see FIG. 5B). Likewise, high wettability regions 153a and 153b having comparatively high wettability and a low wettability region 152 having comparatively low wettability are formed over the surface of the compound 101b having low wettability by irradiation treatment using the light 171b (see FIG. 5C). According to the invention, the ranges of choices for light is widened since a light-absorbing material may be selected in accordance with light. Therefore, a wavelength in a region which is not absorbable by a substance which forms a subject can be selected, and light irradiation for performing surface modification treatment having preferable controllability can be carried out. Additionally, treatment can be sufficiently performed even when light has low energy itself since irradiation efficiency of light can be also enhanced. Hence, a device and a process are simplified, which causes reduction in the cost or time which enhances productivity.

In this embodiment mode, when the mask is formed by a droplet discharge method, treatment for forming a pattern formation region and the region adjacent thereto to have different wettability may be performed for pretreatment. In the invention, when a pattern is formed by discharging a droplet by a droplet discharge method, the pattern shape can be controlled by forming a low-wettability region and a high-wettability region in a pattern formation region and a region adjacent thereto. Performing the treatment on the formation region and the region adjacent thereto causes difference in wettability in the formation region and the region adjacent thereto, so that a droplet remains only in the high-wettability formation region. Accordingly, the pattern can be formed with preferable controllability. This step is applicable to pretreatment for forming any pattern in the case of using a liquid material.

A mask formed of an insulator such as a resist or polyimide is formed by using a droplet discharge method. A through-hole 145 is formed in a part of the gate insulating layer 106 by etching using the mask, and a part of the gate electrode layer 104 disposed in the lower layer is exposed. Either plasma etching (dry etching) or wet etching may be adopted for the etching. However, plasma etching is suitable to treat a large substrate. A fluorine-based or chlorine-based gas such as $CF_4$, $NF_3$, $Cl_2$, or $BCl_3$ is used as the etching gas, and an inert gas such as He or Ar may be appropriately added. In addition, a local discharge process can be performed when an atmospheric pressure discharge etching process is applied, and a mask layer need not be entirely formed over the substrate.

After forming regions having different wettability, the light-absorbing material included in the compound having low wettability may be cleaned with alcohol, water, or the like to be removed. In order to remove only the light-absorbing material, it is necessary to select a solvent having a high selective ratio so as not to dissolve a substance having low wettability. In the case of a dual emission type light emitting display device or a transmissive type liquid crystal display device which extract light from the substrate 100 having light-transmitting properties, it is preferable to remove the light-absorbing material since there is a possibility that light extraction efficiency is deteriorated. In the case of a wiring substrate, a top emission type light emitting display device, a reflective type liquid crystal display device, or the like, the light-absorbing material is not necessarily removed.

Figure 6A:
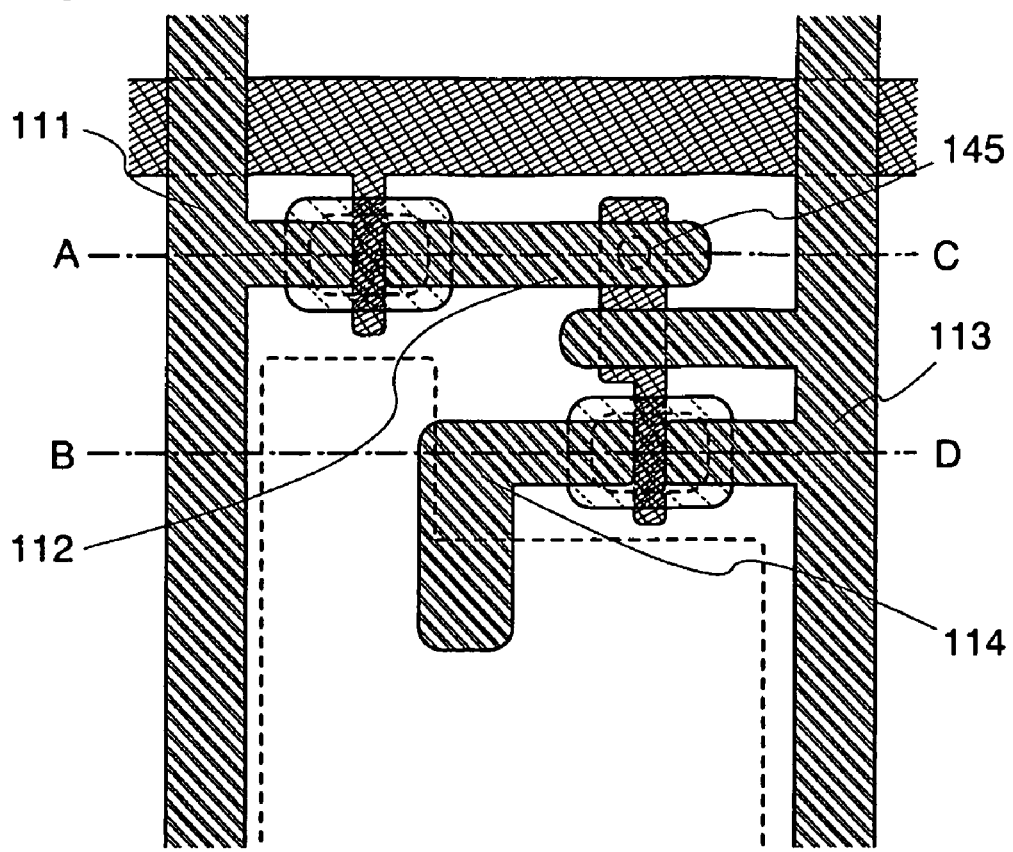
FIGS. 6A to 6C are views describing a method for manufacturing a display device according to a certain aspect of the invention.
Figure 6B:
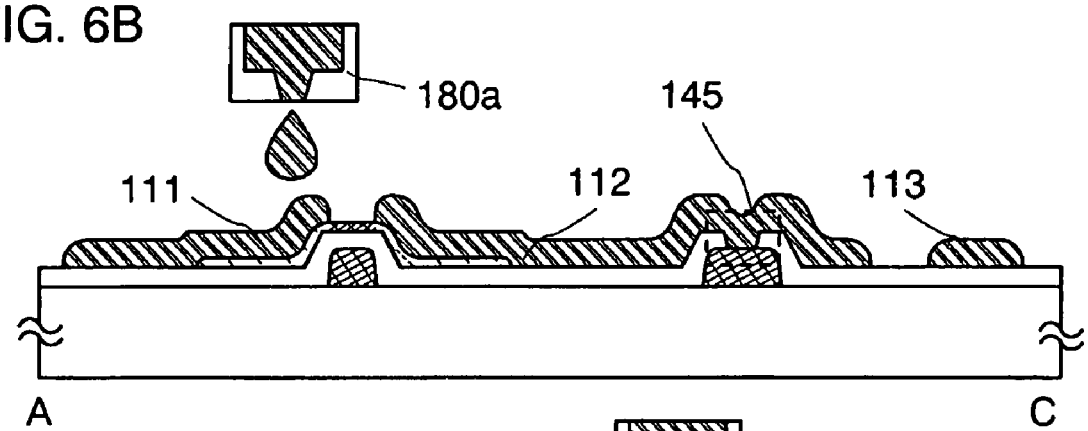
Figure 6C:
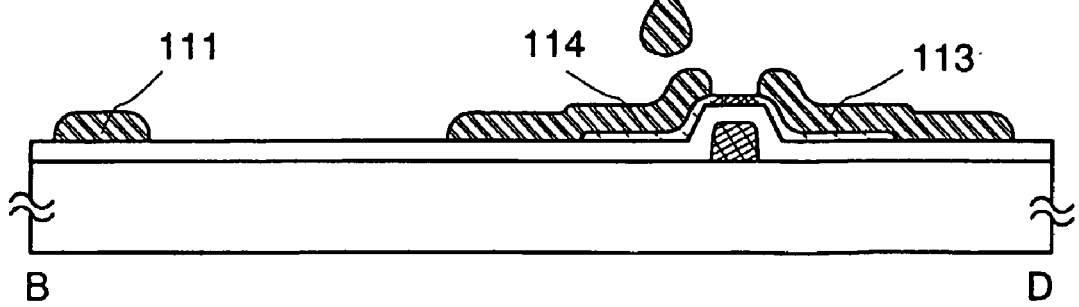

A compound including a conductive material is discharged from droplet discharge devices 180*a* and 180*b* to the high-wettability regions 151*a*, 151*b*, 153*a* and 153*b*, and source/drain electrode layers 111, 112, 113 and 114 are formed (see FIGS. 6A to 6C). Even when a discharge method of the compound including a pattern forming material can not be precisely controlled due to the size of a discharge opening of a nozzle from which a droplet is discharged, scanning capability of a discharge opening, or the like, a droplet is attached only to the formation region to form a desired pattern by performing treatment for enhancing wettability on the formation region. This is because the formation region and a region adjacent thereto have different wettability; therefore, the droplet is repelled in the low-wettability region to remain in a formation region having higher wettability. In other words, a droplet is repelled by the low-wettability region, which means the boundary between the high-wettability regions and the low-wettability region functions as a partition wall (a bank). Accordingly, a source/drain electrode layer can be formed to have a desired shape since the compound including a conductive material having fluidity can remain in the high-wettability regions.

The source/drain electrode layer 111 also serves as a source wiring layer, and the source/drain electrode layer 113 also serves as a power line.

The source/drain electrode layer 111, the source/drain electrode layer 112, the source/drain electrode layer 113, and the source/drain electrode layer 114 can be formed in a similar manner as the above described gate electrode layer 103 and the gate electrode layer 104.

As a conductive material for forming the source/drain electrode layers 111, 112 113, and 114, a compound which mainly contains metal particles of Ag (silver), Au (gold), Cu (copper), W (tungsten), Al (aluminum), or the like can be used. Alternatively, indium tin oxide (ITO), ITSO including indium tin oxide and silicon oxide, organic indium, organotin, zinc oxide, titanium nitride, or the like having light-transmitting properties may be combined.

The source/drain electrode layer 112 and the gate electrode layer 104 are electrically connected to each other through the through-hole 145 formed in the gate insulating layer 106. A part of the source/drain electrode layer forms a capacitor element.

According to the invention, in forming a fine pattern, for example, an electrode layer is formed, a conductive layer can be formed in the formation region without a droplet extended over the region even though a droplet discharge opening is somewhat large. Therefore, defects such as a short-circuit that is caused when the droplet is applied to the area other than the formation region by mistake can be prevented. Further, the thickness of the wiring can also be controlled. When the surface reformation is carried out by the light irradiation from the substrate side as in this embodiment mode, a large area can be treated in addition to that the pattern can be formed with preferable controllability; thus, the production efficiency is improved. By combining a droplet discharge method, the material loss can be avoided compared with entire surface application formation by spin coating or the like; therefore, the cost can be reduced. According to the invention, a pattern can be formed with preferable controllability even in the case where a wiring or the like is provided integrally and intricately due to miniaturization and thinner film formation.

As pretreatment, an organic material which functions as an adhesive agent may be formed to enhance adhesion with a pattern formed by a droplet discharge method. In this case, treatment for forming regions having different wettability may be performed over the substance. An organic group in which a skeleton is configured by the bond of an organic material (an organic resin material) (polyimide, acrylic), silicon (Si) and oxygen (O), and which includes at least hydrogen (such as an alkyl group or aromatic hydrocarbon) as a substituent is used. Alternatively, a fluoro group may be used as the substituent. Further alternatively, an organic group containing at least hydrogen and a fluoro group may be used as the substituent.

Next, a semiconductor layer is formed. A semiconductor layer having one conductivity may be formed if necessary, and plasma treatment with the use of $PH_3$ or the like can be performed before forming the semiconductor layer. In addition, an NMOS structure of an n-channel TFT in which an n-type semiconductor layer is formed, a PMOS structure of a p-channel TFT in which a p-type semiconductor layer is formed, and a CMOS structure of an n-channel TFT and a p-channel TFT can be manufactured. In addition, the n-channel TFT and the p-channel TFT can be formed by adding an element which provides conductivity with doping to provide conductivity to form an impurity region in the semiconductor layer.

The semiconductor layer can be formed by a known technique (a sputtering method, an LPCVD method, a plasma CVD method, or the like). The material for a semiconductor layer is not limited, and a silicon germanium (SiGe) alloy or the like may be used.

The semiconductor layer is formed by using an amorphous semiconductor (typically, hydrogenated amorphous silicon), a crystalline semiconductor (typically, polysilicon), or a semi-amorphous semiconductor. Polysilicon (polycrystalline silicon) includes a so-called high temperature polysilicon using polysilicon which is formed through process temperatures of 800° C. or more as a main material, a so-called low temperature polysilicon using polysilicon which is formed through process temperatures of 600° C. or less as a main material, polysilicon crystallized by adding an element or the like which promotes crystallization, or the like.

As another material, a semi-amorphous semiconductor or a semiconductor which contains a crystal phase in a part of the semiconductor layer can also be used.

When a crystalline semiconductor layer is used as the semiconductor layer, a known method (a laser crystallization method, a heat crystallization method, a heat crystallization method using an element promoting crystallization such as nickel, or the like) may be employed as a method for manufacturing the crystalline semiconductor layer. Crystallinity can be enhanced by irradiating a microcrystallite which is a SAS with laser light to crystallize. In the case of not introducing an element promoting crystallization, hydrogen is released until hydrogen concentration contained in an amorphous silicon film becomes $1 \times 10^{20}$ atoms/cm$^3$ or less by heating the amorphous silicon film for one hour at a temperature of 500° C. in nitrogen atmosphere before irradiating the amorphous silicon film with laser light. This is because the amorphous silicon film containing much hydrogen is damaged by being irradiated with laser light.

There is no particular limitation on a method for introducing a metal element into the amorphous semiconductor layer as long as it is a method capable of making the metal element exist on the surface or inside the amorphous semiconductor layer. For example, a sputtering method, a CVD method, a plasma treating method (including a plasma CVD method), an adsorption method, or a method for applying a metal salt solution can be employed. Among them, the method using a solution is simple and easy and is advantageous in terms of easy concentration adjustment of the metal element. It is preferable that an oxide film is formed by UV light irradiation in oxygen atmosphere, a thermal oxidation method, treatment with ozone water or hydrogen peroxide including a hydroxyl radical, or the like in order to improve wettability on the surface of the amorphous semiconductor layer and to spread an aqueous solution over the entire surface of the amorphous semiconductor layer.

Heat treatment and laser light irradiation may be combined to crystallize the amorphous semiconductor layer. The heat treatment and/or the laser light irradiation may be independently performed plural times.

A crystalline semiconductor layer may be directly formed over the substrate by a plasma method. Alternatively, a crystalline semiconductor layer may be selectively formed over the substrate by using a plasma method.

A semiconductor region can be formed from an organic semiconductor material by a printing method, a spray method, spin coating, a droplet discharge method, or the like. In this case, since the above etching step is not required, the number of steps can be reduced. A low molecular weight material, a high molecular weight material, or the like is used for the organic semiconductor, and in addition, a material such as an organic pigment, a conductive high molecular weight material can be used. A π-electron conjugated high molecular weight material having a skeleton constituted by a conjugated double bonds is preferably used as an organic semiconductor material used in the present invention. Typically, a soluble high molecular weight material such as polythiophene, polyfluoren, poly(3-alkylthiophene), a polythiophene derivative or pentacene can be used.

A material with which a first semiconductor region can be formed by performing treatment after depositing a soluble precursor is given as an example of an organic semiconductor material which can be used according to the invention. Note that polythienylenevinylene, poly(2,5-thienylenevinylene), polyacetyrene, a polyacetyrene derivative, polyallylenevinylene or the like is given as an example of such an organic semiconductor material formed by using the precursor.

In converting the precursor to an organic semiconductor, a reaction catalyst such as a hydrogen chloride gas is added additionally to a heat treatment. The following can be applied as a typical solvent which dissolves the organic semiconductor material having solubility: toluene, xylene, chlorobenzene, dichlorobenzene, anisole, chloroform, dichloromethane, γ-butyl lactone, butyl cellosolve, cyclohexane, NMP (N-methyl-2-pyrrolidone), cyclohexanone, 2-butanone, dioxane, dimethylformamide (DMF), THF (tetrahydrofuran) or the like.

Figure 7A:
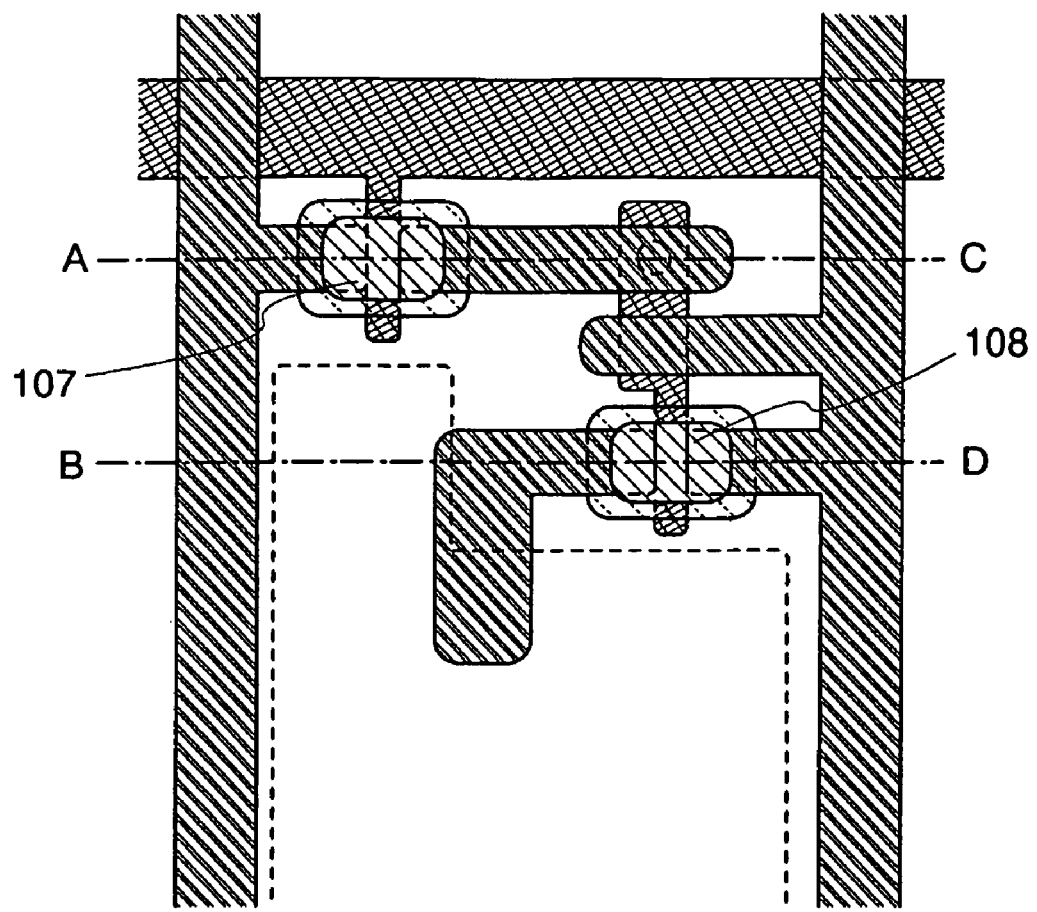
FIGS. 7A to 7C are views describing a method for manufacturing a display device according to a certain aspect of the invention.
Figure 7B:
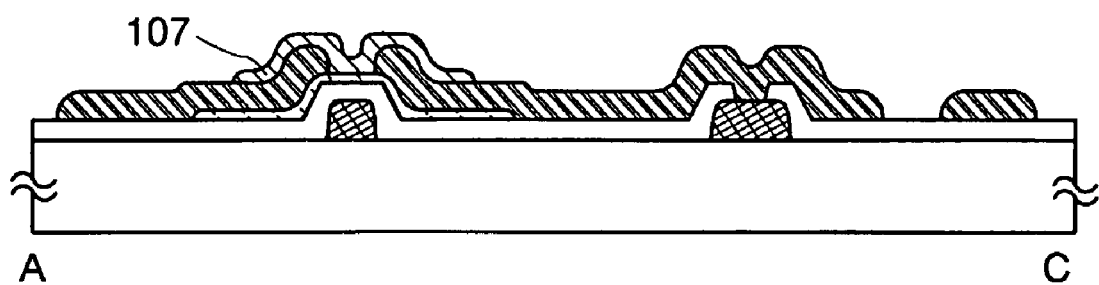
Figure 7C:
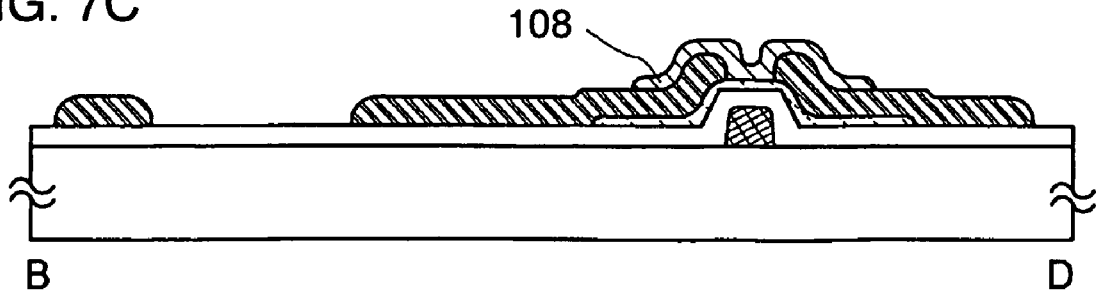

In this embodiment mode, semiconductor layers 107 and 108 are formed by a droplet discharge method with the use of pentacene (see FIGS. 7A to 7C).

Figure 8A:
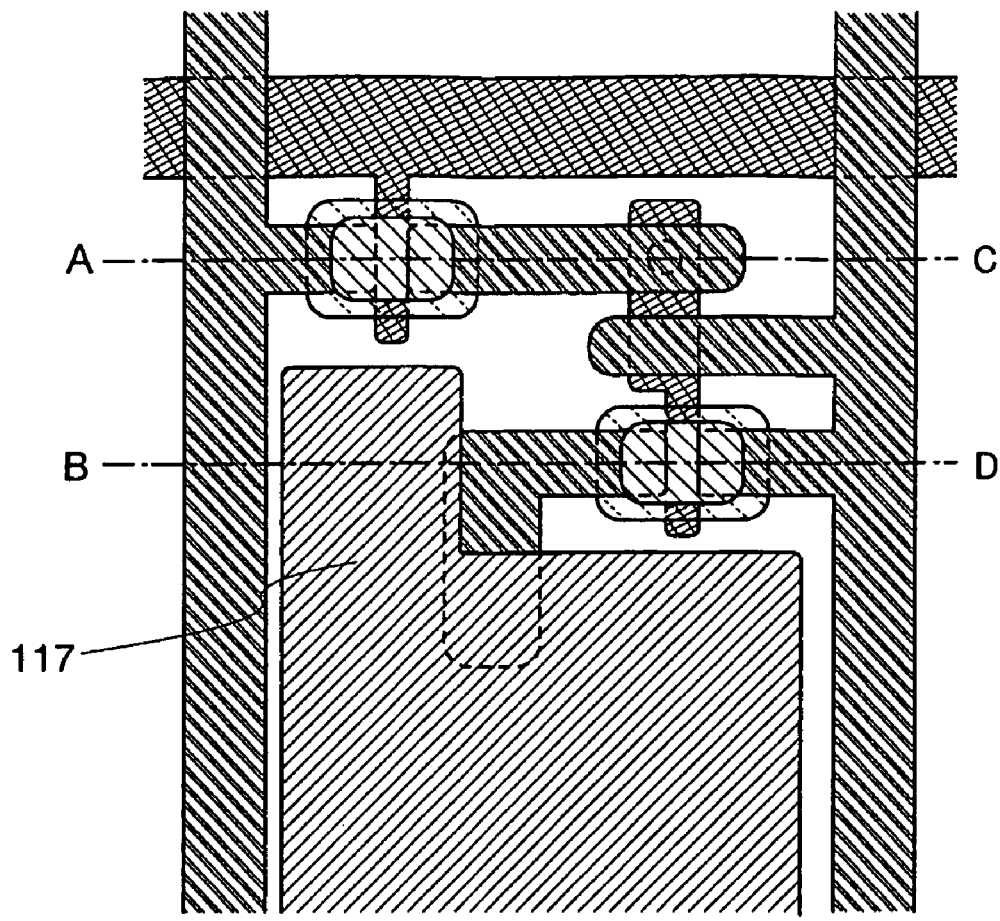
FIGS. 8A to 8C are views describing a method for manufacturing a display device according to a certain aspect of the invention.
Figure 8B:
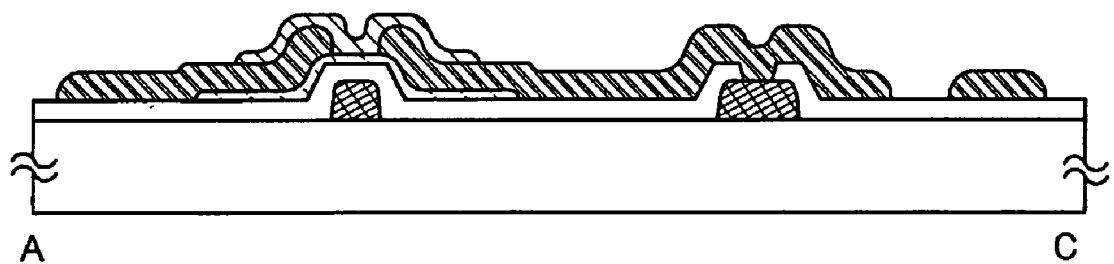
Figure 8C:
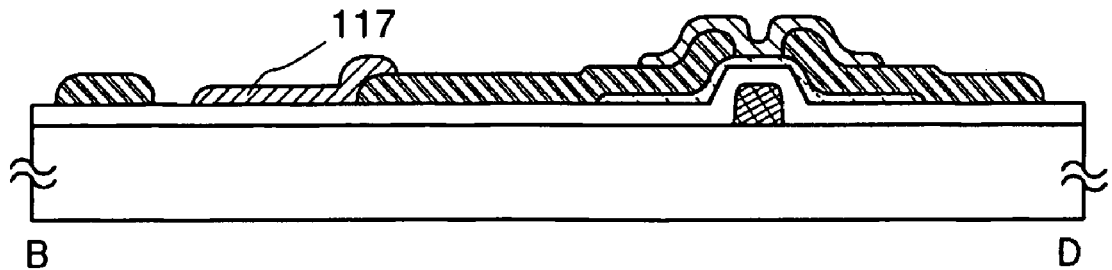

Then, a first electrode layer 117 is formed by selectively discharging a composition including a conductive material over the gate insulating layer 106 (FIGS. 8A to 8C). When the first electrode layer 117 is formed, naturally, pretreatment for forming a low-wettability region and a high-wettability region may be performed. The first electrode layer 117 can be formed with better controllability and more selectively by discharging a compound including a conductive material over the high-wettability region. When light is emitted from the side of the substrate 100 having light-transmitting properties, or when a transmissive display panel is manufactured, the first electrode layer 117 may be formed by forming a predetermined pattern using a material including indium tin oxide (ITO), indium tin oxide containing silicon oxide (ITSO), indium zinc oxide (IZO) containing zinc oxide (ZnO), zinc oxide (ZnO), a material in which gallium (Ga) is doped in ZnO, or tin oxide (SnO$_2$) or the like, and by baking the pattern.

Preferably, the first electrode layer 117 is formed of indium tin oxide (ITO), indium tin oxide containing silicon oxide (ITSO), zinc oxide (ZnO), or the like by a sputtering method. It is more preferable to use indium tin oxide containing silicon oxide formed by a sputtering method using a target in which ITO contains silicon oxide from 2% to 10% by weight. In addition to this, a conductive material in which ZnO is doped with gallium (Ga), or an oxide conductive material which contains silicon oxide and in which indium oxide is mixed with zinc oxide (ZnO) from 2% to 20% by weight (IZO (indium zinc oxide)) may be used. A mask layer may be formed by a droplet discharge method and etched to have a desired pattern after forming the first electrode layer 117 by a sputtering method. In this embodiment mode, the first electrode layer 117 is formed of a light-transmitting conductive material by a droplet discharge method. Specifically, it is formed by using indium tin oxide or ITSO made of ITO and silicon oxide.

In this embodiment mode, an example of the gate insulating layer formed of three layers of a silicon nitride film, a silicon oxynitride film (silicon oxide film), a silicon nitride film which are formed of silicon nitride is described above. As a preferable structure, the first electrode layer 117 made of indium tin oxide containing silicon oxide is preferably formed close in contact with the insulating layer formed of silicon nitride included in the gate insulating layer 106. Accordingly, an effect of increasing a rate at which light generated in an electroluminescent layer is emitted outside can be generated. The gate insulating layer may be interposed between the gate electrode layer and the first electrode layer and may function as a part of a capacitor element.

The first electrode layer 117 can be selectively formed over the gate insulating layer 106 before forming the source/drain electrode layer 114. In this case, this embodiment mode has a connection structure of the source/drain electrode layer 114 and the first electrode layer 117 in which the source/drain electrode layer 114 is laminated over the first electrode layer. When the first electrode layer 117 is formed before forming the source/drain electrode layer 114, it can be formed over a flat formation region. Therefore, the first electrode layer 117 can be formed to have preferable planarity since preferable coverage and deposition properties can be obtained and polishing treatment such as CMP can be carried out sufficiently.

A structure in which an insulating layer which is to be an interlayer insulating layer is formed over the source/drain electrode layer 114 to be electrically connected to the first electrode layer 117 through a wiring layer may also be employed. In this case, instead of forming an opening (contact hole) by removing the insulating layer, a substance having low wettability with respect to the insulating layer is formed over the source/drain electrode layer 114. An insulating layer is formed in a region except for a region where the substance having low wettability is formed when a compound including an insulating layer forming material is applied by an application method or the like.

After forming the insulating layer by curing it by heating, drying or the like, the substance having low wettability is removed to form the opening. The wiring layer is formed so as to fill the opening and the first electrode layer 117 is formed so as to be in contact with the wiring layer. By applying this method, an opening is not necessarily formed by etching; therefore, there is an effect that a process is simplified.

When a reflective type. EL display panel is manufactured in the case of employing a structure in which emitted light is emitted to the opposite side of the substrate 100 side having light-transmitting properties, a compound which mainly contains metal particles of Ag (silver), Au (gold), Cu (copper), W (tungsten), or Al (aluminum), or the like can be used. Alternatively, the first electrode layer 117 may be formed by forming a transparent conductive film or a light reflective conductive film by a sputtering method, forming a mask pattern by a droplet discharge method, and then combining an etching process.

The first conductive layer 117 may be polished by a CMP method or by cleaning with polyvinyl alcohol-based porous body so that the surface of the first conductive layer 117 is made flat. In addition, after polishing with the use of a CMP method, ultraviolet irradiation or oxygen plasma treatment or the like may be performed on the surface of the first electrode layer 117.

According to the above-mentioned steps, the TFT substrate 100 for a display panel in which a TFT of a bottom gate type and a pixel electrode are connected to the substrate 100 having light-transmitting properties is completed. The TFT in this embodiment mode is a co-planar type.

Subsequently, an insulating layer (also referred to as a partition wall or a bank) 121 is selectively formed. The insulating layer 121 is formed to have an opening over the first electrode layer 117. In this embodiment mode, the insulating layer 121 is formed over the entire surface, and etched and patterned by using a mask of a resist or the like. When the insulating layer 121 is formed by using a droplet discharge method or a printing method which can form the insulating layer 121 directly and selectively, patterning by etching is not necessarily required. The insulating layer 121 can also be formed to have a desired shape by pretreatment according to the invention.

The insulating layer 121 can be formed of silicon oxide, silicon nitride, silicon oxynitride, aluminum oxide, aluminum nitride, aluminum oxynitride or another inorganic insulating material; acrylic acid, methacrylic acid, or a derivative thereof; a heat-resistant polymer such as polyimide, aromatic polyamide, or polybenzimidazole; an inorganic siloxane-based insulating material which includes the Si—O—Si bond among a compound including silicon, oxygen and hydrogen, or an organic siloxane-based insulating material in which an organic group such as methyl or phenyl is substituted for hydrogen bound with silicon. The insulating layer 121 may also be formed by using a photosensitive material such as acrylic or polyimide, or a non-photosensitive material. The insulating layer 121 preferably has a shape in which a radius curvature changes continuously. Accordingly, the coverage of an electroluminescent layer 122 and a second electrode layer 123 which are formed over the insulating layer 121 is enhanced.

After forming the insulating layer 121 by discharging a compound by a droplet discharge method, the surface of the insulating layer may be pressed with pressure to be planarized in order to enhance its planarity. As a pressing method, depressions and projections may be smoothed by scanning a roller-shaped object, or the surface may be vertically pressed with a flat plate-shaped object. Alternatively, depressions and projections on the surface may be removed with an air knife by softening or melting the surface with a solvent or the like. A CMP method may be also used to polish the surface. This step may be applied for planarizing the surface when depressions and projections are generated by a droplet discharge method. When planarity is enhanced according to the step, display variations or the like of a display panel can be prevented; therefore, a high-definition image can be displayed.

Figure 9A:
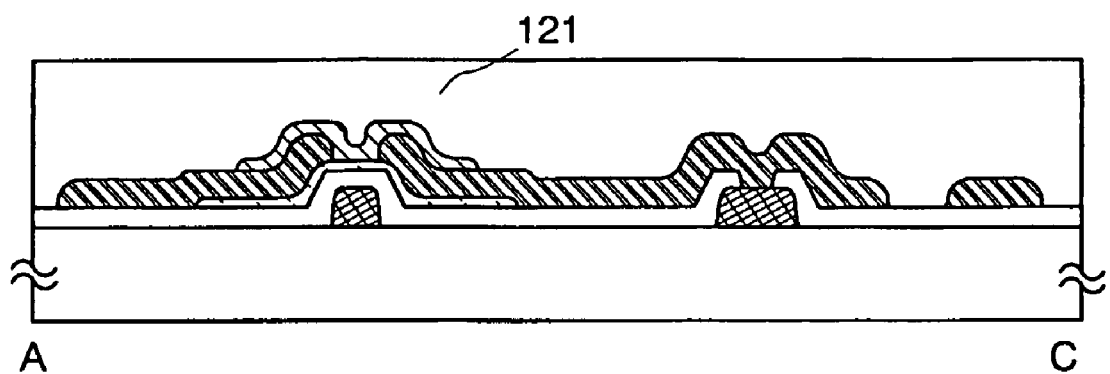
FIGS. 9A and 9B are views describing a method for manufacturing a display device according to a certain aspect of the invention.
Figure 9B:
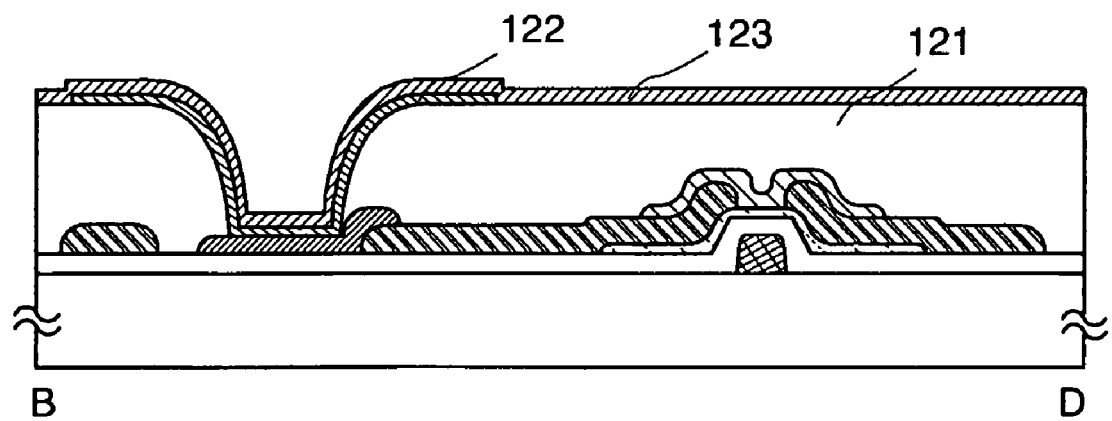

A light emitting element is formed over the substrate 100 having a TFT for a display panel (see FIGS. 9A and 9B).

Before forming the electroluminescent layer 122, moisture in the electrode layer 117 and the insulating layer 121 or adsorbed on its surfaces is removed by performing heat treatment at a temperature of 200° C. under atmospheric pressure. It is preferable to perform heat treatment at temperatures of from 200° C. to 400° C., preferably from 250° C. to 350° C. under low pressure, and to form the electroluminescent layer 122 without being exposed to atmospheric air by a vacuum evaporation method or a droplet discharge method which is performed under low pressure.

As the electroluminescent layer 122, materials each indicates the luminescence of red (R), green (G), and blue (B) is selectively formed by an evaporation method using an evaporation mask or the like for each. The materials (low molecular weight materials, high molecular weight materials, or the like) each indicates luminescence of red (R), green (G) and blue (B) can be formed by a droplet discharge method in the same manner as a color filter. This case is preferable since separate coloring of RGB can be carried out even without using a mask. Then, the second electrode layer 123 is laminated over the electroluminescent layer 122 to complete a display device having a display function using a light emitting element.

Although it is not shown, it is effective to provide a passivation film so as to cover the second electrode layer 123. A protective film which is provided at the time of forming a display device may have a single layer structure or a multi-layer structure. As the passivation film, a single layer of an insulating film containing silicon nitride (SiN), silicon oxide (SiO$_2$), silicon oxynitride (SiON), silicon nitride oxide (SiNO), aluminum nitride (AlN), aluminum oxynitride (AlON), aluminum nitride oxide which has more nitrogen content than oxygen content, aluminum oxide, diamond like carbon (DLC) or a nitrogen-containing carbon film (CNx), or a laminated layer in which the insulating films are combined (for example, a laminated layer of a nitrogen-containing carbon film (CNx) and silicon nitride (SiN)) can be used. A laminated layer such as an organic material can also be used, or a laminated layer of a polymer such as a styrene polymer may be used. Alternatively, an organic group in which a skeleton is configured by the bond of silicon (Si) and oxygen (O), and which contains at least hydrogen (such as an alkyl group or aromatic hydrocarbon) as a substituent is used. Alternatively, a fluoro group may be used as the substituent. Further alternatively, an organic group containing at least hydrogen and a fluoro group may be used as the substituent.

At this time, it is preferable to use a film having preferable coverage as the passivation film, and a carbon film, particularly, a DLC film is effective. A DLC film can be formed within the temperatures ranging from a room temperature to 100° C. or lower; therefore, a DLC film can be easily formed over an electroluminescent layer having low heat resistance. A DLC film can be formed by a plasma CVD method (typically, an RF plasma CVD method, a microwave CVD method, an electron cyclotron resonance (ECR) CVD method, a heat filament CVD method or the like), a combustion flame method, a sputtering method, an ion beam evaporation method, a laser evaporation method or the like. A hydrogen gas and a hydrocarbon-based gas (for example $CH_4$, $C_2H_2$, $C_6H_6$, or the like) are used as a reactive gas which is used for forming the film. The reaction gas is ionized by glow discharge. The ions are accelerated to collide with a cathode applied with negative self bias. A CN film may be formed by using a $C_2H_2$ gas and an $N_2$ gas as a reactive gas. The DLC film has a high blocking effect on oxygen and can suppress the oxidation of the electroluminescent layer. Accordingly, the electroluminescent layer can be prevented from oxidizing during a subsequent sealing step.

Subsequently, a sealant is formed and sealing is performed with a sealing substrate. Then, a flexible wiring substrate may be connected to a gate wiring layer which is formed by being electrically connected to the gate electrode layer 103 to electrically connect to the exterior. This is the same for a source wiring layer which is formed by being electrically connected the source/drain electrode layer 111.

Figure 18A:
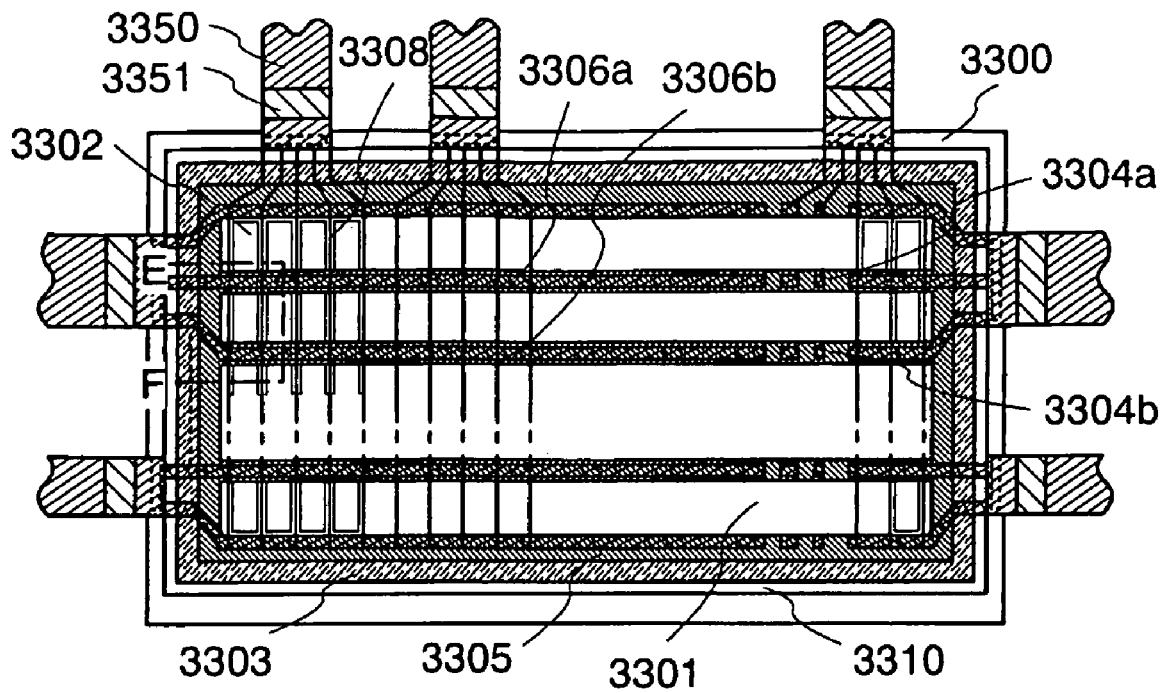
FIGS. 18A and 18B are top views describing a display panel according to a certain aspect of the invention.
Figure 18B:
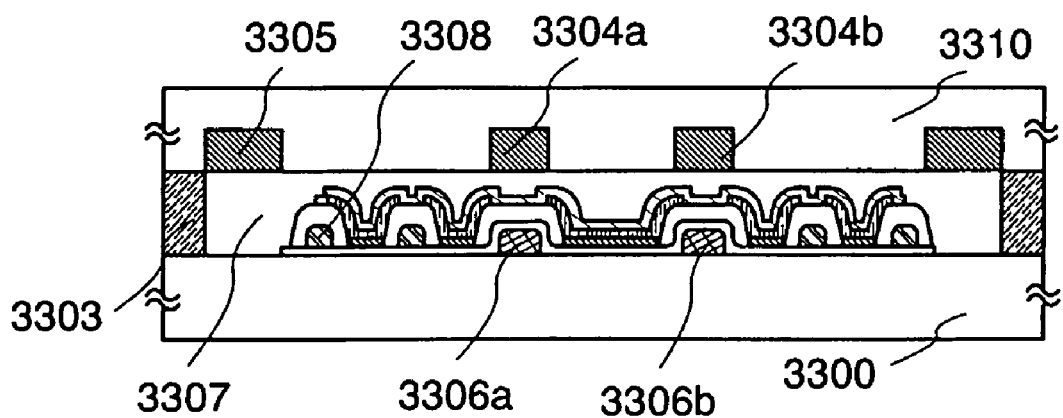

A completion drawing of an EL display panel manufactured by using the invention is shown in FIGS. 18A and 18B. FIG. 18A shows a top view of the EL display panel and FIG. 18B shows a cross-sectional view taken along the line of E-F in FIG. 18A. In FIGS. 18A and 18B, a pixel portion 3301 formed over an element substrate 3300 includes a pixel 3302, gate wiring layers 3306a and 3306b, and a source wiring layer 3308, and the element substrate 3300 is fixed to a sealing substrate 3310 by being bonded with a sealant 3303. In this embodiment mode, a driver IC 3351 is provided over an FPC 3351 and mounted by a TAB method.

As shown in FIGS. 18A and 18B, desiccants 3305, 3304a, and 3304b are provided in a display panel in order to prevent deterioration due to moisture of the element. The desiccant 3305 is formed so as to encircle the circumference of the pixel portion, and the desiccants 3304a and 3304b are formed in a region corresponding to the gate wiring layers 3306a and 3306b. In this embodiment mode, the desiccants are provided in a depressed portion formed in the sealing substrate, which does not prevent an EL display panel from being thinned. A large absorption area can be obtained since a desiccant is formed also in a region corresponding to a gate wiring layer, therefore enhancing an absorption efficiency. Additionally, since the desiccants are formed over the gate wiring layer which does not emit light directly, a light extraction efficiency is not deteriorated. In this embodiment mode, a filler 3307 is filled in a display panel. When a substance having moisture absorption properties such as a desiccant is used as the filler, a further absorption effect can be obtained and the element can be prevented from being deteriorated.

In this embodiment mode, although the case where a light emitting element is sealed with a glass substrate is shown, sealing treatment is treatment to protect a light emitting element from moisture. Therefore, any of a method in which a light emitting element is mechanically sealed with a cover material, a method in which a light emitting element is sealed with a heat-curable resin or an ultraviolet-light-curable resin, and a method in which a light emitting element is sealed with a thin film such as metal oxide, nitride or the like having high barrier capabilities, can be used. As for the cover material, glass, ceramics, plastic or metal can be used. However, when light is emitted to the cover material side, the cover material needs to have light-transmitting properties. Enclosed space is formed by attaching the cover material to the substrate over which the above-mentioned light emitting element is formed with a sealant such as a heat-curable resin or an ultraviolet-light-curable resin and then by curing the resin with heat treatment or ultraviolet irradiation treatment. It is also effective to provide a hydroscopic absorbent material typified by barium oxide in the enclosed space. The absorbent material may be provided over the sealant or over a partition wall or a peripheral part so as not to block light emitted from a light emitting element. Further, it is also possible to fill the space between the cover material and the substrate over which the light emitting element is formed with a heat-curable resin or an ultraviolet-light-curable resin. In this case, it is effective to add a hydroscopic material typified by barium oxide in the heat-curable resin or the ultraviolet-light-curable resin.

In this embodiment mode, although a single gate structure of a switching TFT is shown, a multi-gate structure such as a double gate structure may also be employed. When a semiconductor is manufactured by using a SAS or a crystalline semiconductor, an impurity region can be formed by adding an impurity which imparts one conductivity type. In this case, a semiconductor layer may have an impurity region having different concentration. For example, the semiconductor layer may have a low concentration impurity region in a periphery of a channel formation region and a region which is laminated with a gate electrode layer, and a high concentration impurity region which is outside thereof.

As described above, in this embodiment mode, a photolithography step using a photomask is not employed, and thus steps can be omitted. In addition, a display panel can be easily manufactured by directly forming various patterns over the substrate with the use of a droplet discharge method even when a glass substrate which is in and after the fifth generation having 1000 mm or more on a side is used.

According to the invention, a desired pattern can be formed with preferable controllability, and the loss of a material and the cost can be reduced. Hence, a high-performance and highly reliable display device can be manufactured with a preferable yield.

Embodiment Mode 3

An embodiment mode of the present invention is described with reference to FIGS. 10A to 10C and FIGS. 11A and 11B. In this embodiment mode, a display device is manufactured by using a top gate type (a stagger type) thin film transistor as a thin film transistor. An example of a liquid crystal display device using a liquid material as a display element is shown. Accordingly, the same part or a part having similar function is not repeatedly explained. Note that FIGS. 10A to 10C and FIGS. 11A and 11B show cross-sectional views of the display device.

Also in this embodiment mode, light irradiation treatment is carried out through a substrate to modify the irradiated area to change the wettability thereof by utilizing a pigment as a light-absorbing material.

A source/drain electrode layer 330 and a source/drain electrode layer 308 are formed over a substrate 300 having light-transmitting properties. The electrode layers are formed by a droplet discharge method in this embodiment mode.

An n-type semiconductor layer is formed over the source/drain electrode layers 330 and 308 and is etched with a mask formed of a resist or the like. The resist may be formed by using a droplet discharge method. A semiconductor layer is formed over the n-type semiconductor layer and patterned by using a mask or the like again. Accordingly, n-type semiconductor layers 307 and 306 are formed. The semiconductor layer 306 is made of silicon which is an inorganic material in this embodiment mode; however, it can also be formed with an organic semiconductor such as the above pentacene. When an organic semiconductor is selectively formed by a droplet discharge method or the like, the patterning process can be simplified.

Figure 10A:
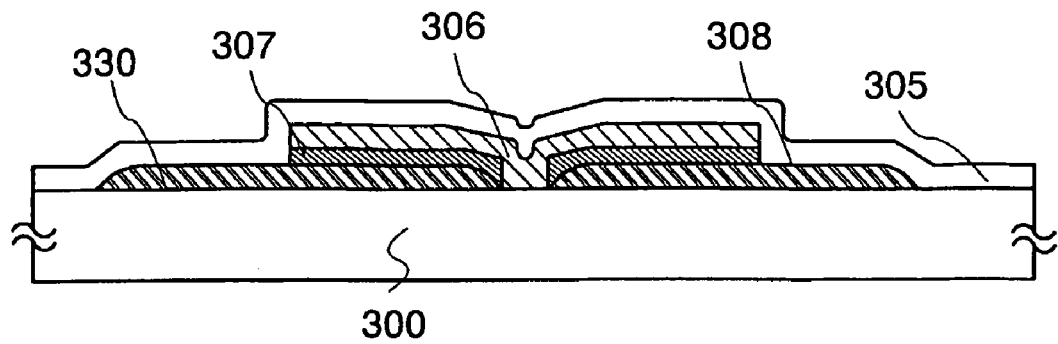
FIGS. 10A to 10C are views describing a method for manufacturing a display device according to a certain aspect of the invention.

Then, a gate insulating layer 305 is formed to be a single layer or a laminate by a plasma CVD method or a sputtering method (FIG. 10A). The gate insulating layer 305 may use either an inorganic material or an organic material. As a preferable mode, in particular, a lamination body of three layers of an insulating layer including silicon nitride, an insulating layer including silicon oxide, and an insulating layer including silicon nitride is equivalent to the gate insulating layer.

Subsequently, a mask formed of a resist or the like is formed over the gate insulating layer 305 and the gate insulating layer 305 is etched to form a through-hole 345. In this embodiment mode, the mask is selectively formed by a droplet discharge method.

Figure 10B:
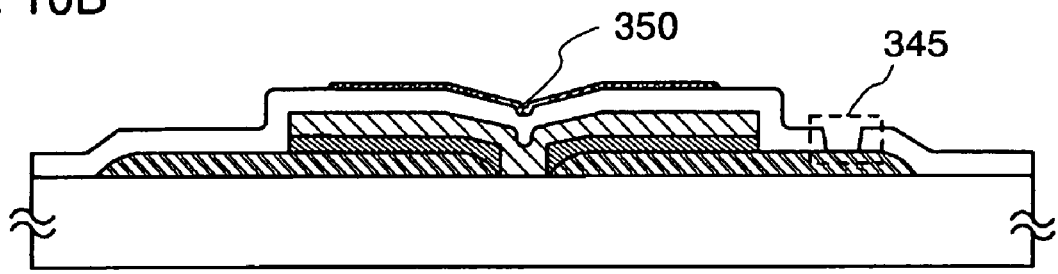
Figure 10C:
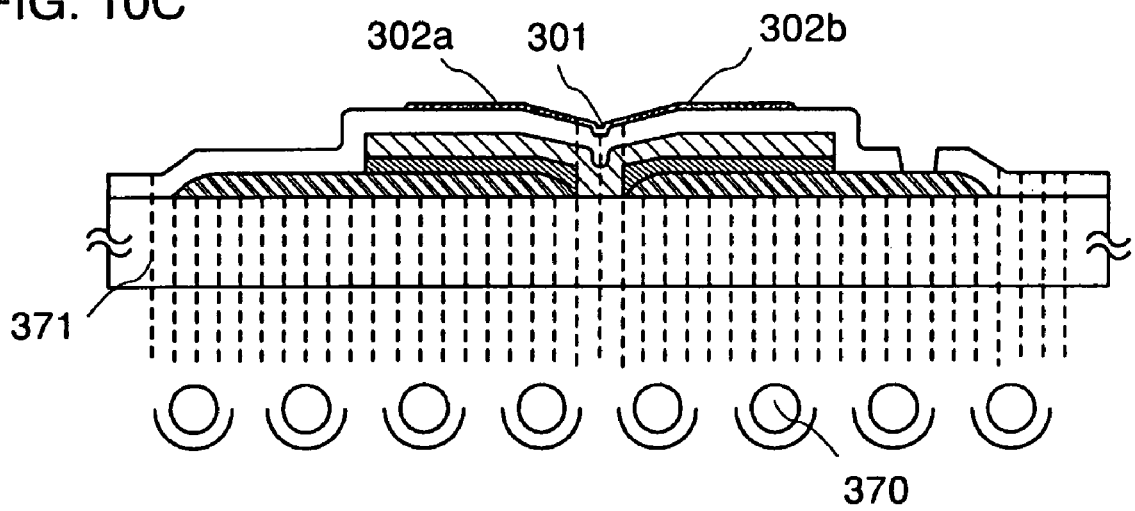

A compound 350 having low wettability in which a light-absorbing material having an absorption region in a light wavelength region is mixed into a substance having low wettability is formed (see FIG. 10B).

The compound 350 having low wettability is irradiated with light 371 emitted from a light source 370 from the substrate 300 side having light-transmitting properties. The surface of the compound 350 having low wettability is modified by the light 371 which passes through the substrate 300, the semiconductor layer 306, and the gate insulating layer 305. The source/drain electrode layers 330 and 308 function as masks. Accordingly, a high wettability region 301 having comparatively high wettability and low wettability regions 302a and 302b having comparatively low wettability are formed over the surface of the compound 350 having low wettability (see FIG. 10C). The light is absorbed by the light-absorbing material resulting in enhancing the irradiation treatment efficiency, which causes to increase processing capacity. When a film is modified by using a source/drain electrode layer as a mask as in this embodiment mode, a minute patterns having different wettability can be formed with preferable controllability. Additionally, the loss of a material and the cost can be reduced compared with entire application formation by employing a spin coating method or the like by combining a droplet discharge method.

In this embodiment mode, light irradiation is performed on the substance including a light-absorbing material which is formed over the substrate 300 having light-transmitting properties, the semiconductor layer 306, the gate insulating layer 305 to modify the substance surface. Therefore, it is important that light absorption in the light-transmitting substrate 300 through which light passes, the semiconductor layer 306, and the gate insulating layer 305 is suppressed in order that energy required for treatment for modifying the substance surface including a light-absorbing material is given to the substance including a light-absorbing material. Energy given to the modification treatment of the substance surface including a light-absorbing material is changed due to absorption amount of a material through which light passes, incorporation amount (concentration) of the light-absorbing material, or the like. Therefore, the energy may be appropriately set.

Figure 11A:
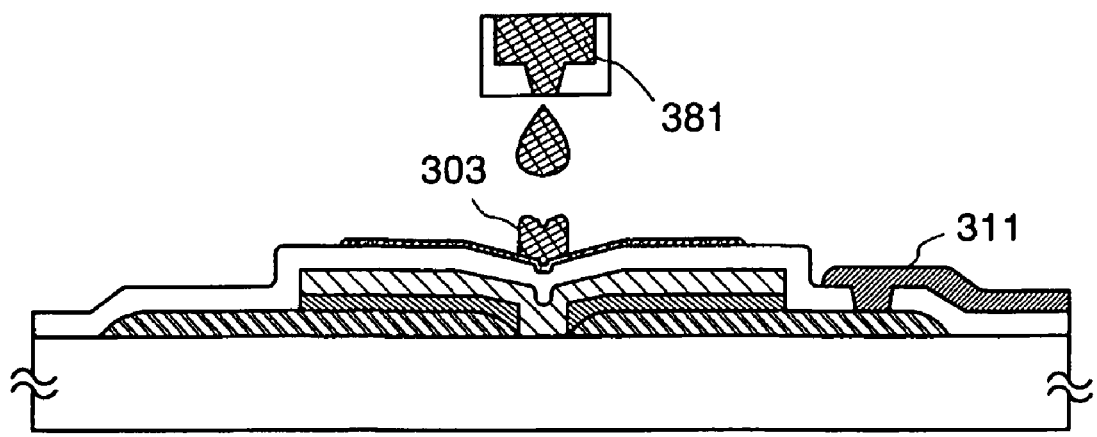
FIGS. 11A and 11B are views describing a method for manufacturing a display device according to a certain aspect of the invention.

A compound including a conductive material is discharged in the fluidity form of droplets from a droplet discharge device 381 to the high-wettability region 301 to form a gate electrode layer 303 (FIG. 11A). The discharged compound having fluidity including a conductive material is repelled by the low-wettability regions 302a and 302b due to the difference of the wettability of the formation region without being fixed thereto. Therefore, the compound is formed in the high wettability region 301, which is more stable, with preferable controllability and stability.

The substance which changes wettability formed as pretreatment may be left after forming the electrode layer, or an unnecessary portion may be removed after forming a pattern. The substance can be removed by using a pattern as a mask, and ashing with the use of oxygen or the like, etching, plasma treatment or the like can be used. Additionally, after performing light irradiation treatment to form regions having different wettability, a light-absorbing material may be removed with a solvent such as alcohol in which a light-absorbing material dissolves.

A pixel electrode layer 311 is formed by a droplet discharge method. The pixel electrode layer 311 and the source/drain electrode layer 308 are electrically connected to each other through the through-hole 345 formed before. The same material used for the above-mentioned first electrode layer 117 can be used for the pixel electrode layer 311, and when a transmissive liquid crystal display panel is manufactured, a predetermined pattern is formed by a compound including indium tin oxide (ITO), indium tin oxide containing silicon oxide (ITSO), zinc oxide (ZnO), tin oxide ($SnO_2$) or the like, and then formed by baking.

Then, an insulating layer 312 called an alignment film is formed by a printing method or a spin coating method so as to cover the pixel electrode layer 311. The insulating layer 312 can be selectively formed with the use of a screen printing method or an offset printing method. Then, rubbing is performed and a sealant is formed in a peripheral region where a pixel is formed by a droplet discharge method (not shown).

Figure 11B:
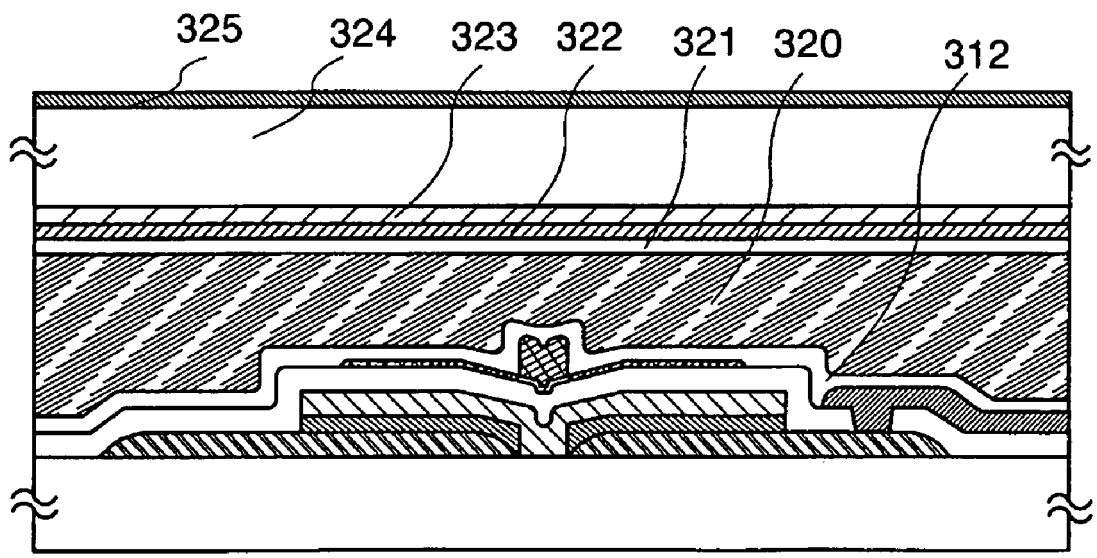

Subsequently, a liquid crystal display panel can be manufactured by attaching a counter substrate 324 provided with an insulating layer 321 functioning as an alignment film, a coloring layer 322 functions as a color filter, a conductive layer 323 functioning as a counter electrode, and a counter substrate 324 provided with a polarizing plate 325 to the TFT substrate 300 with a spacer therebetween, and by providing the space with a liquid crystal layer 320 (see FIG. 11B). A sealant may be mixed with a filler, and further, the counter substrate 324 may be provided with a shielding film (a black matrix), or the like. Note that a dispenser type (a dropping type) or a dip type (a pumping type) that injects a liquid crystal by using a capillary phenomenon after attaching the counter substrate 324 can be used as a method for forming the liquid crystal layer.

Figure 29:
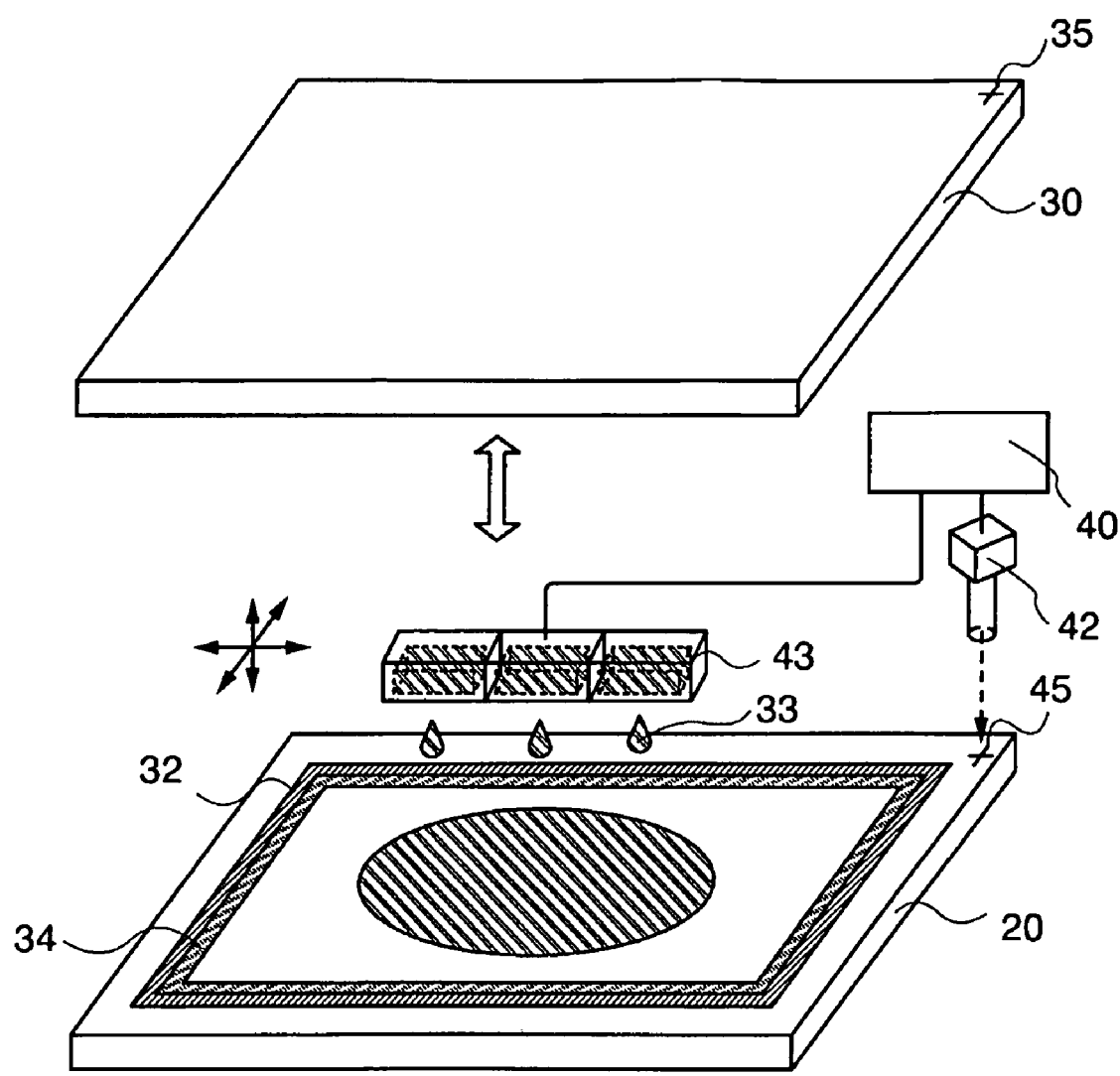
FIG. 29 is a figure describing a droplet discharge injection method which is applicable to a certain aspect of the invention.

A liquid crystal drop injection method employing a dispenser type is described with reference to FIG. 29. A liquid crystal drop injection method in FIG. 29 includes a control device 40, an image-taking means 42, a head 43, a liquid crystal 33, markers 35 and 45, a barrier layer 34, a sealant 32, a TFT substrate 30, and a counter substrate 20. A closed loop is formed with the sealant 32, and the liquid crystal 33 is dropped once or plural times therein from the head 43. When the liquid crystal material is highly adhesive, the liquid crystal material is continuously discharged and attached to a formation region with being interconnected. On the other hand, when the liquid crystal material is low adhesive, the liquid crystal material is intermittently discharged and a droplet is dropped as in FIG. 29. At this time, the barrier layer 34 is provided to prevent the sealant 32 and the liquid crystal 33 from reacting with each other. Subsequently, the substrates are attached in vacuum, and then, ultraviolet light curing is performed to make the space filled with the liquid crystal.

A connection portion is formed to connect the pixel portion formed in the above step and an external wiring substrate. The insulating layer in the connection portion is removed by ashing treatment using an oxygen gas under the atmospheric pressure or pressure in proximity of the atmospheric pressure. This treatment is performed by using an oxygen gas and one or more gases of hydrogen, $CF_4$, $NF_3$, $H_2O$, and $CHF_3$. In this step, ashing treatment is performed after sealing by using the counter substrate to prevent damage or destruction due to static, however, ashing treatment may be performed at any timing when there are few effects of static.

A connection wiring substrate is provided so as to electrically connect a wiring layer with an anisotropic conductive layer interposed therebetween. The wiring substrate has a function of transmitting a signal or electric potential from external. Through the above-mentioned steps, a liquid crystal display panel including a display function can be manufactured.

In this embodiment mode, a switching TFT having a single gate structure is described, however, a multi gate structure such as a double gate structure may be employed. When a semiconductor is manufactured with the use of a SAS or a crystalline semiconductor, an impurity region can be formed by adding an impurity which imparts one conductivity type. In this case, a semiconductor layer may have impurity regions having different concentration. For example, a region laminated with a gate electrode layer and adjacent to a channel region of a semiconductor layer may be a low concentration impurity region, and the exterior region thereof may be a high concentration impurity region.

As described above, the steps can be omitted in this embodiment mode by not applying a light exposure step utilizing a photomask. In addition, a display panel can be easily manufactured by directly forming various patterns over a substrate with a droplet discharge method even when a glass substrate in and after the fifth generation having 1000 mm or more on a side is used.

According to the invention, a desired pattern can be formed with preferable controllability, and the loss of a material and the cost can be reduced. Hence, a high-performance and highly reliable display device can be manufactured with a preferable yield.

Embodiment Mode 4

A thin film transistor can be formed by applying the present invention, and a display device can be formed with the use of the thin film transistor. In addition, when a light emitting element is used and an n-type transistor is used as a transistor which drives the light emitting element, light emitted from the light emitting element performs any of bottom emission, top emission, and dual emission. Here, a laminated structure of a light emitting element of each emission will be described with reference to FIGS. 12A to 12C.

Further, in this embodiment mode, channel protective thin film transistors 471 and 481, and a channel etch thin film transistor 461 according to the invention are used. The thin film transistor 481 is provided over a substrate 480 having light-transmitting properties and includes a gate electrode layer 493, a gate insulating layer 497, a semiconductor layer 494, an n-type semiconductor layer 495, a source/drain electrode layer 487, and a channel protective layer 496. In this embodiment mode, a silicon film having an amorphous structure is used as the semiconductor layer, and an n-type semiconductor layer is used as a semiconductor layer of one conductivity type. The semiconductor layer of one conductivity type may be formed if necessary, and instead of forming an n-type semiconductor layer, a semiconductor may be given conductivity by plasma treatment under $PH_3$ gas atmosphere. The semiconductor layer is not limited to the mode of this embodiment mode, and a crystalline semiconductor layer may be used as in Embodiment Mode 2. In the case of using a crystalline semiconductor layer of polysilicon or the like, an impurity region having one conductivity type may be formed by doping (adding) impurities into the crystalline semiconductor layer without forming the one conductivity type semiconductor layer. Further, an organic semiconductor of such as pentacene can be formed. For example, when an organic semiconductor is selectively formed by a droplet discharge method, the patterning process can be simplified.

A substance 490 including a light-absorbing material is formed over the channel protective layer 496 and the n-type semiconductor layer 495. In this embodiment mode, the substance 490 including a light-absorbing material is irradiated with light from the substrate side having light-transmitting properties to modify the surface of the substance 490 including a light-absorbing material which is not shielded by the gate electrode layer 493. When light having a wavelength which is absorbed by a light-absorbing material is radiated, the light-absorbing material absorbs the irradiated light and emits the absorbed light. Thus emitted energy modifies the surface leading to increasing modification processing capacity of light irradiation. Light having a wavelength except for the one which is absorbed by the substrate having light-transmitting properties can be selected since the range of choices for a wavelength of irradiation light is widened by selecting a light-absorbing material.

Figure 12A:
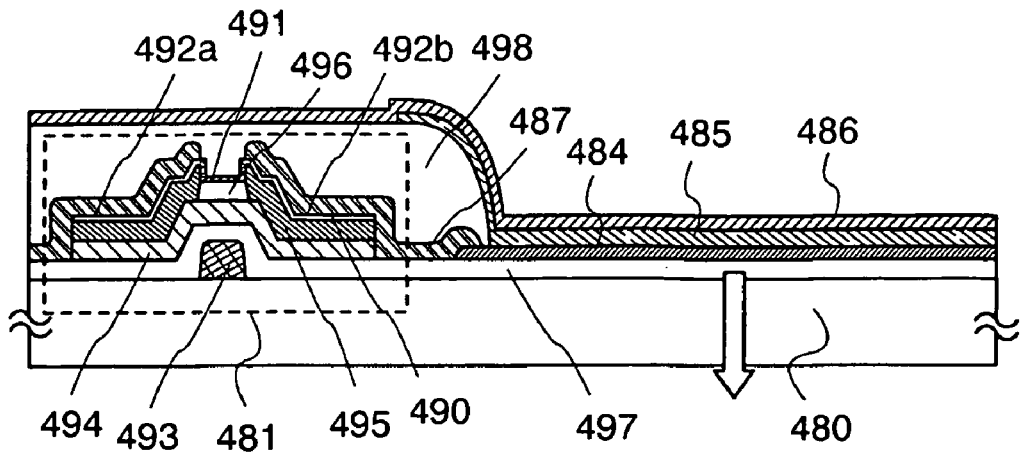
FIGS. 12A to 12C are cross-sectional views of a display device according to a certain aspect of the invention.

In this embodiment mode, a light-absorbing material is mixed into a substance having low wettability with respect to the compound including a conductive material to modify a region except for the surface of the channel protective layer 496 where the gate electrode layer 493 functions as a mask so as to be a high-wettability region by being irradiated with light. Hence, high-wettability regions 492a, 492b which are comparatively high-wettability regions and a low-wettability region 491 which is comparatively low-wettability region 491 are formed over the surface of the substance 490 including a light-absorbing material. The low-wettability region 491 on the surface of the channel protective layer has lower wettability than the high-wettability regions 492a and 492b on the surface of the surrounding n-type semiconductor. As a result, the source/drain electrode layer 487 is formed over the high-wettability regions 492a and 492b having high wettability with preferable controllability. Since the substance having low wettability used in this embodiment mode is FAS that is thin as a molecular level, the n-type semiconductor layer and the electrode layer are not insulated. The substance having low wettability can be made conductive or insulative by selecting the material and/or the thickness in according with the structure to be used. As to the thin film transistor 481, a substance having less wettability with respect to the compound including a conductive material is formed over the channel protective layer. When the substance has low wettability also with respect to an insulating layer 498 formed to cover the thin film transistor 481, formation defects such as that the adhesion of the insulating layer 498 is reduced would be caused. Therefore, it is preferable to remove the substance including a light-absorbing material or to modify the substance to improve the wettability by light irradiation. Such treatment is not necessarily carried out in the case where the insulating layer is formed by a vapor deposition method, a CVD method, a sputtering method, or the like. The insulating layer 498 covering the thin film transistor 481 shown in FIG. 12A is formed by a vapor deposition method, which is an example where treatment is not performed on the low wettability substance over the channel protective layer. FIG. 12C shows an example in which a region corresponding to the low wettability region 491 in FIG. 12A is irradiated with light to improve the wettability before forming the insulating layer 478 since the insulating layer 478 covering the thin film transistor 471 is formed by a droplet discharge method.

The channel protective layer 496 may be formed by a droplet discharge method using polyimide, polyvinyl alcohol or the like. As a result, a light exposure step can be omitted. The channel protective layer may be formed of one or more of an inorganic material (silicon oxide, silicon nitride, silicon oxynitride, silicon nitride oxide or the like), a photosensitive or non-photosensitive organic material (an organic resin material such as polyimide, acrylic, polyamide, polyimide amide, benzocyclobutene), a resist, a Low k material which has a low dielectric constant, and the like; a laminated layer of such films; or the like. Additionally, an organic group in which a skeleton is configured by the bond of silicon (Si) and oxygen (O), and which includes at least hydrogen (such as an alkyl group or aromatic hydrocarbon) as a substituent is used. Alternatively, a fluoro group may be used as the substituent. Further alternatively, an organic group containing at least hydrogen and a fluoro group may be used as the substituent. As a manufacturing method, a vapor phase growth method such as a plasma CVD method or a thermal CVD method, or a sputtering method can be used. A droplet discharge method or a printing method (a method for forming a pattern, such as screen printing or offset printing) can also be used. A TOF film or an SOG film obtained by an application method can also be used.

First, the case where light is emitted to the side of the substrate 480 having light-transmitting properties, in other words, bottom emission is performed, will be described with reference to FIG. 12A. In this case, a first electrode 484, an electroluminescent layer 485, and a second electrode 486 are sequentially laminated in contact with a source/drain electrode layer 487 so as to be electrically connected to the thin film transistor 481. Next, the case where light is emitted to the side opposite to a substrate 460 having light-transmitting properties, in other words, top emission is performed, will be described with reference to FIG. 12B. The thin film transistor 461 can be formed in a similar manner to the above described thin film transistor except that it does not have a channel protective layer and parts of the n-type semiconductor layer, the substance including a light-absorbing material, and the semiconductor layer are removed by etching using the source/drain electrode layer as a mask. Thus, with respect to the channel etch thin film transistor 461, parts of the substance including a light-absorbing material used for controllable pattern formation are removed. As to the channel protective thin film transistor 481, in this embodiment mode, the substance including a light-absorbing material over the channel protective layer is not removed, however, it may be removed even in the case of the channel protective type. In addition, only the light-absorbing material which is mixed in the substance including the light-absorbing material may be removed with a solvent or the like as shown in Embodiment Mode 1.

A source/drain electrode layer 462 that is electrically connected to the thin film transistor 461, a first electrode layer 463, an electroluminescent layer 464, a second electrode layer 465 are laminated in order. With the above structure, even if the first electrode layer 463 transmits light, the light is reflected by the source/drain electrode layer 462, and the light is emitted to the side opposite to the side of the substrate 460 having light-transmitting properties. In this structure, the first electrode layer 463 is not required to use a light-transmitting material. Finally, the case where light is emitted from the both side of a substrate 470 having light-transmitting properties and the opposite side thereto, that is the case where dual emission is carried out, will be described with reference to FIG. 12C. The thin film transistor 471 is a channel protective thin film transistor same as the thin film transistor 481. It can be formed like the thin film transistor 481. A source/drain electrode layer 477 that is electrically connected to the thin film transistor 471, a first electrode layer 472, an electroluminescent layer 473, a second electrode layer 474 are laminated in order. In this occasion, when both the first electrode layer 472 and the second electrode layer 474 are formed from materials that has light-transmitting properties or formed thin enough to transmit light, dual emission is realized.

A mode of a light emitting element which is applicable to this embodiment mode is shown in FIGS. 30A to 30D. The light emitting element has a structure in which an electroluminescent layer 860 is interposed between a first electrode layer 870 and a second electrode layer 850. The materials of the first electrode layer and the second electrode layer are required to be selected considering the work functions. The first electrode layer and the second electrode layer can be either an anode or a cathode depending on the pixel structure. In this embodiment mode, a driving TFT has n-channel conductivity, so that it is preferable that the first electrode layer serves as a cathode and the second electrode layer serves as an anode. In the case where the driving TFT has p-channel conductivity, the first electrode layer may be used as an anode and the second electrode layer may be used as a cathode.

Figure 30A:
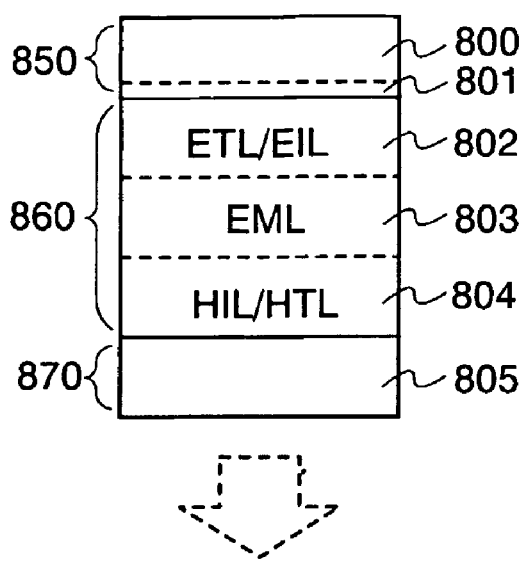
FIGS. 30A to 30D each show a structure of a light emitting element which can be applied to the invention.
Figure 30B:
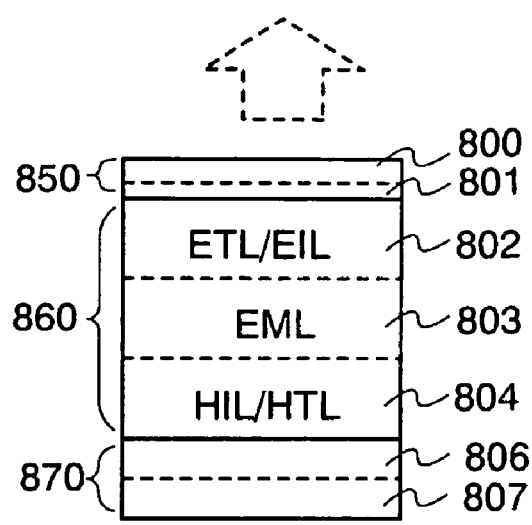

FIGS. 30A and 30B show the case where the first electrode layer 870 is an anode and the second electrode layer 850 is a cathode. The electroluminescent layer 860 preferably has a structure in which an HIL (hole injection layer) and HTL (hole transport layer) 804, EML (light emitting layer) 803, ETL (electron transport layer) and EIL (electron injection layer) 802, and a second electrode layer 850 are laminated in order from the side of the first electrode layer 870. FIG. 30A shows a structure in which light is emitted from the first electrode layer 870 which includes an electrode layer 805 having a light-transmitting conductive oxide material, and the second electrode layer has a structure in which an electrode layer 801 including an alkali metal or an alkaline earth metal such as LiF or MgAg and an electrode layer 800 formed of a metal material such as aluminum are laminated in order from the side of the light emitting layer 860. FIG. 30B shows a structure in which light is emitted from the second electrode layer 850, and the first electrode layer includes an electrode layer 807 formed of a metal such as aluminum or titanium, or a metal material containing such metal and nitrogen of concentration in stoichiometric proportion or less, and a second electrode layer 806 formed of a conductive oxide material containing silicon oxide in a concentration of 1 to 15 atomic %. The second electrode layer includes the electrode layer 801 containing an alkali metal or an alkaline earth metal such as LiF or MgAg and the electrode layer 800 formed of a metal material such as aluminum from the side of the electroluminescent layer 860; each layer is formed to a thickness of 100 nm or less to transmit light; thus, the light can be emitted from the second electrode layer 850.

Figure 30C:
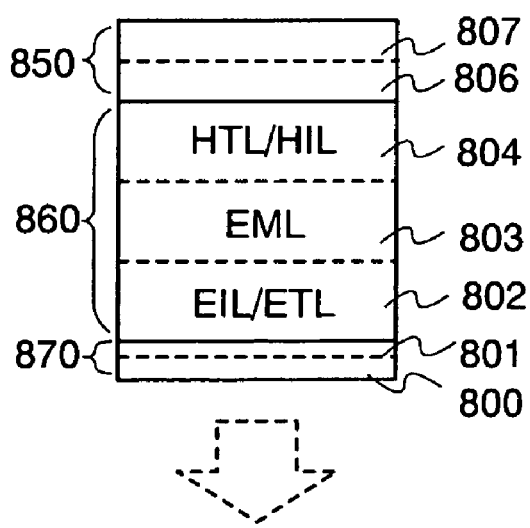
Figure 30D:
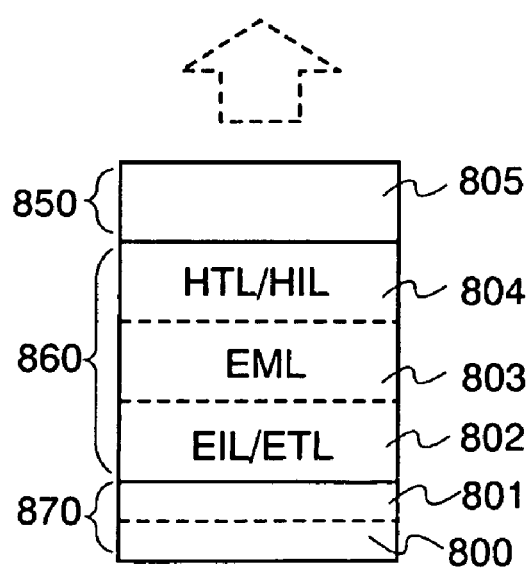

FIGS. 30C and 30D show the case where the first electrode layer 870 is a cathode and the second electrode layer 850 is an anode. The electroluminescent layer 860 preferably has a structure in which an EIL (electron injection layer) and an ETL (electron transport layer) 802, an EML (light emitting layer) 803, an HTL (hole transport layer) and HIL (hole injection layer) 804, and the second electrode layer 850 which is an anode are laminated in order from the cathode side. FIG. 30C shows a structure in which light is emitted from the first electrode layer 870. The first electrode layer 870 includes an electrode layer 801 containing an alkali metal or an alkaline earth metal such as LiF or MgAg and an electrode layer 800 formed of a metal material such as aluminum from the side of the electroluminescent layer 860; each layer is formed to have a thickness of 100 nm or less to transmit light; thus, the light can be emitted through the first electrode layer 870. The second electrode layer includes the second electrode layer 806 formed of a conductive oxide material containing silicon oxide in a concentration of 1 atomic % to 15 atomic % and an electrode layer 807 formed of a metal such as aluminum or titanium, or a metal material containing such metal and nitrogen of concentration in stoichiometric proportion or less, from the side of the electroluminescent layer 860. FIG. 30D shows a structure in which light is emitted from the second electrode layer 850. The first electrode layer 870 includes an electrode layer 801 containing an alkali metal or an alkaline earth metal such as LiF or MgAg and an electrode layer 800 formed of a metal material such as aluminum from the side of the electroluminescent layer 860; the first electrode layer 870 is formed thick enough to reflect the light produced in the electroluminescent layer 860. The second electrode layer 850 includes an electrode layer 805 made of a light-transmitting conductive oxide material. The electroluminescent layer may have a single layer structure or a mixed structure other than a laminated structure.

As the electroluminescent layer, materials each indicates luminescence of red (R), green (G), and blue (B) are selectively formed by an evaporation method using an evaporation mask or the like for each. The materials (low molecular weight materials or high molecular weight materials or the like) each indicates luminescence of red (R), green (G), and blue (B) can be formed by a droplet discharge method in the same manner as a color filter. This case is preferable since RGB can be separately colored without using a mask.

In the case of the top emission type, when ITO or ITSO having light-transmitting properties are used for the second electrode, BzOS—Li in which Li is added to benzoxazole derivatives (BzOS) or the like can be used. Alq$_3$ doped with a dopant corresponding to respective luminescent colors of R, G, and B (DCM or the like in the case of R, and DMQD or the like in the case of G) may be used as the EML, for example.

Note that the electroluminescent layer is not limited to the above-mentioned material. For example, hole injectability can be enhanced by co-evaporating oxide such as molybdenum oxide (MoOX: X=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer. A material for forming a light emitting element is described in detail hereinafter.

As a substance having high electron transportability among charge injection transport substances, for example, a metal complex having a quinoline skeleton or a benzoquinoline skeleton such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato) beryllium (abbreviation: BeBq$_2$), bis(2-methyl-8-quinolinolato)-4-phenylphenolato-aluminum (abbreviation: BAlq), and the like can be given. As a substance having high hole transportability, for example, an aromatic amine compound (in other words, a compound having the bond of benzene ring-nitrogen) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), or 4,4',4"-tris[N-(3-methylphenyl)-N-phenyl-amino]-triphenylamine (abbreviation: MTDATA) can be given.

As a substance having high electron injectability among charge injection transport substances, a compound of an alkali metal or an alkaline earth metal such as lithium fluoride (LiF), cesium fluoride (CsF), or calcium fluoride (CaF$_2$) can be given. In addition to this, it may be a mixture of a substance having high electron transportability such as Alq$_3$ and an alkaline earth metal such as magnesium (Mg).

As a substance having high hole injectability among charge injection transport substances, for example, metal oxide such as molybdenum oxide (MoOx), vanadium oxide (VOx), a ruthenium oxide (RuOx), tungsten oxide (WOx), manganese oxide (MnOx) are given. In addition, a phthalocyanine compound such as phthalocyanine (abbreviation: H$_2$PC) or copper phthalocyanine (CuPC) can be given.

The light emitting layer may have a structure to perform color display by providing each pixel with light emitting layers having different emission wavelength regions. Typically, a light emitting layer corresponding to color of R (red), G (green), and B (blue) is formed. In this instance, color purity can be improved and a pixel portion can be prevented from having a mirror surface (reflection) by providing the light emitting side of the pixel with a filter which transmits light of an emission wavelength region at the light emission side of the pixel. By providing a filter, a circular polarizing light plate or the like that is conventionally required can be omitted, and further, the loss of light emitted from the light emitting layer can be eliminated. Further, change in hue, which occurs when a pixel portion (display screen) is obliquely seen, can be reduced.

Various materials can be used for a light emitting material. As a low molecular weight organic light emitting material, 4-dicyanomethylene-2-methyl-6-[2-(1,1,7,7-tetramethyljulolidine-9-yl)ethenyl]-4H-pyran; (abbreviation: DCJT); 4-dicyanomethylene-2-t-butyl-6-[2-(1,1,7,7-tetramethyljulolidine-9-yl)-ethenyl]-4H-pyran; (abbreviation: DCJTB); Periflanthene; 2,5-dicyano-1,4-bis[2-(10-methoxy-1,1,7,7-tetramethyljulolidine-9-yl)ethenyl]benzene; N,N'-dimethylquinacridon (abbreviation: DMQd); coumarin 6; coumarin 545T; tris(8-quinolinolato)aluminum (abbreviation: Alq$_3$); 9.9'-bianthryl; 9,10-diphenylanthracene (abbreviation: DPA); 9,10-bis(2-naphthyl)anthracene (abbreviation: DNA); and the like can be used. Another substance can also be used.

On the other hand, a high molecular weight organic light emitting material is physically stronger than a low molecular weight material and is superior in durability of the element. In addition, a high molecular weight organic light emitting material can be formed by application, and therefore, the element can be relatively easily manufactured. The structure of a light emitting element using a high molecular weight organic light emitting material has basically the same structure as in the case of using a low molecular weight organic light emitting material, that is, a cathode, an organic light emitting layer, and an anode are laminated in order. However, a two-layer structure is employed in many cases when a light emitting layer using a high molecular weight organic light emitting material is formed. This is because it is difficult to form such a laminated structure as in the case of using a low molecular weight organic light emitting material. Specifically, the light emitting element using a high molecular weight organic light emitting material has a structure of a cathode, a light emitting layer, a hole transport layer, and an anode in order.

An emission color is determined depending on a material forming a light emitting layer; therefore, a light emitting element which indicates desired luminescence can be formed by selecting an appropriate material of the light emitting layer. As a high molecular weight electroluminescent material which can be used for forming a light emitting layer, a polyparaphenylene-vinylene-based material, a polyparaphenylene-based material, a polythiophene-based material, a polyfluorene-based material can be given.

As the polyparaphenylene vinylene-based material, a derivative of poly(paraphenylenevinylene) [PPV], for example, poly(2,5-dialkoxy-1,4-phenylenevinylene) [RO-PPV]; poly(2-(2'-ethyl-hexoxy)-5-methoxy-1,4-phenylenevinylene) [MEH-PPV]; poly(2-(dialkoxyphenyl)-1,4-phenylenevinylene) [ROPh-PPV]; and the like can be given. As the polyparaphenylene-based material, a derivative of polyparaphenylene [PPP], for example, poly(2,5-dialkoxy-1,4-phenylene) [RO-PPP]; poly(2,5-dihexoxy-1,4-phenylene); and the like can be given. As the polythiophene-based material, a derivative of a derivative of polythiophene [PT], for example, poly(3-alkylthiophene) [PAT]; poly(3-hexylthiophen) [PHT]; poly(3-cyclohexylthiophen) [PCHT]; poly (3-cyclohexyl-4-methylthiophene) [PCHMT]; poly(3,4-dicyclohexylthiophene) [PDCHT]; poly[3-(4-octylphenyl)-thiophene] [POPT]; poly[3-(4-octylphenyl)-2,2-bithiophene] [PTOPT]; and the like can be given. As the polyfluorene-based material, a derivative of polyfluorene [PF], for example, poly(9,9-dialkylfluorene) [PDAF]; poly(9, 9-dioctylfluorene) [PDOF]; and the like can be given.

When a high molecular weight organic light emitting material having hole transportability is interposed between an anode and a high molecular weight organic light emitting material having light emitting properties, hole injectability from the anode can be enhanced. Generally, the high molecular weight organic light emitting material having hole transportability which is dissolved in water along with an acceptor material is applied by a spin coating method or the like. In addition, the high molecular weight light emitting material having hole injectability is insoluble in an organic solvent; therefore, it can be laminated over the above-mentioned high molecular weight organic light emitting material having light emitting properties. As the high molecular weight organic light emitting material having hole transportability, a mixture of PEDOT and camphor sulfonic acid (CSA) that serves as an acceptor material, a mixture of polyaniline [PANI] and polystyrene sulfonic acid [PSS] that serves as an acceptor material, and the like can be given.

The light emitting layer can be made to emit plain color or white light. When a white light emitting material is used, color display can be made possible by applying a structure in which a filter (a coloring layer) which transmits light having a specific wavelength on the light emitting side of a pixel is provided.

In order to form a light emitting layer that emits white light, for example, $Alq_3$, $Alq_3$ partly doped with Nile red that is a red light emitting pigment, $Alq_3$, p-EtTAZ, TPD (aromatic diamine) are laminated sequentially by a vapor deposition method to obtain white light. In the case that the light emitting layer is formed by an application method using spin coating, the layer formed by spin coating is preferably baked by vacuum heating. For example, an aqueous solution of poly (ethylene dioxythiophene)/poly(styrene sulfonic acid) solution (PEDOT/PSS) may be entirely applied and baked to form a film that functions as a hole injection layer. Then, a polyvinyl carbazole (PVK) solution doped with a luminescent center pigment (1,1,4,4-tetraphenyl-1,3-butadiene (TPB); 4-dicyanomethylene-2-methyl-6-(p-dimethylamino-styryl)-4H-pyran (DCM1); Nile red; coumarin 6; or the like) may be entirely applied and baked to form a film that functions as a light emitting layer.

The light emitting layer may be formed to be a single layer. For example, a 1,3,4-oxadiazole derivative (PBD) having electron transportability may be dispersed in polyvinyl carbazole (PVK) having hole transportability. Further, white light emission can be obtained by dispersing PBD of 30 wt % as an electron transporting agent and dispersing an appropriate amount of four kinds of pigments (TPB, coumarin 6, DCM1, and Nile red). In addition to the light emitting element from which white light emission can be obtained as shown here, a light emitting element which can provide red light emission, green light emission, or blue light emission can be manufactured by appropriately selecting materials of the light emitting layer.

Further, a triplet excitation material containing a metal complex or the like as well as a singlet excitation light emitting material may be used for the light emitting layer. For example, among pixels emitting red, green, and blue light, a pixel emitting red light whose luminance is reduced by half in a relatively short time is formed of a triplet excitation light emitting material and the rest are formed of a singlet excitation light emitting material. A triplet excitation light emitting material has a characteristic that the material has a good luminous efficiency and consumes less power to obtain the same luminance. When a triplet excitation light emitting material is used for a red pixel, only small amount of current needs to be applied to a light emitting element. Thus, reliability can be improved. A pixel emitting red light and a pixel emitting green light may be formed of a triplet excitation light emitting material and a pixel emitting blue light may be formed of a singlet excitation light emitting material to achieve low power consumption. Low power consumption can be further achieved by forming a light emitting element which emits green light to which the human eye has high visibility with a triplet excitation light emitting material.

A metal complex used as a dopant is an example of a triplet excitation light emitting material, and a metal complex having platinum that is a third transition series element as a central metal, a metal complex having iridium as a central metal, and the like are known. A triplet excitation light emitting material is not limited to the compounds. A compound having the above described structure and an element belonging to any of the Groups 8 to 10 of the periodic table as a central metal can also be used.

The above described materials for forming the light emitting layer are just examples. A light emitting element can be formed by appropriately laminating functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode layer for the purpose or providing a dispersed light emitting material is acceptable as long as it does not deviate from the scope of the invention.

A light emitting element formed with the above described materials emits light by being biased in a forward direction. A pixel of a display device formed with a light emitting element can be driven by a simple matrix mode or an active matrix mode as shown in Embodiment Mode 2. In any event, each pixel emits light by applying a forward bias thereto in specific timing; however, the pixel is in a non-light-emitting state for a certain period. The reliability of a light emitting element can be improved by applying a backward bias at this non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of the deterioration can be slowed down by alternating current driving. Thus, reliability of a light emitting device can be improved. Additionally, both of digital driving and analog driving can be applied.

Figure 12B:
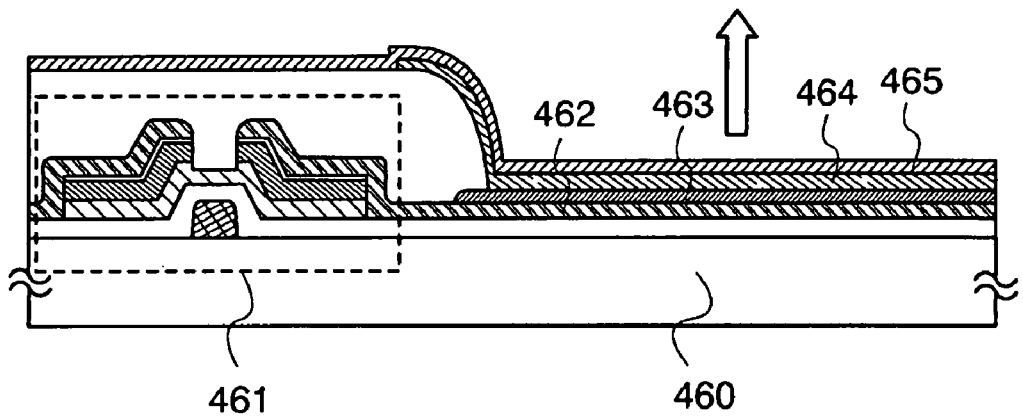
Figure 12C:
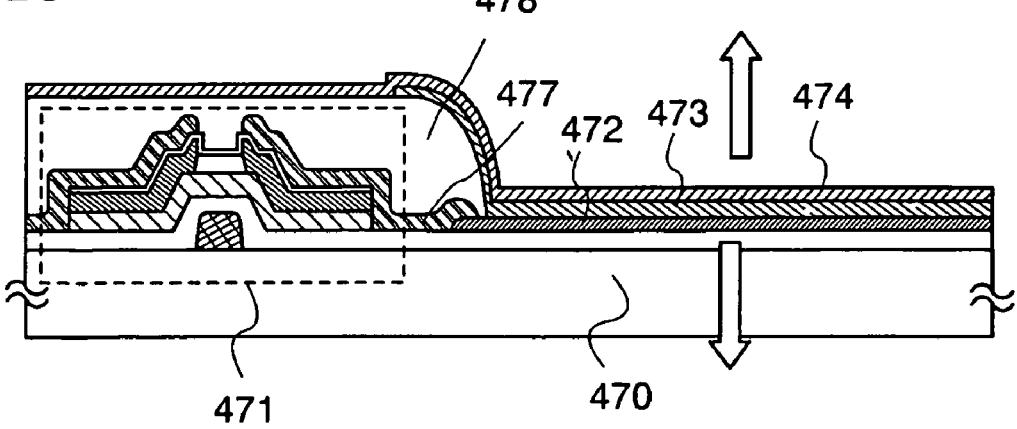

A color filter (coloring layer) may be formed over a sealing substrate of the substrate 480 having light-transmitting properties although it is not shown in FIGS. 12A to 12C. The color filter (coloring layer) can be formed by a droplet discharge method, and in this case, light irradiation treatment can be applied as the above-mentioned base pretreatment. According to the invention, a color filter (coloring layer) can be formed to have a desired pattern with preferable controllability. With the use of a color filter (coloring layer), high-definition display can also be performed. This is because a broad peak can be modified to be sharp in light emitting spectrum of each RGB with a color filter (coloring layer).

As described above, the case where a material indicating luminescence of R, G, and B is shown, however, full color display can be performed by forming a material indicating a monochrome color and combining a color filter and a color conversion layer. The color filter (coloring layer) or the color conversion layer is formed over, for example, a second substrate (a sealing substrate) and may be attached to a substrate. As described above, any of the material indicating a monochrome color, the color filter (coloring layer), and the color conversion layer can be formed by a droplet discharge method.

Naturally, a monochrome color may be displayed. For example, a display device having an area color type may be manufactured by using monochrome color emission. A passive matrix type display portion is suitable for the area color type, and a letter or a signal can be mainly displayed.

In the above-mentioned structure, it is possible to use a material having a low work function as a cathode, and for example, Ca, Al, CaF, MgAg, AlLi, or the like is desirable. Any of a single layer type, a laminated layer type, a mixed type having no interface of layers can be used for the electroluminescent layer. The electroluminescent layer may be formed by a singlet material, a triplet material, or a material in which the materials are mixed; or a charge injection transport substance and a light emitting material including an organic compound or an inorganic compound, which includes one layer or plural layers of a low molecular weight organic compound material, a middle molecular weight organic compound (which means an organic compound having no sublimation properties, and the number of molecules is 20 or less or the length of linked molecules is 10 μm or less), and a high molecular weight organic compound, and may be combined with an electron injection transport inorganic compound or a hole injection transport inorganic compound. The first electrode 484, the first electrode 463, and the first electrode 472 are formed by using a transparent conductive film which transmits light, and for example, a transparent conductive film in which zinc oxide (ZnO) of 2% to 20% is mixed in indium oxide is used in addition to ITSO or ITSO. Plasma treatment or heat treatment in vacuum atmosphere may be preferably performed before forming the first electrode 484, the first electrode 463, and the first electrode 472. The partition wall (also referred to as a bank) is formed by using a material containing silicon, an organic material or a compound material. Additionally, a porous film may be used. However, when a photosensitive material or a non-photosensitive material such as acrylic or polyimide is used to form, the side face thereof has a shape in which a radius curvature changes continuously and a disconnection due to a step is not generated in an upper layer thin film; therefore, it is preferable. This embodiment mode can be freely combined with the above-mentioned embodiment modes.

Embodiment Mode 5

In a display panel manufactured according to Embodiment Modes 4 to 6, as explained in FIG. 14B, a scanning line driver circuit can be formed over the substrate 3700 by forming a semiconductor layer with a SAS.

Figure 25:
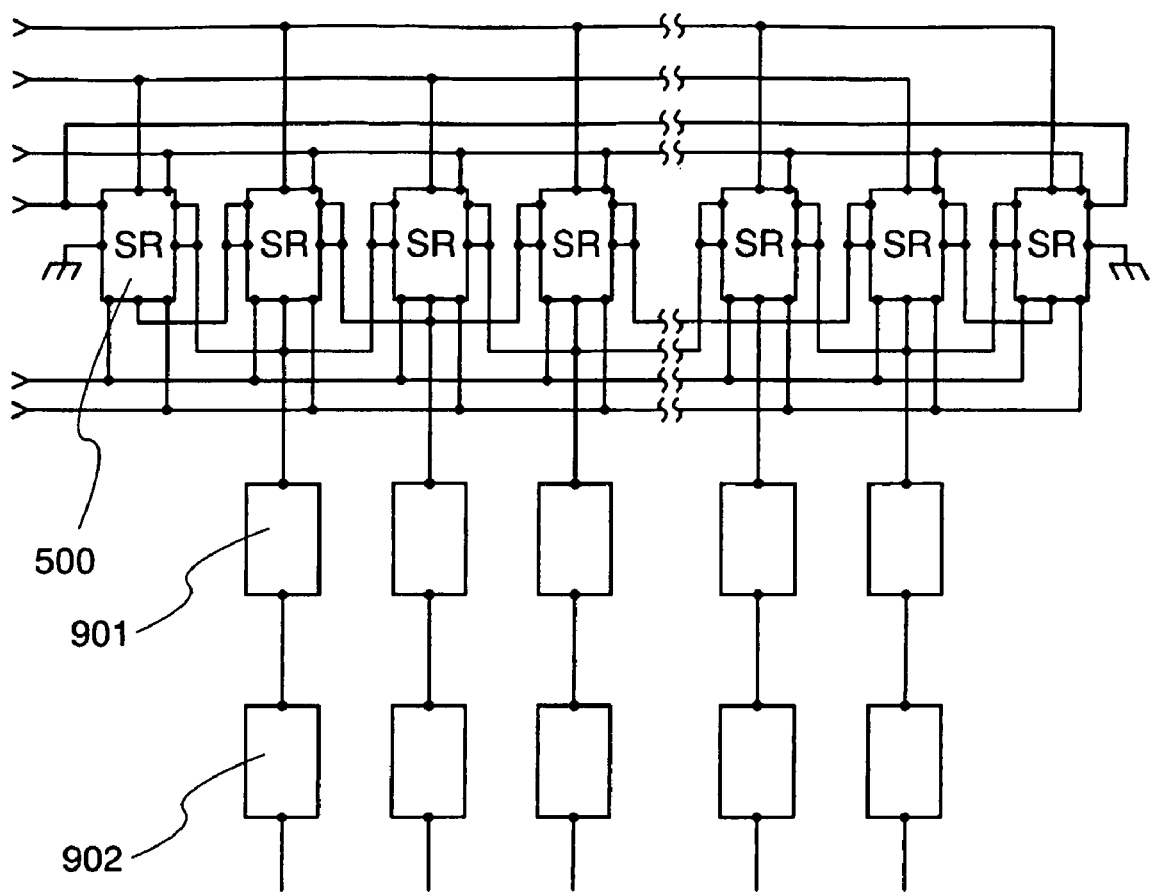
FIG. 25 is a view describing a circuit structure when a scanning line driver circuit is formed of a TFT in an EL display panel according to a certain aspect of the invention.

FIG. 25 shows a block diagram of the scanning line driver circuit including n-channel type TFTs using a SAS in which electric field effect mobility of from 1 $cm^2$/V·sec to 15 $cm^2$/V·sec can be obtained.

In FIG. 25, a block 500 corresponds to a pulse output circuit outputting a sampling pulse for one stage and a shift register includes n pulse outputting circuits. Reference numeral 901 denotes a buffer circuit and connected to a pixel 902.

Figure 26:
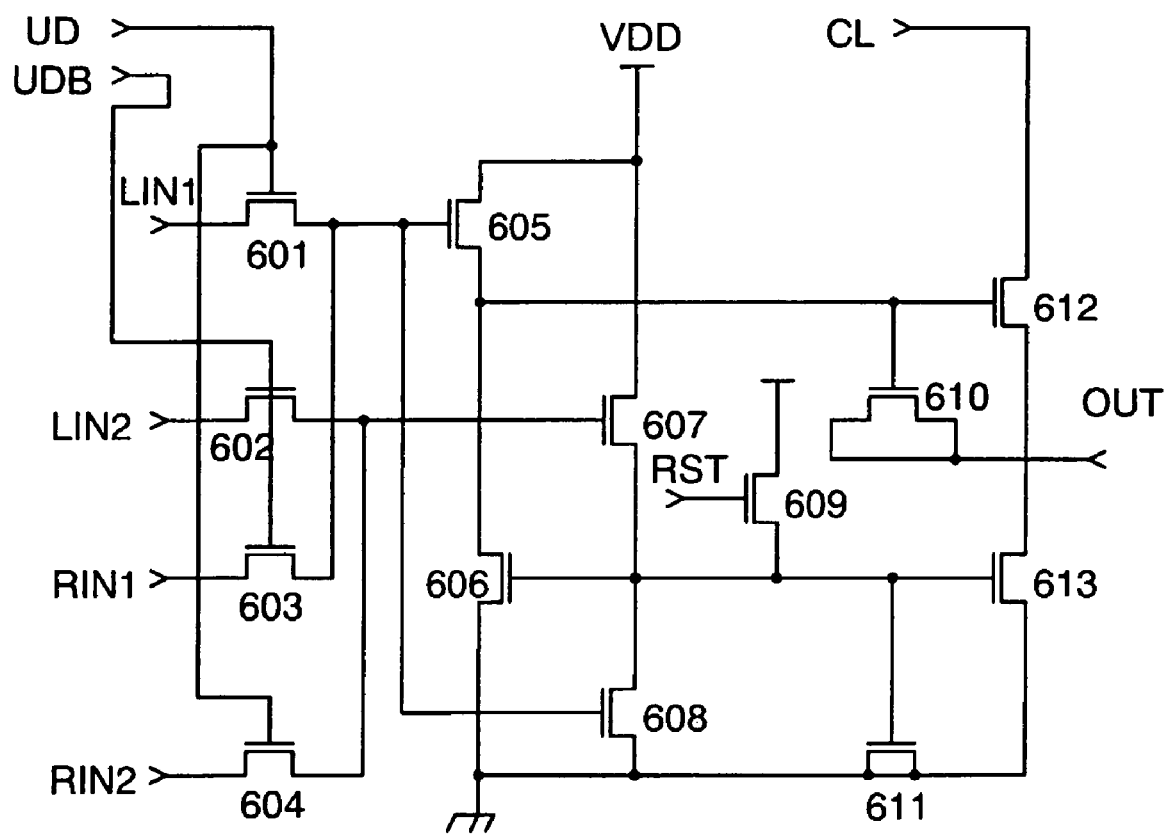
FIG. 26 is a diagram describing a circuit structure when a scanning line driver circuit is formed of a TFT in an EL display panel according to a certain aspect of the invention (a shift register circuit)

FIG. 26 shows a specific structure of the pulse output circuit shown by the block 500, and this pulse output circuit 500 includes n-channel type TFTs 601 to 613. The size of the TFTs may be decided in consideration of the operating characteristics of the n-channel type TFTs using a SAS. For example, when a channel length is set to be 8 μm, the channel width can be set ranging from 10 μm to 80 μm.

Figure 27:
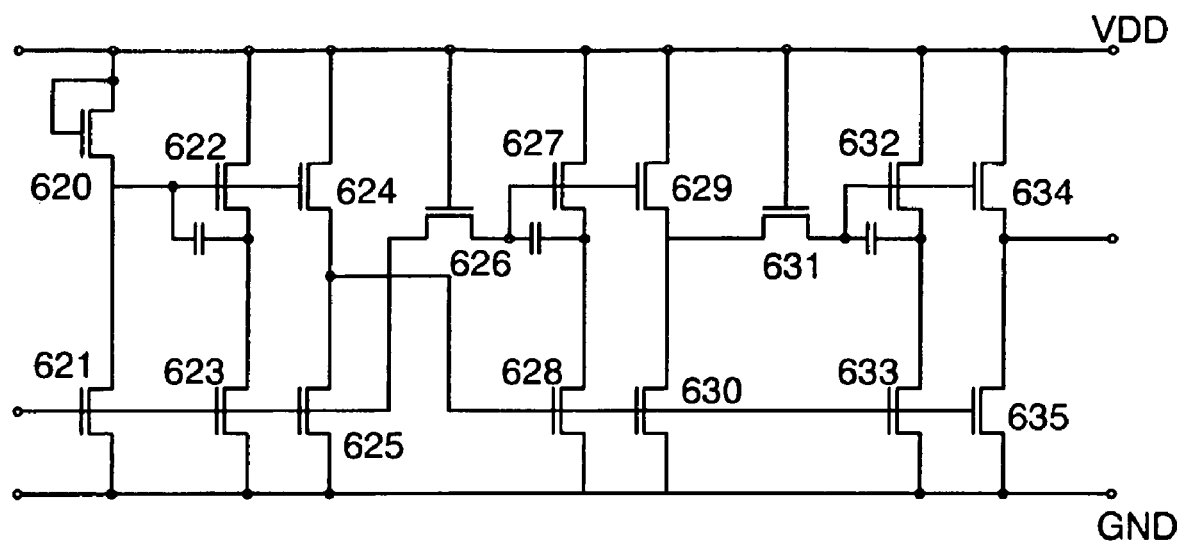
FIG. 27 is a diagram describing a circuit structure when a scanning line driver circuit is formed of a TFT in an EL display panel according to a certain aspect of the invention (a buffer circuit)

In addition, FIG. 27 shows a specific structure of the buffer circuit 901. The buffer circuit includes n-channel type TFTs 620 to 635 in the same manner. At this time, the size of the TFTs may be decided in consideration of the operating characteristics of the n-channel type TFTs using a SAS. For example, when a channel length is set to be 10 μm, the channel width can be set ranging from 10 μm to 1800 μm. According to the present invention, a pattern can be formed to have a desired shape with preferable controllability; therefore, a minute wiring like this having a channel width of 10 μm can be stably formed without a defect such as a short-circuit.

Figure 16:
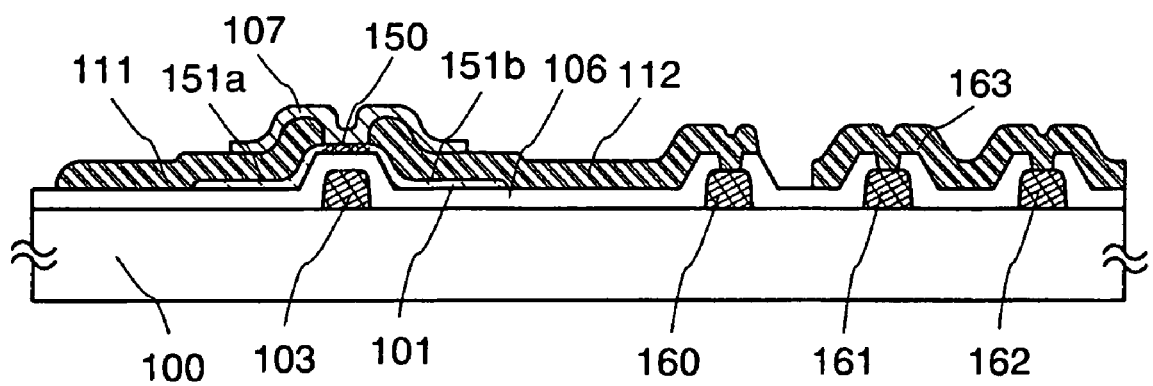
FIG. 16 is a view describing a method for manufacturing a display device according to a certain aspect of the invention.

It is necessary to connect the TFTs with one another with wirings to realize such a circuit, and FIG. 16 shows a structural example of wirings of the case. As well as in Embodiment Mode 2, FIG. 16 shows a state in which a gate electrode layer 103, a gate insulating layer 106 (a lamination body of three layers including an insulating layer containing silicon nitride, an insulating layer containing silicon oxide, and an insulating layer containing silicon nitride in this embodiment mode), a semiconductor layer 107 formed of an organic semiconductor, and source/drain electrode layers 111 and 112 are formed. In this embodiment mode, a substance 101 including a light-absorbing material is formed over the gate insulating layer 106; the formation region of the source/drain electrode layers 111 and 112 is modified by being irradiated with light from the side of the 100 having light-transmitting properties using the gate electrode layer 103 as a mask. In this embodiment mode, wettability is controlled as modification treatment. The surface of the substance including a light-absorbing material is modified and a low-wettability region 150, high-wettability regions 151a and 151b having comparatively different wettability are formed. A compound including a conductive material is discharged to the high wettability regions 151*a* and 151*b*, so that the source/drain electrode layers 111 and 112 can be formed with preferable controllability.

In Embodiment Mode 2, since the semiconductor layer 107 is formed by a droplet discharge method, the substance including a light-absorbing material formed over the low-wettability region 150 is also irradiated with light to enhance the wettability. However, in this embodiment mode, the semiconductor layer 107 is formed by a vacuum deposition method using pentacene which is an organic semiconductor; therefore, the step of controlling the wettability of the low wettability region 150 is not required. Further, the semiconductor layer 107 may be formed by a droplet discharge method or the like using the compound in liquid form if the surface to be provided with a compound has enough wettability with respect to the compound. In this embodiment mode, the low wettability region 150, the high wettability regions 151*a* and 151*b* are named for convenience depending on relative wettability difference with respect to the compound containing a conductive material for forming the source electrode layer or the drain electrode layer. Accordingly, even when the formation region of the semiconductor layer displays low wettability with respect to the compound containing a conductive material for forming the source electrode layer or the drain electrode layer, it is possible that the formation region does not display low wettability with respect to the compound for forming the semiconductor layer 107. In such a case, the step of controlling the wettability of the formation region of the semiconductor layer 107 is not required.

Connection wiring layers 160, 161, and 162 are formed over a substrate 100 through the same steps as the gate electrode layer 104. A part of a gate insulating layer is etched so that the connection wiring layers 160, 161, and 162 are exposed, and TFTs are appropriately connected with the use of the source/drain electrode layers 111 and 112, and a connection wiring layer 163 formed in the same step; thus, various circuits can be realized.

Embodiment Mode 6

A mode of mounting a driver circuit on a display panel manufactured according to Embodiment Modes 4 to 7 is described.

First, a display device employing a COG method is described with reference to FIG. 15A. A pixel portion 2701 for displaying information on characters, images or the like is provided over a substrate 2700. A substrate provided with a plurality of driver circuits is divided into rectangles, and the divided driver circuits (hereinafter referred to as a driver IC) 2751 are mounted on the substrate 2700. FIG. 15A shows a mode of mounting a plurality of driver ICs 2751 and an FPC 2750 on the end of the driver ICs 2751. In addition, a divided size may be made almost the same as the length of a side of a pixel portion on a signal line side, and a tape may be mounted on the end of a singular driver IC.

A TAB method may be adopted. In that case, a plurality of tapes may be attached and driver ICs may be mounted on the tape. Similarly to the case of a COG method, a singular driver IC may be mounted on a singular tapes. In that case, a metal piece or the like for fixing the driver IC may be attached together in terms of the matter of intensity.

A plurality of the driver ICs to be mounted on a display panel is preferably formed over the rectangular substrate having a side of from 300 mm to 1000 mm or more in terms of improving productivity.

In other words, a plurality of circuit patterns including a driver circuit portion and an input-output terminal as a unit is formed over the substrate, and may be lastly divided and taken out. In consideration of a side length of the pixel portion and the pixel pitch, the driver IC may be formed to be a rectangle having a long side of from 15 mm to 80 mm and a short side of from 1 mm to 6 mm. Alternatively; the driver IC may be formed to have the long side length of a side length of the pixel portion, or the long side length of adding the pixel portion to a side length of each driver circuit.

An advantage of the external dimension over an IC chip of a driver IC is the length of a long side. When a driver IC having a long side of from 15 mm to 80 mm is used, the number necessary for mounting in accordance with the pixel portion is less than that in the case of using an IC chip. Therefore, a yield in manufacturing can be improved. When a driver IC is formed over a glass substrate, productivity is not harmed, without limitation due to the shape of a substrate used as a mother body. This is a great advantage compared with the case of taking IC chips out of a circular silicon wafer.

When a scanning line, driver circuit 3702 is integrally formed over the substrate as shown in FIG. 14B, the driver IC provided with a signal line driver circuit is mounted on a region outside the pixel portion 3701. The driver IC is a signal line side driver circuit. In order to form a pixel portion corresponding to RGB full color, 3072 signal lines are required for an XGA class and 4800 signal lines are required for a UXGA class. The signal lines formed in such a number are divided into several blocks on an edge portion of the pixel portion 3701 and are provided with a lead line. The signal lines are gathered in relation to pitches of output terminals of the driver IC.

The driver IC is preferably formed of a crystalline semiconductor formed over a substrate. The crystalline semiconductor is preferably formed by being irradiated with continuous wave laser light. Therefore, a continuous wave solid laser or gas laser is used as an oscillator for generating the laser light. There are few crystal defects when a continuous wave laser is used, and as a result, a transistor can be formed by using a polycrystalline semiconductor layer with a large grain size. In addition, high-speed driving is possible since mobility or response speed is favorable, and it is possible to further improve an operating frequency of an element than that of the conventional element. Therefore, high reliability can be obtained since there are few characteristics variations. Note that the channel-length direction of a transistor and a scanning direction of laser light may be directed in the same direction to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous wave laser. The channel length direction coincides with the flowing direction of a current, in other words, a direction in which an electric charge moves in a channel formation region. The thus manufactured transistor has an active layer including a polycrystalline semiconductor layer in which a crystal grain is extended in the channel direction, and this means that a crystal grain boundary is formed almost along the channel direction.

In order to perform laser crystallization, it is preferable to largely narrow down the laser light, and the beam spot thereof preferably has the same width as that of a short side of the driver ICs, approximately from 1 mm to 3 mm. In addition, in order to secure an enough and effective energy density for an object to be irradiated, an irradiation region of the laser light is preferably in a linear shape. As used herein, the term "linear" refers to not a line in a strict sense but a rectangle or an oblong with a large aspect ratio. For example, the linear shape refers to a rectangle or an oblong with an aspect ratio of 2 or more (preferably from 10 to 10000). Thus, it is possible to provide a method for manufacturing a display device in which productivity is improved by making a beam spot width of the laser light and that of a short side of the driver ICs to have the same length.

As shown in FIGS. 15A and 15B, driver ICs may be mounted as both a scanning line driver circuit and a signal line driver circuit. In this case, it is preferable to differentiate specifications of the scanning line driver circuit and the signal line driver circuit.

In the pixel portion, the signal line and the scanning line intersect to form a matrix and a transistor is arranged in accordance with each intersection. A TFT having an amorphous semiconductor or a semi-amorphous semiconductor as a channel portion is used as the transistor arranged in the pixel portion in the present invention. The amorphous semiconductor is formed by a method such as a plasma CVD method or a sputtering method. It is possible to form the semi-amorphous semiconductor at temperatures of 300° C. or less by a plasma CVD method. A film thickness necessary to form a transistor is formed in a short time even in the case of a non-alkaline glass substrate of an external size of, for example, 550 mm×650 mm. The feature of such a manufacturing technique is effective in manufacturing a large-area display device. In addition, a semi-amorphous TFT can obtain field effect mobility of from 2 $cm^2/V \cdot sec$ to 10 $cm^2/V \cdot sec$ by forming a channel formation region of a SAS. When the invention is applied, a minute wiring having a short channel width can be stably formed without causing a defect such as a short-circuit since a pattern can be formed to have a desired shape with preferable controllability. Accordingly, TFT having electric characteristics required to function a pixel sufficiently can be formed. Therefore, this TFT can be used as a switching element of pixels and as an element constituting the scanning line driver circuit. Thus, a display panel in which system-on-panel is realized can be manufactured.

The scanning line driver circuit is also integrally formed over the substrate by using a TFT having a semiconductor layer formed of a semi-amorphous semiconductor (SAS). In the case of using a TFT having a semiconductor layer formed of an amorphous semiconductor (AS), a driver IC may be mounted as both the scanning line driver circuit and the signal line driver circuit.

In that case, it is preferable to differentiate specifications of the driver ICs to be used on the scanning line and on the signal line. For example, a transistor constituting the scanning line side driver ICs is required to withstand a voltage of approximately 30 V, however, a drive frequency is 100 kHz or less and high-speed operation is not comparatively required. Therefore, it is preferable to set a channel-length (L) of the transistor included in the scanning line driver sufficiently long. On the other hand, a transistor of the signal line driver ICs is required to withstand a voltage of only approximately 12 V, however, a drive frequency is around 65 MHz at 3 V and high-speed operation is required. Therefore, it is preferable to set a channel-length or the like of the transistor included in a driver with a micron rule. According to the invention, a minute pattern can be formed with preferable controllability; therefore, the invention can correspond to such a micron rule sufficiently.

A method for mounting a driver IC is not particularly limited and a known method such as a COG method, a wire bonding method, or a TAB method can be employed.

The heights of the driver IC and the counter substrate can be made almost the same by forming the driver IC to have the same thickness as that of the counter substrate, which contributes to thinning a display device as a whole. When both substrates are formed of the identical material, thermal stress is not generated and characteristics of a circuit including a TFT are not harmed even when temperature change is generated in the display device. Furthermore, the number of driver ICs to be mounted on one pixel portion can be reduced by mounting a longer driver IC than an IC chip as a driver circuit as described in this embodiment mode.

As described above, a driver circuit can be incorporated in a display panel.

Embodiment Mode 7

A structure of a pixel of a display panel shown in this embodiment is described with reference to equivalent circuit diagrams shown in FIGS. 17A to 17F.

Figure 17A:
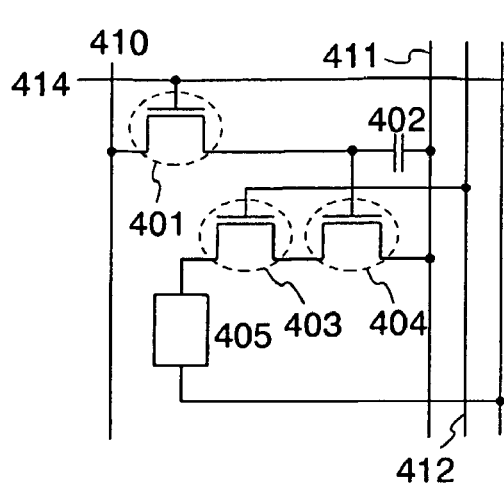
FIGS. 17A to 17F are circuit diagrams describing a structure of a pixel which is applicable to an EL display panel according to a certain aspect of the invention.

In a pixel shown in FIG. 17A, a signal line 410 and power supply lines 411 to 413 are arranged in columns, and a scanning line 414 is arranged in a row. The pixel also includes a switching TFT 401, a driving TFT 403, a current controlling TFT 404, a capacitor element 402, and a light-emitting element 405.

Figure 17B:
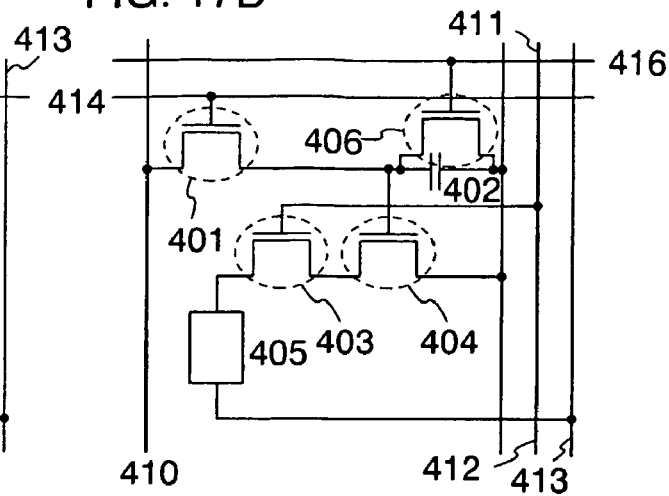
Figure 17C:
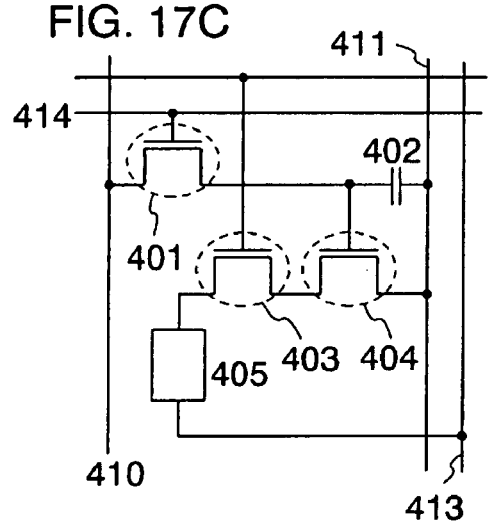
Figure 17D:
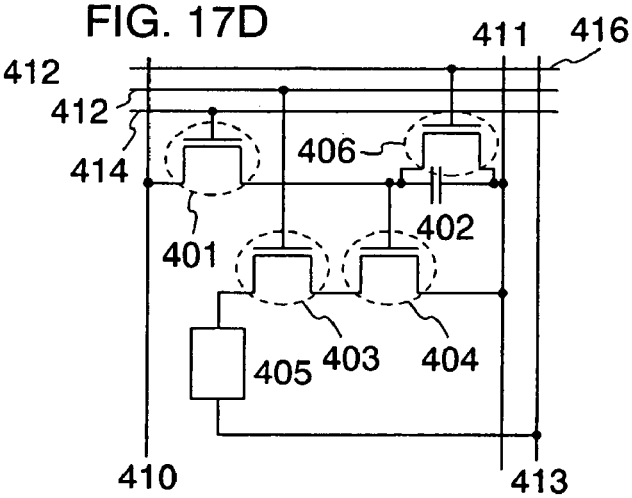

A pixel shown in FIG. 17C has the same structure as the one shown in FIG. 17A, except that a gate electrode of the driving TFT 403 is connected to the power supply line 412 arranged in a row. Both pixels in FIGS. 17A and 17C show the same equivalent circuit diagrams. However, each power supply line is formed of conductive layers in different layers in between the cases where the power supply line 412 is arranged in a column (FIG. 17A) and where the power supply line 412 is arranged in a row (FIG. 17C). The two pixels are each shown in FIGS. 17A and 17C in order to show that layers in which a wiring connected to the gate electrode of the driving TFT 403 is formed are different in between FIGS. 17A and 17C.

In both FIGS. 17A and 17C, the TFTs 403 and 404 are connected in series in the pixel, and the ratio of the channel length $L_3$/the channel width $W_3$ of the TFT 403 to the channel length $L_4$/the channel width $W_4$ of the TFT 404 is set as $L_3/W_3:L_4/W_4=5$ to 6000:1. In the case when $L_3$, $W_3$, $L_4$, and $W_4$ are 500 μm, 3 μm, 3 μm, and 100 μm, respectively, can be given as an example. According to the present invention, such a minute wiring having a short channel width can be stably formed without causing a defect such as a short-circuit since a pattern can be formed to have a desired shape with preferable controllability. Hence, a TFT having electric characteristics required for satisfactorily functioning such pixels shown in FIGS. 17A and 17C can be formed. As a result, a highly reliable display panel superior in display capability can be manufactured.

The TFT 403 is operated in a saturation region and controls the amount of current flowing in the light emitting element 405, whereas the TFT 404 is operated in a linear region and controls a current supplied to the light emitting element 405. The TFTs 403 and 404 preferably have the same conductivity in view of the manufacturing process. For the driving TFT 403, a depletion type TFT may be used instead of an enhancement type TFT. According to the invention having the above structure, slight variations in $V_{GS}$ of the TFT 404 does not affect the amount of current flowing in the light emitting element 405, since the current controlling TFT 404 is operated in a linear region. That is, the amount of current flowing in the light emitting element 405 is determined by the TFT 403 operated in a saturation region. Accordingly, it is possible to provide a display device in which image quality is improved by improving variations in luminance of the light emitting element due to the variation of the TFT properties.

The TFTs 401 of pixels shown in FIGS. 17A to 17D controls a video signal input to the pixel. When the switching TFT 401 is turned ON and a video signal is input to the pixel, the video signal is held in the capacitor element 402. Although the pixel includes the capacitor element 402 in FIGS. 17A and 17C, the invention is not limited thereto. When a gate capacitance or the like can serve as a capacitor for holding a video signal, the capacitor element 402 is not necessarily provided.

The light emitting element 405 has a structure in which an electroluminescent layer is sandwiched between a pair of electrodes. A pixel electrode and a counter electrode (an anode and a cathode) have a potential difference therebetween so that a forward bias voltage is applied. The electroluminescent layer is formed of wide range of materials such as an organic material, an inorganic material. The luminescence in the electroluminescent layer includes luminescence that is generated when an excited singlet state returns to a ground state (fluorescence) and luminescence that is generated when an exited triplet state returns to a ground state (phosphorescence).

A pixel shown in FIG. 17B has the same pixel structure as the one shown in FIG. 17A, except that a TFT 406 and a scanning line 416 are added. Similarly, a pixel shown in FIG. 17D has the same structure as the one shown in FIG. 17C, except that a TFT 406 and a scanning line 416 are added.

The TFT 406 is controlled to be ON/OFF by the added scanning line 416. When the TFT 406 is turned ON, charges held in the capacitor element 402 are discharged, thereby turning the TFT 404 OFF. That is, supply of a current to the light emitting element 405 can be forcibly stopped by providing the TFT 406. Therefore, a lighting period can start simultaneously with or shortly after a writing period starts before signals are written into all the pixels by adopting the structures shown in FIGS. 17B and 17D, thus, the duty ratio can be improved.

Figure 17E:
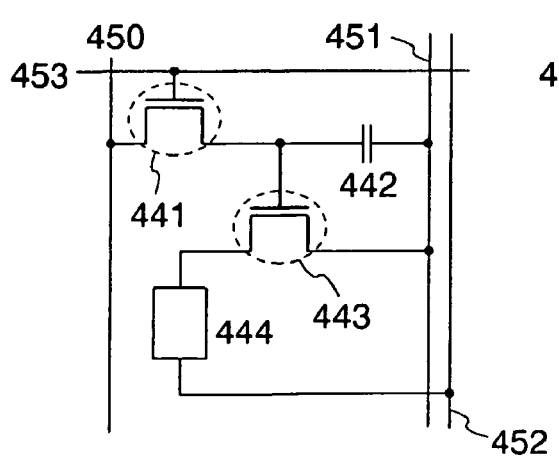
Figure 17F:
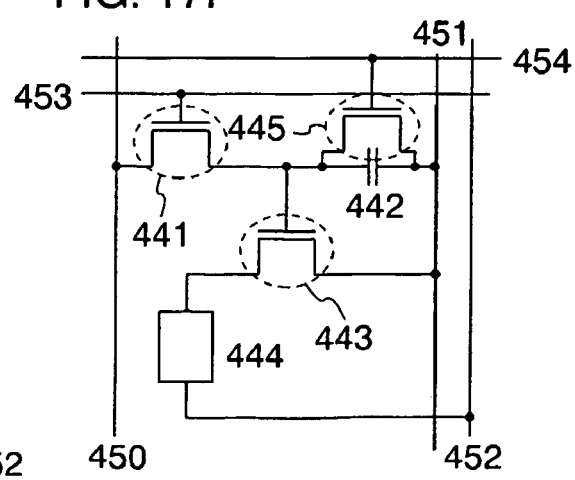

In a pixel shown in FIG. 17E, a signal line 450 and power supply lines 451 and 452 are arranged in columns, and a scanning line 453 is arranged in a row. The pixel further includes a switching TFT 441, a driving TFT 443, a capacitor element 442, and a light emitting element 444. A pixel shown in FIG. 17F has the same pixel structure as the one shown in FIG. 17E, except that a TFT 445 and a scanning line 454 are added. It is to be noted that the structure of FIG. 17F also allows a duty ratio to be improved by providing the TFT 445.

As described above, according to the invention, a pattern of a wiring or the like can be stably formed with preferable controllability without a formation defect. Therefore, a TFT can be provided with high electric characteristics and reliability, and the invention can satisfactorily be used for an applied technique for improving display capacity of a pixel in accordance with the intended use.

Embodiment Mode 8

Figure 24:
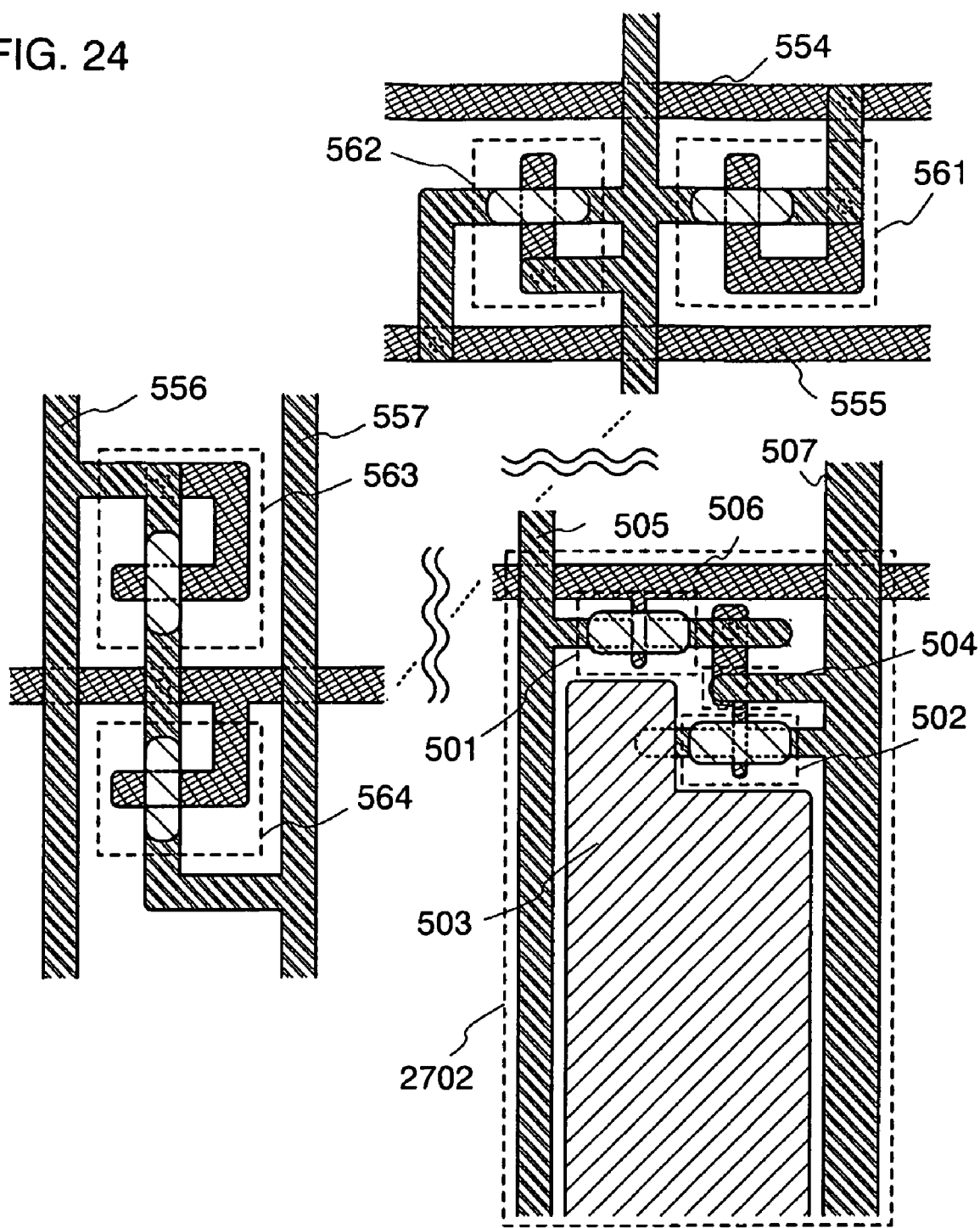
FIG. 24 is a top view describing an EL display panel according to a certain aspect of the invention.

One mode in which protective diodes are provided for a scanning line input terminal portion and a signal line input terminal portion is explained with reference to FIG. 24. TFTs 501 and 502, a capacitor 504, and a light emitting element 503 are provided for a pixel 2702 in FIG. 24. This TFT has the same structure as that in Embodiment Mode 2.

Figure 23:
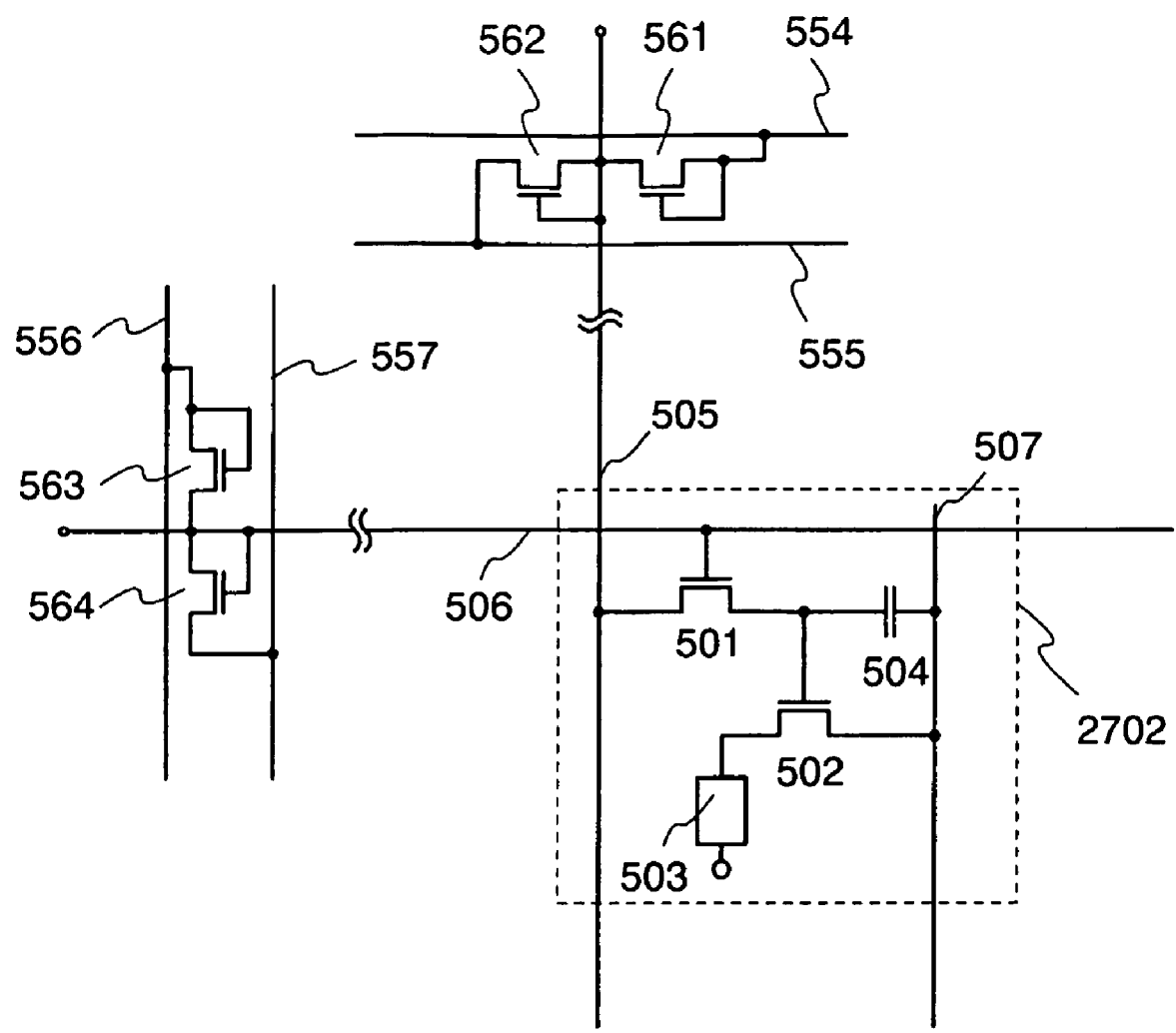
FIG. 23 is an equivalent circuit diagram of an EL display panel which is described in FIG. 24.

Protective diodes 561 and 562 are provided for the signal line input terminal portion. These protective diodes are manufactured in the same step as that of the TFT 501 or the TFT 502 and being operated as a diode by being each connected to a gate and one of a drain or a source. FIG. 23 shows an equivalent circuit diagram of a top view shown in FIG. 24.

The protective diode 561 includes a gate electrode layer, a semiconductor layer, and a wiring layer. The protective diode 562 has the same structure. Common potential lines 554 and 555 connecting to this protective diode are formed in the same layer as that of the gate electrode layer. Therefore, it is necessary to form a contact hole in the gate insulating layer to electrically connect to the wiring layer.

A mask layer may be formed and etching-processed to form a contact hole in the gate insulating layer. In this case, when etching-process at atmospheric pressure discharge is applied, electric discharging process can be locally performed, and a mask layer is not necessarily formed over the entire surface.

A signal wiring layer is formed in the same layer as that of a source/drain wiring layer 505 in the TFT 501 and has a structure in which the signal wiring layer connected thereto is connected to the source or drain side.

The input terminal portion of the scanning signal line side also has the same structure. A protective diode 563 includes a gate electrode layer, a semiconductor layer, and a wiring layer. A protective diode 564 also has the same structure. Common potential lines 556 and 557 connected to the protective diode are formed in the same layer as that of the source/drain wiring layer. According to the present invention, the protective diodes provided in an input stage can be formed at the same time. Note that the position of depositing a protective diode is not limited to this embodiment mode and can also be provided between a driver circuit and a pixel.

As described above, according to the invention, a pattern of a wiring or the like can be stably formed without generating a formation defect with preferable controllability. Therefore, even when a wiring or the like is complex and formed densely by forming a protective circuit, a short-circuit or the like due to the defect of installation at the time of formation is not generated. Additionally, the invention can correspond to a miniaturized or thinned device sufficiently since it is not necessary to take wide margin into consideration. As a result, a display device having preferable electric characteristics and high reliability can be manufactured.

Embodiment Mode 9

Figure 22:
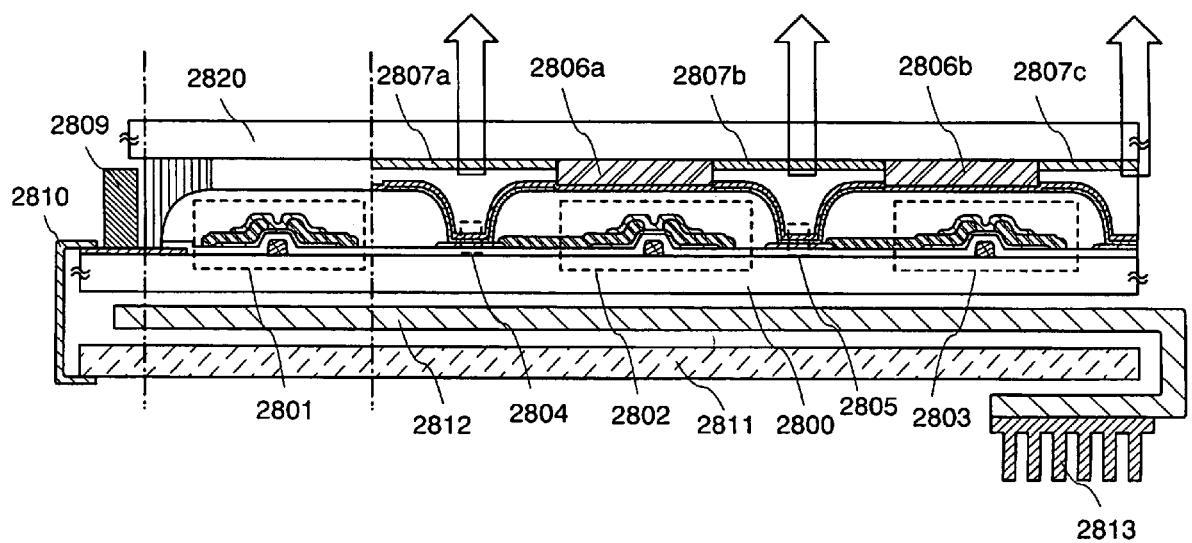
FIG. 22 is a cross-sectional view describing a structure example of an EL display module according to a certain aspect of the invention.

FIG. 22 shows an example constituting an EL display module having a TFT substrate 2800 manufactured according to the present invention. A pixel portion including pixels is formed over the TFT substrate 2800.

In FIG. 22, a TFT which is the same as that formed in a pixel or a protective circuit portion 2801 operated in the same manner as a diode by being connected to a gate and one of a source or a drain of the TFT is provided between a driver circuit and the pixel which is outside of the pixel portion. A driver IC formed of a single crystal semiconductor, a stick driver IC formed of a polycrystalline semiconductor film over a glass substrate, or a driver circuit formed of a SAS is applied to a driver circuit 2809.

The TFT substrate 2800 is bonded to a sealing substrate 2820 by interposing spacers 2806a and 2806b formed by a droplet discharge method therebetween. The spacer is preferably provided to keep the space between two substrates constantly even when a substrate is thin and an area of a pixel portion is enlarged. A space between the TFT substrate 2800 and the sealing substrate 2820 over light emitting elements 2804 and 2805 connected to TFTs 2802 and 2803, respectively may be filled with a light-transmitting resin material and solidified, or may be filled with anhydrous nitrogen or an inert gas.

FIG. 22 shows the case in which the light emitting elements 2804 and 2805 have a structure of a top emission type and has a structure in which light is emitted in the direction of the arrow shown in the figure. Multicolor display can be carried out in each pixel by having different luminescent colors of red, green, and blue. In addition, at this time, color purity of the luminescence emitted outside can be enhanced by forming coloring layers 2807a, 2807b and 2807c corresponding to each color on the sealing substrate 2820 side. Moreover, the coloring layers 2807a, 2807b and 2807c may be combined by using the pixel as a white light emitting element.

The driver circuit 2809 which is an external circuit is connected to a scanning line or signal line connection terminal provided over one end of the TFT substrate 2800 through a wiring substrate 2810. In addition, a heat pipe 2813 and a heat sink 2812 may be provided to be in contact with or close to the TFT substrate 2800 to have a structure improving a heat effect.

FIG. 22 shows the top emission type EL module, however, it may be a bottom emission structure by changing the structure of the light emitting element or the disposition of the external circuit substrate. Naturally, a dual emission structure in which light is emitted to both sides of the top and bottom surfaces. In the case of the top emission structure, the insulating layer which is to be a partition wall may be colored to be used as a black matrix. This partition wall can be formed by a droplet discharge method or the like and it may be formed by mixing a black resin of a colorant material, carbon black, or the like into a resin material such as polyimide, or a lamination thereof may also be used.

Additionally, in the TFT substrate 2800, a sealing structure may be formed by attaching a resin film to the side where the pixel portion is formed with the use of a sealant or an adhesive resin. In this embodiment mode, glass sealing using a glass substrate is shown, however, various sealing methods such as resin sealing using a resin, plastic sealing using plastic, and film sealing using a film can be used. A gas barrier film which prevents moisture from penetrating is preferably provided on the surface of a resin film. By applying a film sealing structure, further thinner and lighter can be realized.

Embodiment Mode 10

Figure 14C:
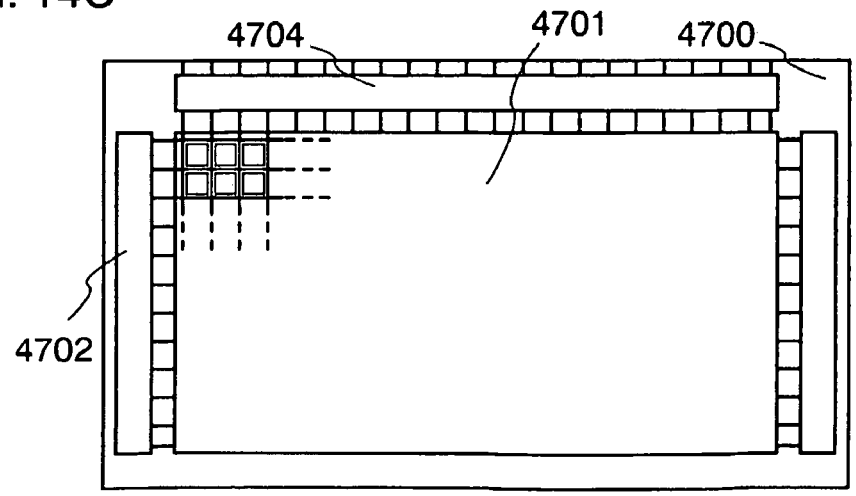

A television device can be completed by a display device formed according to the present invention. A display panel can be formed in any manners as follows: as the structure shown in FIG. 14A, in the case where only a pixel portion is formed, and then a scanning line driver circuit and a signal line driver circuit are mounted by a TAB method as shown in FIG. 15B; as the structure shown in FIG. 14A, in the case where only a pixel portion is formed, and then a scanning line driver circuit and a signal line driver circuit are mounted by a COG method as shown in FIG. 15A; a TFT is formed of a SAS, a pixel portion and a scanning line driver circuit are integrally formed over a substrate, and a signal line driver circuit is separately mounted as a driver IC as shown in FIG. 14B; and a pixel portion, a signal line driver circuit, and a scanning line driver circuit are integrally formed over the substrate as shown in FIG. 14C; or the like.

Another structure of an external circuit includes a video signal amplifier circuit which amplifies a video signal received by a tuner; a video signal processing circuit which converts the video signal output therefrom into a chrominance signal corresponding to each color of red, green, and blue; a control circuit which converts the video signal into an input specification of a driver IC; and the like on inputting side of the video signal. The control circuit outputs the signal into the scanning line side and the signal line side, respectively. In the case of digital driving, a signal division circuit may be provided on the signal line side so as to have a structure in which an input digital signal is provided by dividing into m-pieces.

Among a signal received from the tuner, an audio signal is transmitted to an audio signal amplifier circuit, and the output thereof is provided for a speaker through an audio signal processing circuit. A control circuit receives control information on a receiving station (a receiving frequency) or sound volume from an input portion and transmits the signal to the tuner or the audio signal processing circuit.

Figure 13:
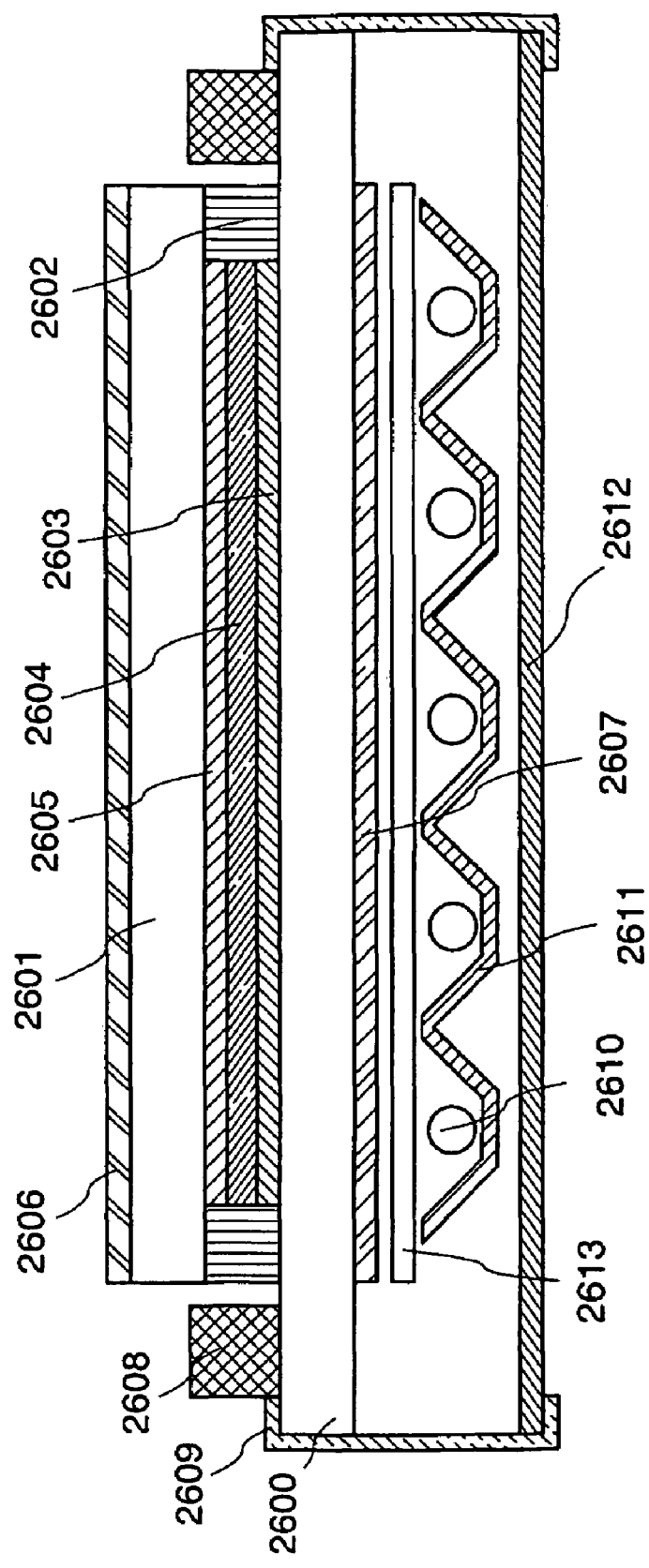
FIG. 13 is a cross-sectional view describing a structure example of a liquid crystal display module according to a certain aspect the invention.

FIG. 13 shows an example of a liquid crystal display module, and a TFT substrate 2600 and a counter substrate 2601 are fixed with a sealant 2602, with a pixel portion 2603 and a liquid crystal layer 2604 interposed therebetween to form a display region. Coloring layer 2605 is required in the case of performing a color display. In the case of an RGB method, coloring layers corresponding to red, green, and blue are provided for each pixel. Polarizing plates 2606 and 2607, an optical film 2613 are provided outside the TFT substrate 2600 and the counter substrate 2601. A light source includes a cold cathode tube 2610 and reflection plate 2611, and a circuit substrate 2612 is connected to the TFT substrate 2600 through a driver circuit 2608 and a flexible wiring substrate 2609 and an external circuit such as a control circuit or a power supply circuit is incorporated.

Figure 20A:
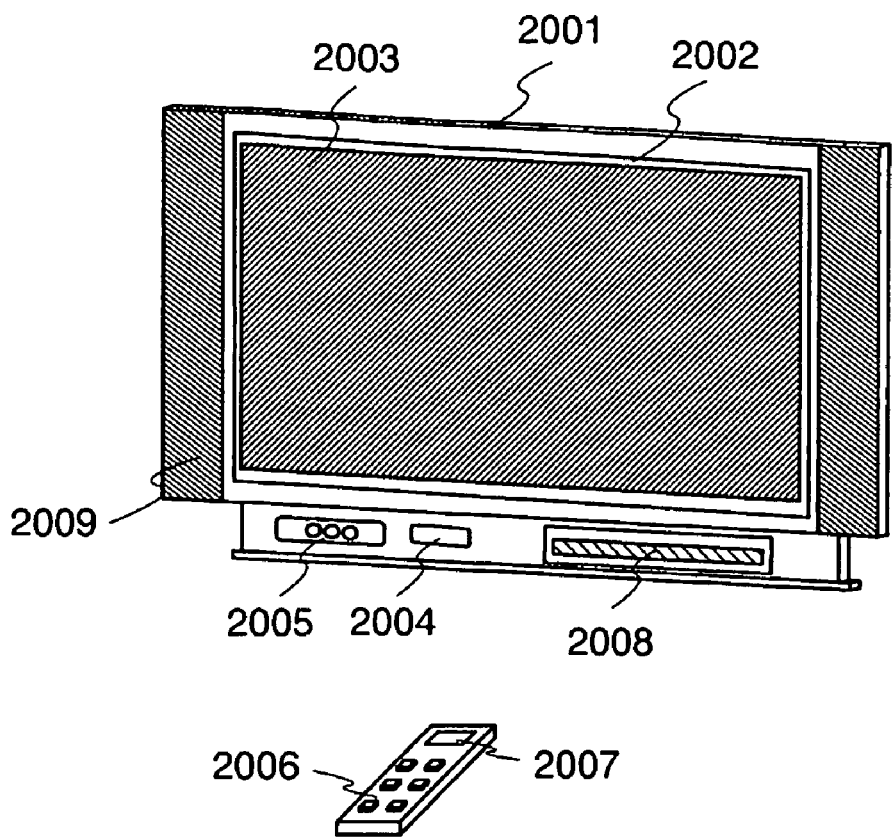
FIGS. 20A and 20B are figures showing electronic devices to which a certain aspect of the invention is applied.
Figure 20B:
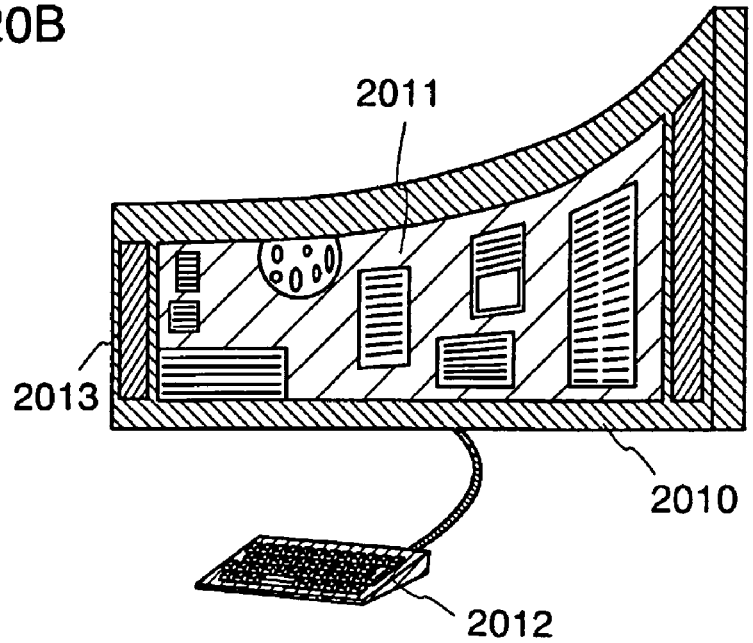

As shown in FIGS. 20A and 20B, a television device can be completed by incorporating a display module into a chassis 2001. An EL television device can be completed when an EL display module as in FIG. 22 is used, and a liquid crystal television device can be completed when a liquid crystal module as in FIG. 30 is used. A main screen 2003 is formed by using the display module, and a speaker portion 2009, operation switches, and the like are provided as other attached equipments. In such a manner, the television device can be completed according to the invention.

Figure 19:
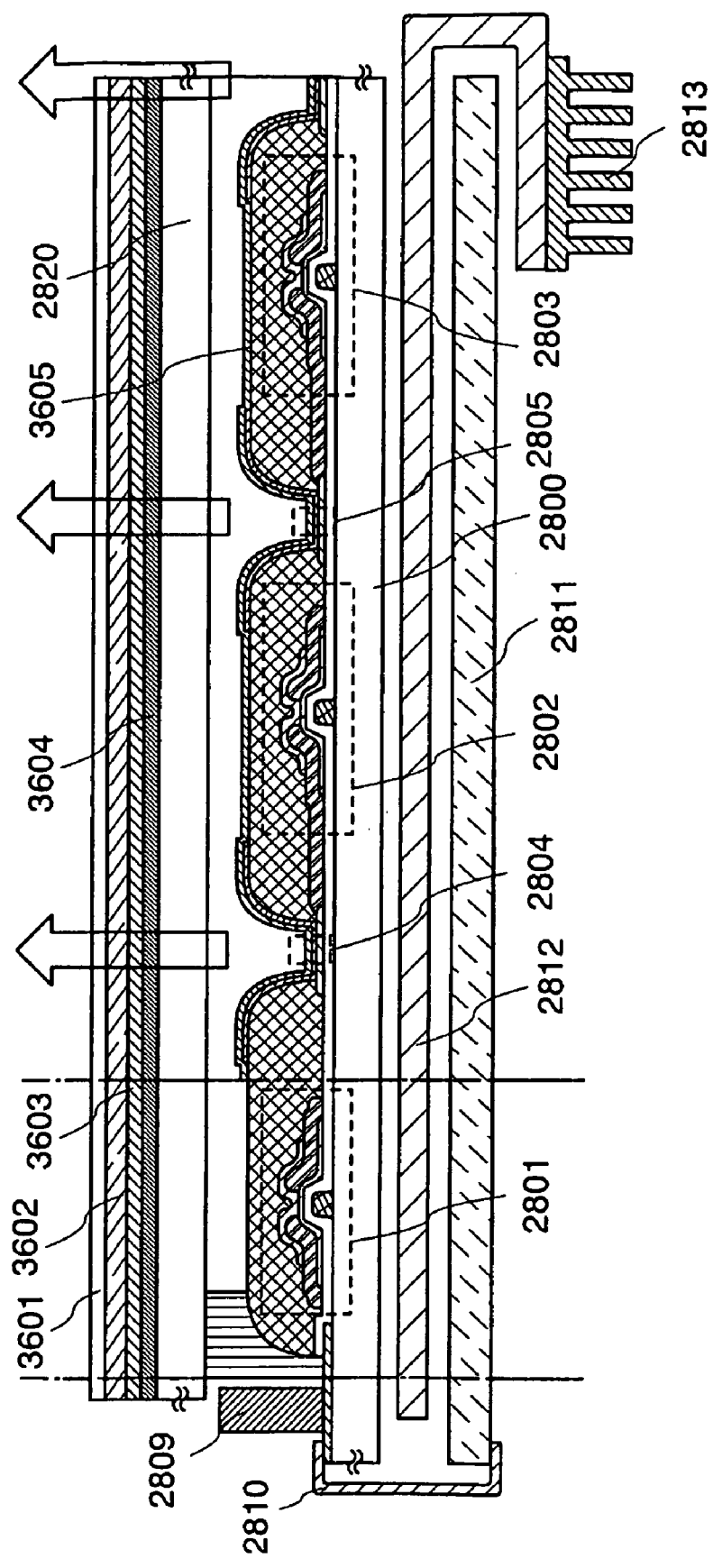
FIG. 19 is a cross-sectional view describing a structure example of an EL display module according to a certain aspect of the invention.

In addition, reflected light of light entered from exterior may be shielded by using a retardation film and a polarizing plate. FIG. 19 is a structure of a top emission type and an insulating layer 3605 which is to be a partition wall is colored to use as a black matrix. The partition wall can be formed by a droplet discharge method, and carbon black or the like may be mixed into a resin material such as polyimide, and a lamination thereof may be also used. Depending on a droplet discharge method, different materials may be discharged on the same region plural times to form the partition wall. In this embodiment mode, a black resin of a colorant is used. A $\lambda/4$ plate and a $\lambda/2$ plate may be used as retardation films 3603 and 3604 and may be designed to be able to control light. As the structure, a TFT element substrate 2800, a light emitting element 2804, a sealing substrate (sealant) 2820, a retardation films ($\lambda/4$ and $\lambda/2$) 3603 and 3604, a polarizing plate 3602 are sequentially laminated, in which light emitted from the light emitting element is emitted outside of the polarizing plate side to transmit them. The retardation film or polarizing plate may be provided on a side where light is emitted or may be provided on the both sides in the case of a dual emission type display device in which light is emitted from the both faces. In addition, an anti-reflective film 3601 may be provided on the outer side of the polarizing plate. Accordingly, a higher definition and more accurate image can be displayed.

As shown in FIG. 20A, a display panel 2002 using a display element is incorporated into a chassis 2001. By using a receiver 2005, in addition to receiving general TV broadcast, information communication can also be carried out in one direction (from a transmitter to a receiver) or in the both directions (between a transmitter and a receiver or between receivers) by connecting to a communications network by a fixed line or a wireless through a modem 2004. The operation of the television device can be carried out by switches incorporated into the chassis or by a remote control device 2006, which is separated from the main body. A display portion 2007 that displays information to be output may be also provided for this remote control device.

In addition, in the television device, a structure displaying a channel, sound volume, or the like may be additionally provided by forming a sub-screen 2008 of a second display panel in addition to the main screen 2003. In this structure, the main screen 2003 is formed of an EL display panel superior in a viewing angle, and the sub-screen may be formed of a liquid crystal display panel capable of displaying the sub-screen with low power consumption. In order to prioritize low power consumption, a structure in which the main screen 2003 is formed of a liquid crystal display panel, the sub-screen is formed of an EL display panel, and the sub-screen is able to flash on and off may be also applied. According to the invention, a display device with high reliability can be manufactured even by using many TFTs and electronic parts by using such a large-sized substrate.

FIG. 20B shows a television device having a large-sized display portion of, for example, 20 inches to 80 inches, which includes a chassis 2010, a display portion 2011, a keyboard portion 2012 which is an operation portion, a speaker portion 2013, and the like. The invention is applied to manufacturing the display portion 2012. FIG. 20B shows a television device having a curved display portion since a substance which is capable of curving is used for the display portion. Thus, a television device having a desired shape can be manufactured since the shape of the display portion can be freely designed.

Using the invention enables to simplify the process. Accordingly, a display panel can be easily manufactured even when a glass substrate which is in and after the fifth generation having 1000 mm or more on a side is used.

According to the invention, a desired pattern can be formed with preferable controllability and the loss of material and the cost can also be reduced. Hence, a television device even with a large screen display portion can be formed with low cost by using the invention, and a formation defect is not generated even when the television device is thinned and a wiring or the like becomes accurate. Accordingly, a high-performance and highly reliability television device can be manufactured with a preferable yield.

Naturally, the invention is not limited to the television device and it can be applied to various usages especially as the display mediums having a large area such as an information display board at a station, an airport, or the like, or an advertisement display board on the street as well as a monitor of a personal computer.

Embodiment Mode 11

Various display devices can be manufactured by applying the present invention. In other words, the invention can be applied to various electronic devices in which these display devices are incorporated into display portions.

The electronic devices include a camera such as a video camera or a digital camera, a projector, a head mounted display (a goggle type display), a car navigation system, a car stereo, a personal computer, a game machine, a portable information terminal (a mobile computer, a cellular phone, an electronic book, or the like), an image reproducing device provided with a recording medium (specifically a device that is capable of playing a recording medium such as a Digital Versatile Disc (DVD) and that has a display device that can display the image) or the like. FIGS. 21A to 21D show the examples thereof.

Figure 21A:
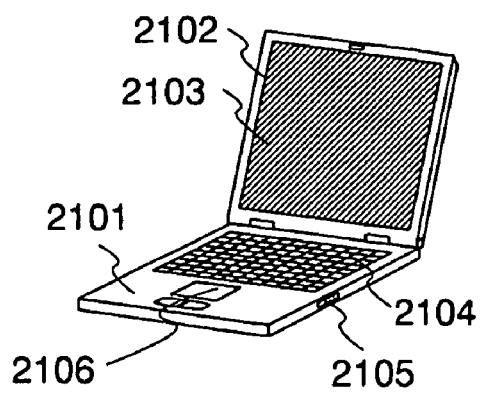
FIGS. 21A to 21D are figures showing electronic devices to which a certain aspect of the invention is applied.

FIG. 21A is a personal computer, which includes a main body 2101, a chassis 2102, a display portion 2103, a keyboard 2104, an external connection port 2105, a pointing mouse 2106 and the like. The invention is applied to manufacturing the display portion 2103. According to the invention, an image with high reliability and high resolution can be displayed even the personal computer is miniaturized and a wiring or the like becomes accurate.

Figure 21B:
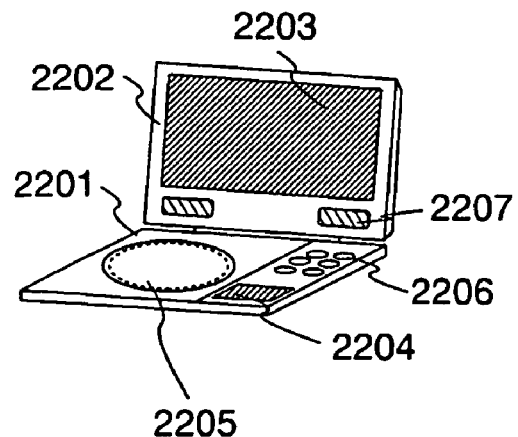

FIG. 21B is an image reproducing device provided with a recording medium (specifically a DVD reproducing device), which includes a main body 2201, a chassis 2202, a display portion A 2203, a display portion B 2204, a recording medium (such as a DVD) reading portion 2205, operation keys 2206, a speaker portion 2207 and the like. The display portion A 2203 mainly displays image information and the display portion B 2204 mainly displays character information, and the invention is applied to manufacturing these display portions A 2203 and B 2204. According to the invention, an image with high reliability and high resolution can be displayed even when the image reproducing device is miniaturized and a wiring or the like becomes accurate.

Figure 21C:
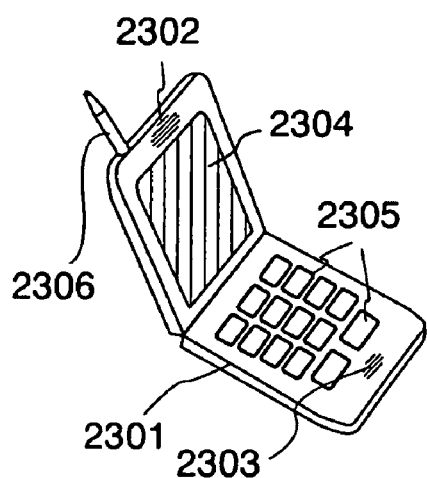

FIG. 21C is a cellular phone, which includes a main body 2301, an audio output portion 2302, an audio input portion 2303, a display portion 2304, operation switches 2305, an antenna 2306, and the like. By applying the display device manufactured according to the invention to the display portion 2304, display with high reliability and high resolution can be made even when the cellular phone is miniaturized and a wiring or the like becomes accurate.

Figure 21D:
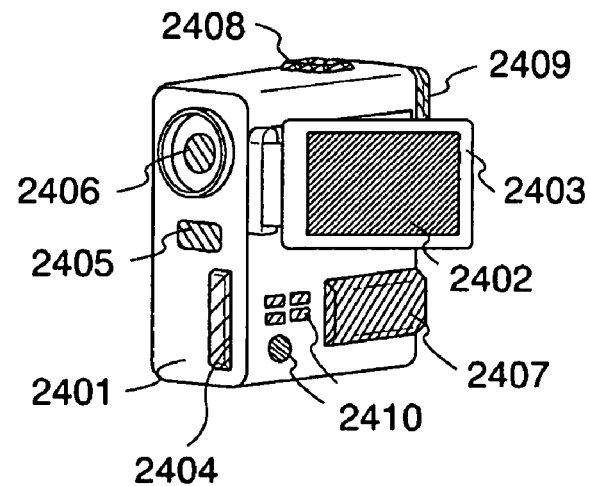

FIG. 21D is a video camera, which includes a main body 2401, a display portion 2402, a chassis 2403, an external connection port 2404, a remote control receiving portion 2405, an image receiving portion 2406, a battery 2407, an audio input portion 2408, eyepiece portion 2409, operation keys 2410, and the like. By applying the display device manufactured according to the invention to the display portion 2402, display with high reliability and high resolution can be made even when the video camera is miniaturized and a wiring or the like becomes accurate. This embodiment mode can be freely combined with the above-mentioned embodiment modes.

This application is based on Japanese Patent Application serial no. 2004-081493 filed in Japan Patent Office on Mar. 19, 2004, the contents of which are hereby incorporated by reference.

The invention claimed is:

1. A method for forming a pattern comprising the steps of:
forming a wiring of a semiconductor device over a light-transmitting substrate;
forming a first region having a substance including a light-absorbing material over the light-transmitting substrate and the wiring;
forming a second region by irradiating the substance with light to modify a part of a surface of the substance wherein the light has a wavelength which is absorbable by the light-absorbing material; and
forming a conductive pattern on the part of the surface of the substance on the second region by discharging a compound including a pattern forming material, wherein the part of the surface of the substance is modified so that the second region has a higher wettability than the first region with respect to the compound.

2. A method for forming a pattern comprising the steps of:

forming a wiring of a semiconductor device over a light-transmitting substrate;

forming a first region having a substance including a light-absorbing material over the light-transmitting substrate and the wiring;

forming a second region by irradiating the substance with light through the light-transmitting substrate to modify a part of a surface of the substance wherein the light has a wavelength which is absorbable by the light-absorbing material; and forming a conductive pattern on the part of the surface of the substance on the second region by discharging a compound including a pattern forming material, wherein the part of the surface of the substance is modified so that the second region has a higher wettability than the first region with respect to the compound.

3. A method for forming a pattern comprising the steps of:

forming a wiring of a semiconductor device over a light-transmitting substrate;

forming a first region having a substance including a light-absorbing material over the light-transmitting substrate and the wiring;

forming a second region by irradiating the substance with a light through the light- transmitting substrate to modify a part of a surface of the substance wherein the light has a wavelength which is absorbable by the light-absorbing material;

removing the light-absorbing material; and forming a conductive pattern on the part of the surface of the substance on the second region by discharging a compound including a pattern forming material, wherein the part of the surface of the substance is modified so than the second region has a higher wettability than the first region with respect to the compound.

4. The method for forming a pattern according to any one of claims 1, 2 and 3, wherein the light-absorbing material is dissolved in the substance to form the substance including the light-absorbing material.

5. The method for forming a pattern according to any one of claims 1, 2 and 3, wherein the light-absorbing material is dispersed in the substance to form the substance including the light-absorbing material.

6. The method for forming a pattern according to any one of claims 1, 2 and 3, wherein a pigment is used as the light-absorbing material to form the substance including the light-absorbing material.

7. The method for forming a pattern according to any one of claims 1, 2 and 3, wherein a photocatalyst substance is used as the light-absorbing material to form the substance including the light-absorbing material.

8. The method for forming a pattern according to any one of claims 1, 2 and 3, wherein the wavelength of the light is 300 nm or more and 400 nm or less, and the light-absorbing material includes a coumarin.

9. The method for forming a pattern according to any one of claims 1, 2 and 3, wherein the substance including the light-absorbing material includes fluorocarbon chains.

10. The method for forming a pattern according to any one of claims 1, 2 and 3, wherein the wiring is a silver wiring.

* * * * *

UNITED STATES PATENT AND TRADEMARK OFFICE
CERTIFICATE OF CORRECTION

PATENT NO. : 7,615,488 B2 Page 1 of 1
APPLICATION NO. : 10/574616
DATED : November 10, 2009
INVENTOR(S) : Maekawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 561 days.

Signed and Sealed this

Fourteenth Day of December, 2010

David J. Kappos
*Director of the United States Patent and Trademark Office*